(12) United States Patent
Sutherland

(10) Patent No.: US 12,394,690 B2
(45) Date of Patent: Aug. 19, 2025

(54) SYSTEMS AND METHODS OF NANO-PARTICLE BONDING FOR ELECTRONICS COOLING

(71) Applicant: CORNING RESEARCH & DEVELOPMENT CORPORATION, Corning, NY (US)

(72) Inventor: James Scott Sutherland, Painted Post, NY (US)

(73) Assignee: CORNING RESEARCH & DEVELOPMENT CORPORATION, Corning, NY (US)

(*) Notice: Subject to any disclaimer, the term of this patent is extended or adjusted under 35 U.S.C. 154(b) by 423 days.

(21) Appl. No.: 18/092,999

(22) Filed: Jan. 4, 2023

(65) Prior Publication Data
US 2023/0215781 A1 Jul. 6, 2023

Related U.S. Application Data

(60) Provisional application No. 63/296,219, filed on Jan. 4, 2022.

(51) Int. Cl.
*H01L 23/473* (2006.01)
*B82Y 30/00* (2011.01)

(52) U.S. Cl.
CPC .......... *H01L 23/4735* (2013.01); *B82Y 30/00* (2013.01)

(58) Field of Classification Search
CPC ....... H01L 23/34; H01L 23/46; H01L 23/473; H01L 23/4735; B82Y 30/00
See application file for complete search history.

(56) References Cited

U.S. PATENT DOCUMENTS 4,733,068 A * 3/1988 Thiele .................. G06F 3/0421
250/227.14
6,512,642 B1 1/2003 Bourcier et al.
(Continued)

FOREIGN PATENT DOCUMENTS

| CN | 1629593 A | 6/2005 |
|---|---|---|
| CN | 1710715 A | 12/2005 |

(Continued)

OTHER PUBLICATIONS

A. A. Zinn, R. M. Stoltenberg, J. Chang, Y. Tseng and S. M. Clark, "Nanocopper as a soldering alternative: Solder-free assembly," 2016 IEEE 16th International Conference on Nanotechnology (IEEE-NANO), Sendai, Japan, 2016, pp. 367-370.

(Continued)

*Primary Examiner* — Claire E Rojohn, III
(74) *Attorney, Agent, or Firm* — Tamika A. Crawl-Bey

(57) ABSTRACT

Devices and methods for providing cooling to electronics equipment is provided herein. A cooling manifold includes a first substrate having a first hole. A layer of nano-particles is disposed between the first substrate and an electronics surface associated with the electronics equipment. The layer of nano-particles defines a seal between the first substrate and the electronics surface, and further defines a channel extending within the seal. After an application of heat, the layer of nano-particles forms the seal such that the device is fluid impermeable, so as to allow a coolant fluid to enter through the first hole to flow through the channel to reduce or remove the heat generated by the electronics equipment associated with the electronics surface.

19 Claims, 87 Drawing Sheets

(56) References Cited

U.S. PATENT DOCUMENTS

| | | | |
|---|---|---|---|
| 7,210,519 B2 | 5/2007 | Chen | |
| 7,480,432 B2 | 1/2009 | Grzybowski et al. | |
| 7,724,992 B2* | 5/2010 | Sutherland | G02B 6/4234 385/91 |
| 7,948,077 B2 | 5/2011 | Andry et al. | |
| 7,992,627 B2 | 8/2011 | Bezama et al. | |
| 8,211,376 B2 | 7/2012 | Caze et al. | |
| 8,291,729 B2 | 10/2012 | Grzybowski et al. | |
| 8,397,537 B2 | 3/2013 | Grzybowski et al. | |
| 8,987,891 B2* | 3/2015 | Di Stefano | H01L 23/34 257/714 |
| 10,172,258 B2 | 1/2019 | Bodenweber et al. | |
| 10,345,535 B2* | 7/2019 | Butler | G02B 6/423 |
| 11,415,754 B2 | 8/2022 | Butler et al. | |
| 11,586,000 B2 | 2/2023 | Butler et al. | |
| 2005/0035983 A1* | 2/2005 | Cruchon-Dupeyrat | G03F 7/0002 346/140.1 |
| 2006/0157225 A1 | 7/2006 | Martin et al. | |
| 2007/0213429 A1 | 9/2007 | Cheng et al. | |
| 2008/0202380 A1 | 8/2008 | Bao et al. | |
| 2008/0236795 A1* | 10/2008 | You | H01L 23/427 165/104.21 |
| 2012/0025365 A1 | 2/2012 | Haba | |
| 2012/0114927 A1* | 5/2012 | Khaselev | H01L 24/27 156/247 |
| 2014/0144609 A1 | 5/2014 | Choi et al. | |
| 2017/0205592 A1* | 7/2017 | Pfnuer | G02B 6/423 |
| 2021/0096302 A1 | 4/2021 | Butler et al. | |
| 2021/0341678 A1 | 11/2021 | Butler et al. | |
| 2021/0341679 A1* | 11/2021 | Cuno, Jr. | G02B 6/4403 |
| 2022/0415751 A1* | 12/2022 | Lee | H01L 23/053 |
| 2023/0215781 A1* | 7/2023 | Sutherland | H01L 23/4735 361/699 |
| 2023/0219053 A1* | 7/2023 | Cuno | B01J 19/0093 422/208 |
| 2024/0033705 A1* | 2/2024 | Cuno | B01J 19/249 |
| 2024/0085635 A1* | 3/2024 | Sutherland | B32B 7/12 |

FOREIGN PATENT DOCUMENTS

| | | |
|---|---|---|
| CN | 101097897 A | 1/2008 |
| CN | 101266110 A | 9/2008 |
| CN | 101776409 A | 7/2010 |
| CN | 101796365 A | 8/2010 |
| CN | 201803147 U | 4/2011 |
| CN | 102212304 A | 10/2011 |
| CN | 203983270 U | 12/2014 |
| CN | 204678937 U | 9/2015 |
| CN | 105290418 A | 2/2016 |
| CN | 105772118 A | 7/2016 |
| CN | 105873248 A | 8/2016 |
| CN | 106449552 A | 2/2017 |
| CN | 106834777 A | 6/2017 |
| CN | 107663438 A | 2/2018 |
| CN | 107887368 A | 4/2018 |
| CN | 108231242 A | 6/2018 |
| CN | 109483780 A | 3/2019 |
| CN | 208606625 U | 3/2019 |
| CN | 109701674 A | 5/2019 |
| CN | 109979905 A | 7/2019 |
| CN | 110246816 A | 9/2019 |
| CN | 110749222 A | 2/2020 |
| CN | 112665890 A | 4/2021 |
| CN | 112719263 A | 4/2021 |
| CN | 113023666 A | 6/2021 |
| JP | 2007-250540 A | 9/2007 |
| JP | 5021919 B2 | 9/2012 |
| JP | 2020-067269 A | 4/2020 |
| KR | 10-1447129 B1 | 10/2014 |
| KR | 10-1597651 B1 | 2/2016 |
| KR | 10-1618211 B1 | 5/2016 |
| WO | 2008/042193 A2 | 4/2008 |
| WO | 2009/012450 A1 | 1/2009 |
| WO | 2011/066489 A2 | 6/2011 |
| WO | 2020/033632 A2 | 2/2020 |
| WO | 2023/282976 A2 | 1/2023 |

OTHER PUBLICATIONS

Allen M.L., Aronniemi M., Mattila T., Alastalo A., Ojanpera K., Suhonen M., Seppa H. "Electrical sintering of nanoparticle structures". Nanotechnology. 2008; 19:175201. doi: 10.1088/0957-4484/19/17/175201.

Balantrapu K., McMurran M., Goia D.V. "Inkjet printable silver dispersions: Effect of bimodal particle-size distribution on film formation and electrical conductivity". J. Mater. Res. 2010;25:821-827. doi: 10.1557/JMR.2010.0124.

Buffat P., Borel J.P. "Size effect on the melting temperature of gold particles". Phys. Rev. A. 1976; 13:2287-2298. doi: 10.1103/PhysRevA.13.2287.

Dennuelin A., Blayo A., Neuman C., Bras J. "Infra-red assisted sintering of inkjet printed silver tracks on paper substrates". J. Nanoparticle Res. 2011; 13:3815-3823. doi: 10.1007/s11051-011-0306-2.

Ding J., Liu J., Tian Q., Wu Z., Yao W., Dai Z., Liu L., Wu W. "Preparing of Highly Conductive Patterns on Flexible Substrates by Screen Printing of Silver Nanoparticles with Different Size Distribution". Nanoscale Res. Lett. 2016;11:412. doi: 10.1186/s11671-016-1640-1.

Grouchko M., Kamyshny A., Mihailescu C.F., Anghel D.F., Magdassi S. Conductive Inks with a "Built-In" Mechanism That Enables Sintering at Room Temperature. ACS Nano. 2011;5:3354-3359. doi: 10.1021/nn2005848.

Gu W., Yuan W., Zhong T., Wu X., Zhou C., Lin J., Cui Z. "Fast near infrared sintering of silver nanoparticle ink and applications for flexible hybrid circuits". RSC Adv. 2018;8:30215-30222. doi: 10.1039/C8RA04468F.

Kang J.S., Ryu J., Kim H.S., Hahn H.T. "Sintering of Inkjet-Printed Silver Nanoparticles at Room Temperature Using Intense Pulsed Light". J. Electron. Mater. 2011;40:2268-2277. doi: 10.1007/s11664-011-1711-0.

Magdassi et al "Triggering the sintering of silver nanoparticles at room temperature". ACS Nano. 2010;4:1943-1948. doi: 10.1021/nn901868t.

Md. Khalilur Rahman1, Zhao Lu, and Kye-Si Kwon, "Green laser sintering of copper oxide (CuO) nano particle (NP) film to form Cu conductive lines," AIP Advances 8, 095008 (2018); https://doi.org/10.1063/1.5047562.

Michael Zenou, Oleg Ermak, Amir Saar and Zvi Kotler, "Laser sintering of copper nanoparticles," J. Phys. D: Appl. Phys. 47 (2014) 025501 (11pp).

Mo, Lixin et al. "Silver Nanoparticles Based Ink with Moderate Sintering in Flexible and Printed Electronics." International journal of molecular sciences, vol. 20,9 p. 2124, Apr. 29, 2019.

Noh, Jihun & Ha, Jeonghong & Kim, Dongsik. "Femtosecond and nanosecond laser sintering of silver nanoparticles on a flexible substrate," Applied Surface Science. 511. 145574. 10.1016, 2020.

Perelaer J., de Gans B.J., Schubert U.S. "Ink-jet Printing and Microwave Sintering of Conductive Silver Tracks". Adv. Mater. 2006; 18:2101-2104. doi: 10.1002/adma.200502422.

Perelaer J., Jani R., Grouchko M., Kamyshny A., Magdassi S., Schubert U.S. "Plasma and microwave flash sintering of a tailored silver nanoparticle ink, yielding 60% bulk conductivity on cost-effective polymer foils". Adv. Mater. 2012;24:3993-3998. doi: 10.1002/adma.201200899.

Perelaer J., Klokkenburg M., Hendriks C.E., Schubert U.S. "Microwave flash sintering of inkjet-printed silver tracks on polymer substrates". Adv. Mater. 2009;21:4830-4834. doi: 10.1002/adma.200901081.

Shyjumon I., Gopinadhan M., Ivanova O., Quaas M., Wulff H., Helm C.A., Hippler R. "Structural deformation, melting point and lattice parameter studies of size selected silver clusters". Eur. Phys. J. D. 2005;37:409-415. doi: 10.1140/epjd/e2005-00319-x.

Wei Liu, Rong An, Chunqing Wang, Zhen Zheng, Yanhong Tian, Ronglin Xu, and Zhongtao Wang , "Recent Progress in Rapid

(56) References Cited

OTHER PUBLICATIONS

Sintering of Nanosilver for Electronics Applications," Micromachines 2018, 9, 346; doi: 10.3390/mi9070346.
Yanqing, Z., Ren-li, F., Liu, X., Liu, H., & Wang, H. "Enhanced adhesion strength of silver paste on AlN ceramic substrate via sintered nano—CuO". Ceramics International., vol. 47, 2021, pp. 9471-9476.
Allen et al., "Electrical sintering of nanoparticle structures", Nanotechnology, 2008, vol. 19, pp. 175-201. doi: 10.1088/0957-4484/19/17/175201.
Armstrong et al., "Experimental investigation on the heat transfer performance analysis in silver nano-coated double pipe heat exchanger using displacement reaction", 2021 Materials Today: Proceedings, vol. 45, pp. 2482-2490.
Arts et al., "Qpace 2 and Domain Decomposition on The Intel Xeon Phi*"; Proceedings of Science, 2015, 15 pages.
Back et al., "Design, Fabrication, and Characterization of a Compact Hierarchical Manifold Microchannel Heat Sink Array for Two-Phase Cooling Open Access", 2019, IEEE Transactions on Components, Packaging and Manufacturing Technology, vol. 9, No. 7, 8643536 pp. 1291-1300.
Balantrapu et al., "Inkjet printable silver dispersions: Effect of bimodal particle-size distribution on film formation and electrical conductivity", J. Mater. Res., 2010, vol. 25, pp. 821-827. doi: 10.1557/JMR.2010.0124.
Brunschwiler et al., "Dual-Side Heat Removal by Silicon Cold Plate and Interposer with Embedded Fluid Channels", Proceedings of the 17th InterSociety Conference on Thermal and Thermomechanical Phenomena in Electronic Systems, ITherm, 2018, pp. 331-339.
Buffat et al., "Size effect on the melting temperature of gold particles", Phys. Rev. A., 1976, vol. 13, pp. 2287-2298. doi: 10.1103/PhysRevA.13.2287.
Cheemalamarri et al., "Ti/Si interface enabling complementary metal oxide semiconductor compatible, high reliable bonding for inter-die micro-fluidic cooling for future advanced 3D integrated circuit integration", 2020, Journal of Micromechanics and Microengineering, vol. 30, No. 105005, pp. 1-12.
Deng et al., "Fabrication and Thermal Performance of a Novel Roll-Bond Flat Thermosyphon", Applied Thermal Engineering, vol. 181, 2020, pp. 15 pages.
Denneulin et al., "Infra-red assisted sintering of inkjet printed silver tracks on paper substrates", J. Nanoparticle Res., 2011, vol. 13, pp. 3815-3823. doi: 10.1007/s11051-011-0306-2.
Ding et al., "Preparing of Highly Conductive Patterns on Flexible Substrates by Screen Printing of Silver Nanoparticles with Different Size Distribution"; Nanoscale Res. Lett., 2016, vol. 11, No. 412, pp. 1-8, doi: 10.1186/s11671-016-1640-1.
Gradinger et al., "Assessment of Two-Phase Cooling of Power Electronics Using Roll-Bonded Condensers", Journal of Thermal Science and Engineering Applications, Mar. 2015, vol. 7; pp. 011002-1-8.
Grouchko et al., "Conductive Inks with a "Built-In" Mechanism That Enables Sintering at Room Temperature", ACS Nano, 2011, vol. 5, pp. 3354-3359; doi: 10.1021/nn2005848.
Gu et al., "Fast near infrared sintering of silver nanoparticle ink and applications for flexible hybrid circuits", RSC Adv., 2018, vol. 8, pp. 30215-30222 doi: 10.1039/C8RA04468F.
Gupta et al., "Experimental Study of Thermal Performance of Nanofluid-Filled and Nanoparticles-Coated Mesh Wick Heat Pipes", Journal of Heat Transfer, 2018, vol. 140, No. 10, pp. 102403-1-7.
Kang et al., "Sintering of Inkjet-Printed Silver Nanoparticles at Room Temperature Using Intense Pulsed Light", J. Electron. Mater., 2011, vol. 40, pp. 2268-2277. doi: 10.1007/s11664-011-1711-0.
Kundu et al., "Experimental and theoretical evaluation of on-chip micro heat pipe", 2015 Nanoscale and Microscale Thermophysical Engineering, vol. 19, No. 1, pp. 75-93.
Liu et al., "Recent Progress in Rapid Sintering of Nanosilver for Electronics Applications," Micromachines, 2018, vol. 9, No. 346, pp. 1-17, doi: 10.3390/mi9070346.
Magdassi et al., "Triggering the sintering of silver nanoparticles at room temperature", ACS Nano. 2010, vol. 4, pp. 1943-1948. doi: 10.1021/nn901868t.
Mo et al., "Silver Nanoparticles Based Ink with Moderate Sintering in Flexible and Printed Electronics." International journal of molecular sciences, vol. 20, No. 9, pp. 21-24, Apr. 29, 2019.
Noh et al., "Femtosecond and nanosecond laser sintering of silver nanoparticles on a flexible substrate" 2020 Applied Surface Science, vol. 511, No. 145574, pp. 1-11.
Perelaer et al., "Ink-jet Printing and Microwave Sintering of Conductive Silver Tracks", Adv. Mater., 2006, vol. 18, pp. 2101-2104. doi: 10.1002/adma.200502422.
Perelaer et al., "Microwave flash sintering of inkjet-printed silver tracks on polymer substrates", Adv., Mater. 2009, vol. 21, pp. 4830-4834. doi: 10.1002/adma.200901081.
Perelaer et al., "Plasma and microwave flash sintering of a tailored silver nanoparticle ink, yielding 60% bulk conductivity on cost-effective polymer foils", Adv. Mater., 2012, vol. 24, pp. 3993-3998. doi: 10.1002/adma.201200899.
Rahman et al., "Green laser sintering of copper oxide (CuO) nano particle (NP) film to form Cu conductive lines", AIP Advances, vol. 8, No. 095008, 2018, pp. 1-14, https://doi.org/10.1063/1.5047562.
Rajkumar et al., "Comparison of Aluminium Roll Bond Evaporator With Geyser", Imperial Journal of Interdisciplinary Research (IJIR), vol. 3, Issue 5, 2017, pp. 841-848.
Schulz-Harder, "DBC substrates as a base for power MCM's", Proceedings of the Electronic Packaging Technology Conference, EPTC, 2000, pp. 315-320.
Shyjumon et al., "Structural deformation, melting point and lattice parameter studies of size selected silver clusters", Eur. Phys. J. D. 2005, vol. 37, pp. 409-415. doi: 10.1140/epjd/e2005-00319-x.
Tan, Y., et al., "Feasibility investigation and characterization of low-pressure-assisted sintered-silver bonded large-area DBA plates", Soldering and Surface Mount Technology, 2020, vol. 32, No. 3, pp. 129-136.
Vasiliev et al., "Heat transfer enhancement in mini channels with micro/nano particles deposited on a heat-loadedwall", 2012, Journal of Enhanced Heat Transfer, vol. 19, No. 1, pp. 13-24.
Zenou et al., "Laser sintering of copper nanoparticles", Journal of Physics D Applied Physics., vol. 47, 2014, 025501 11 pages 10.1088/0022-3727/47/2/025501.
Zinn et al., "Nanocopper as a soldering alternative: Solder-free assembly," 2016 IEEE 16th International Conference on Nanotechnology (IEEE-NANO), Sendai, Japan, 2016, pp. 367-370.
Zou et al., "Enhanced adhesion strength of silver paste on AlN ceramic substrate via sintered nano—CuO", Ceramics International, vol. 47, 2021, pp. 9471-9476.

* cited by examiner

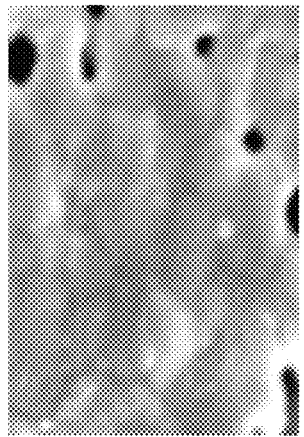
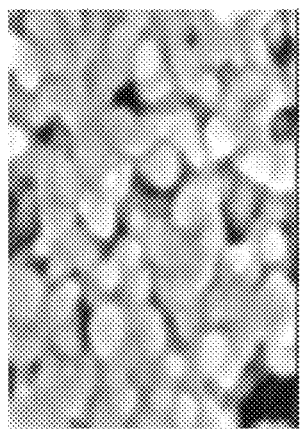
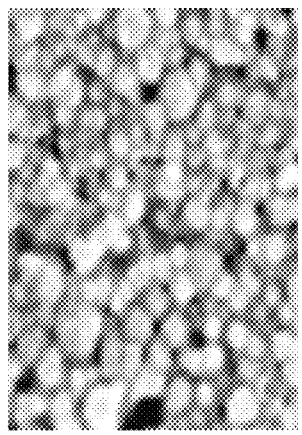
FIG. 2A

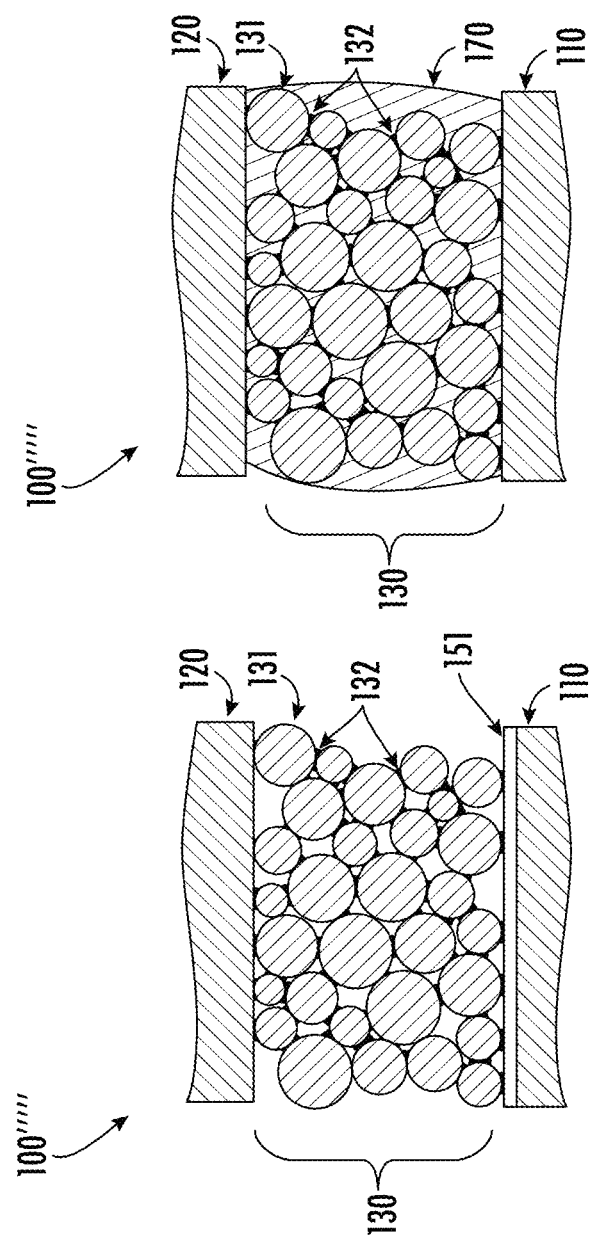

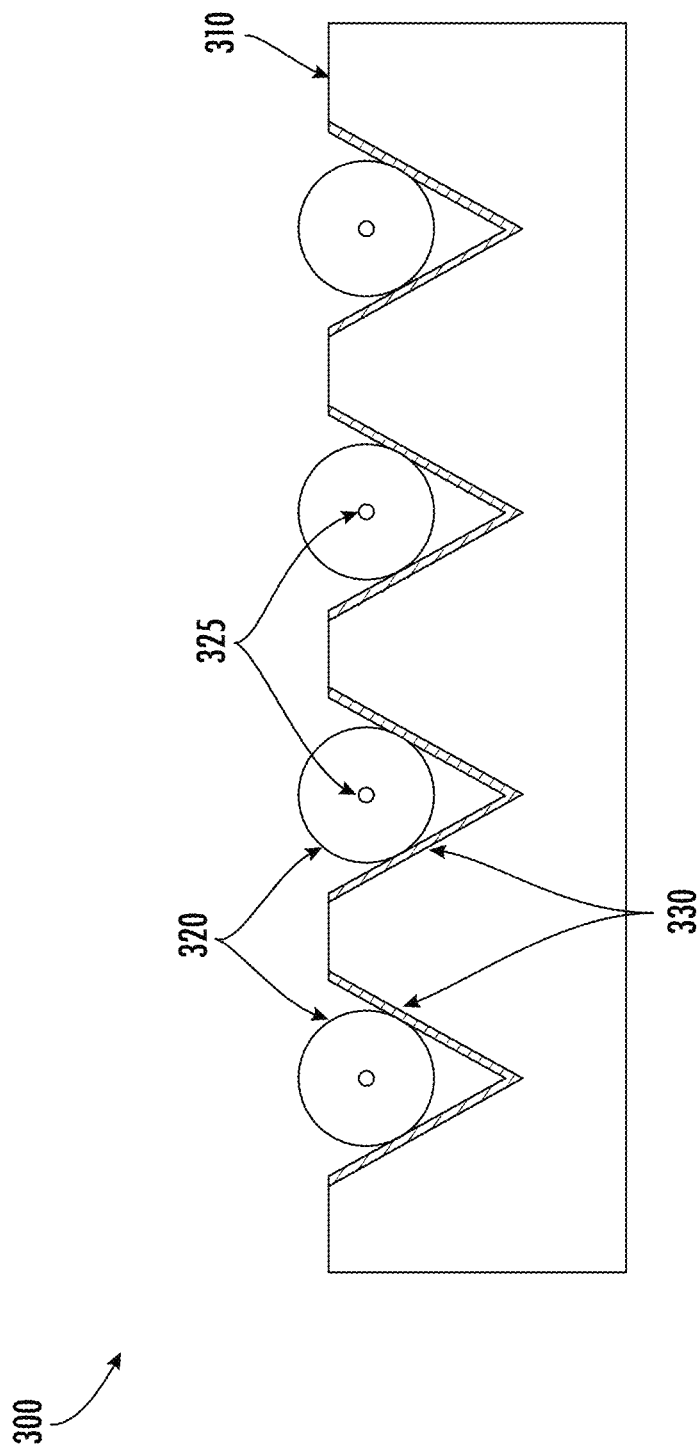

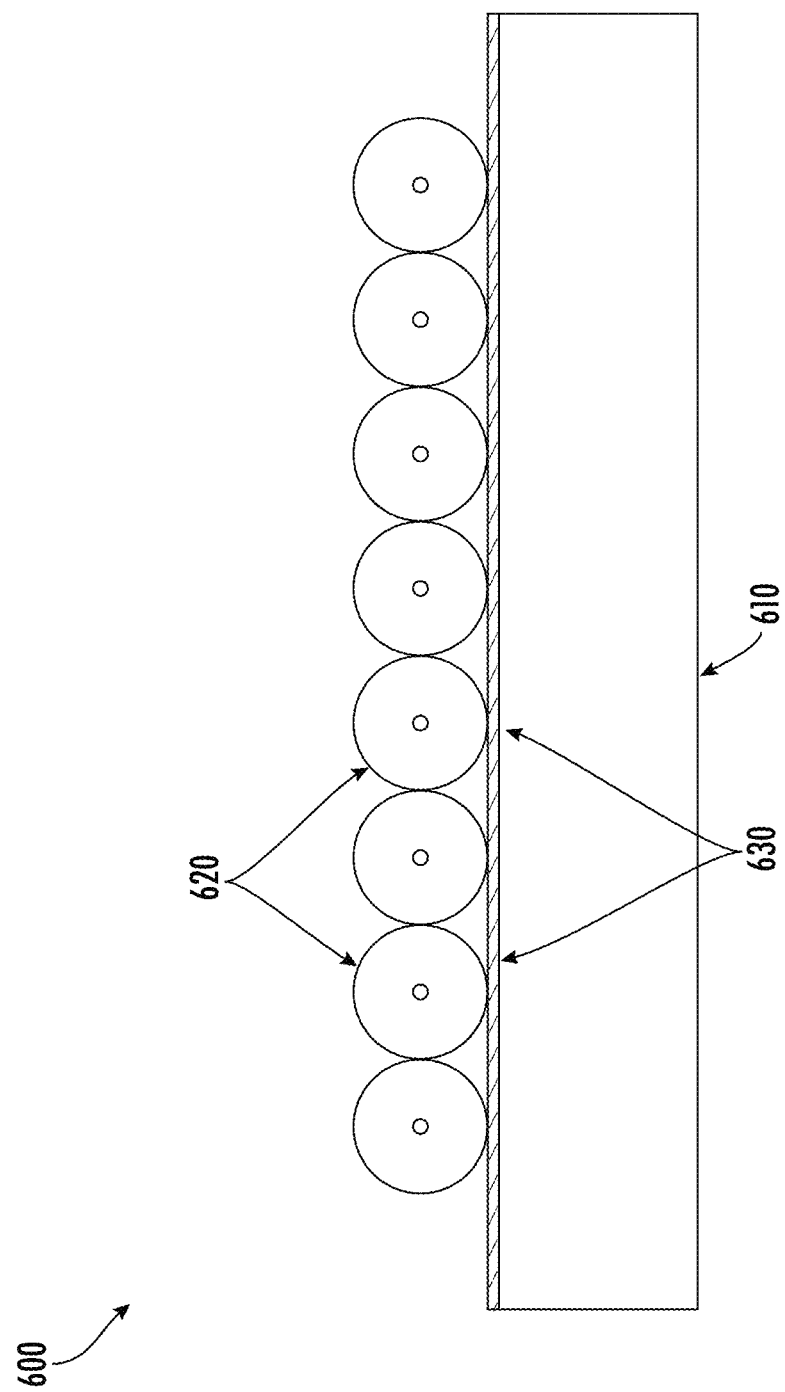

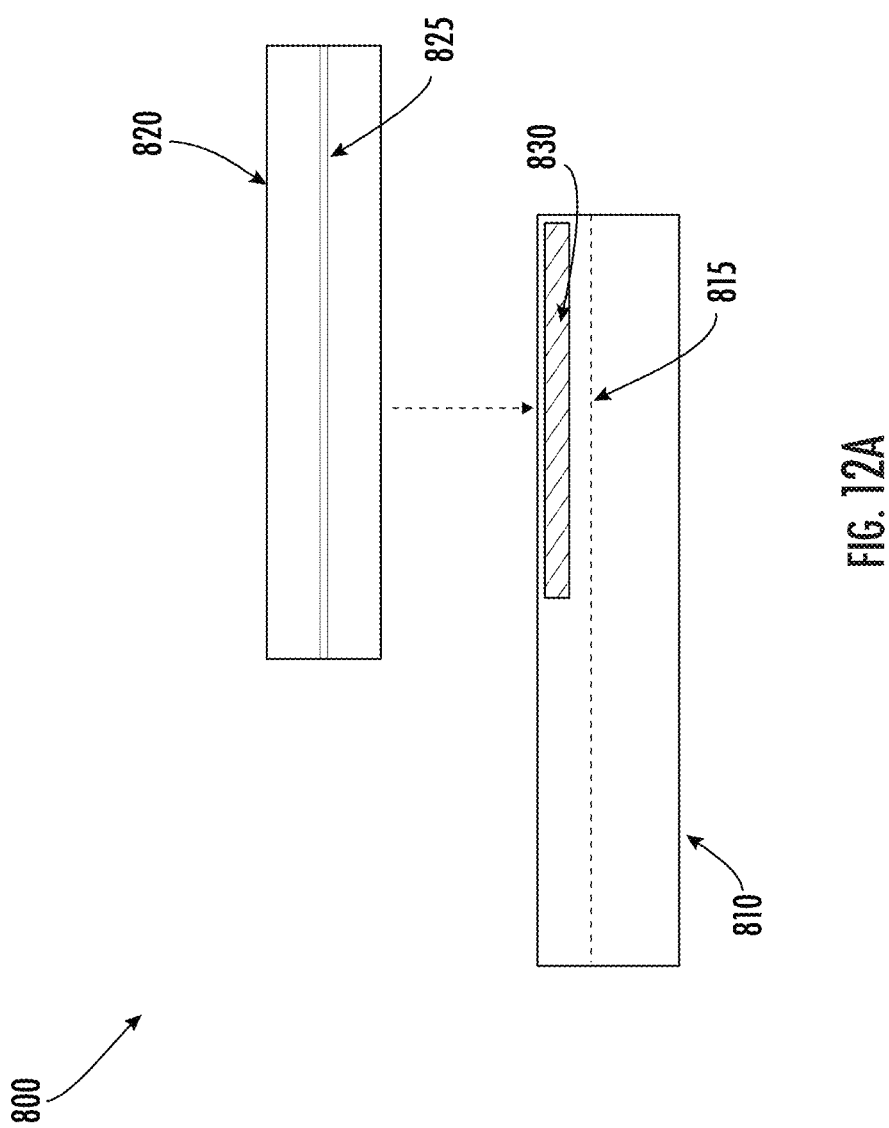

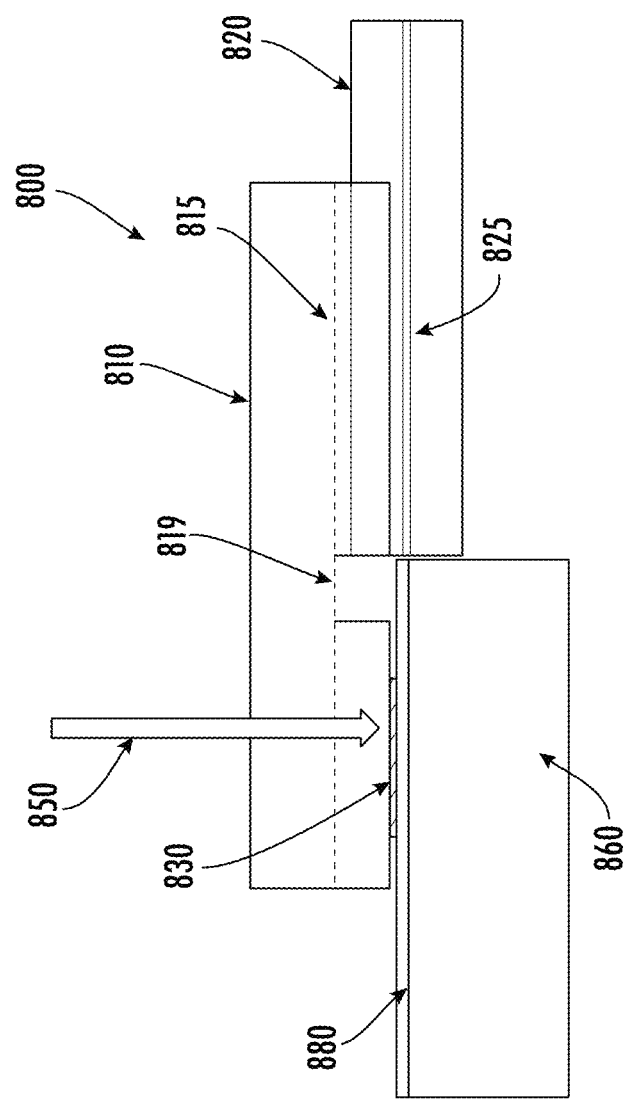

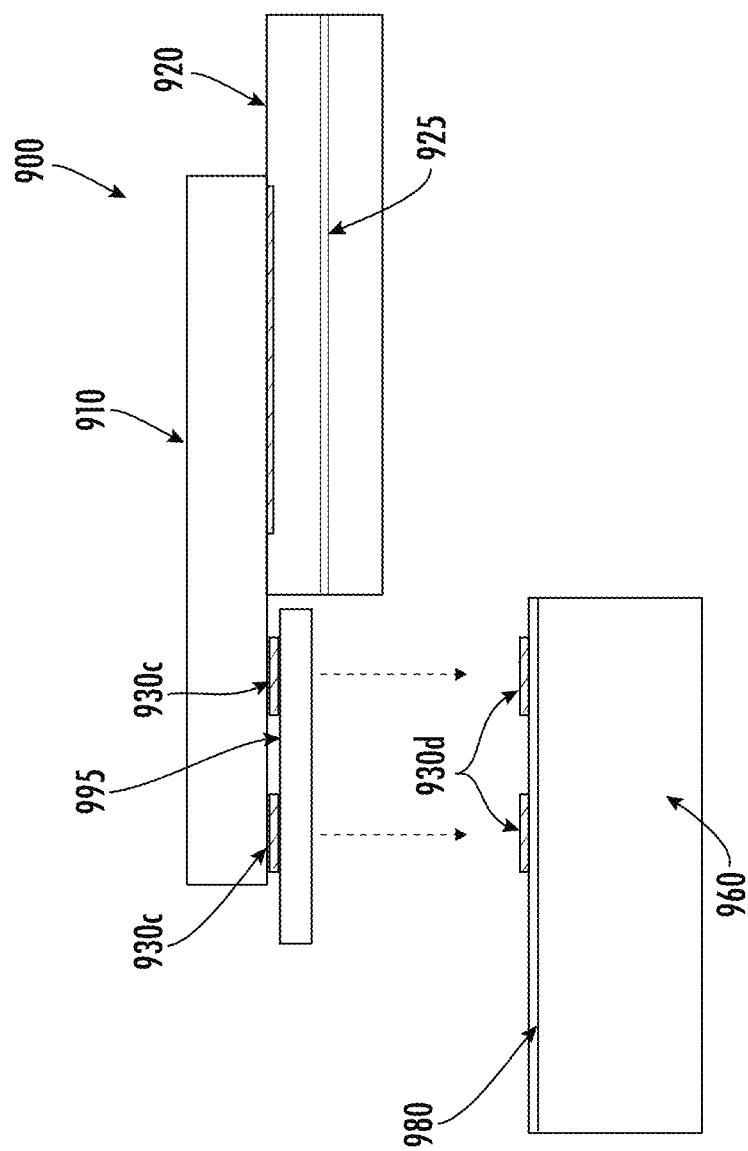

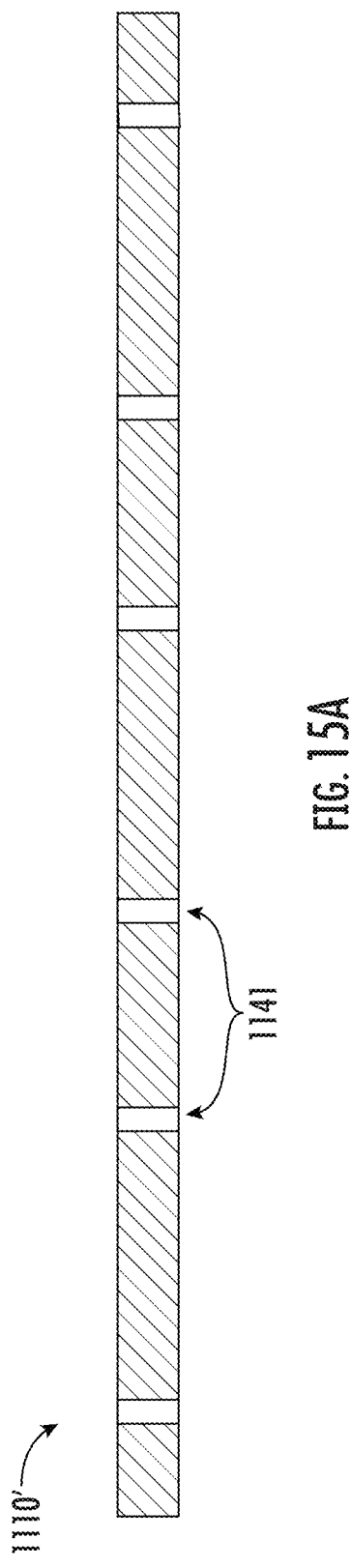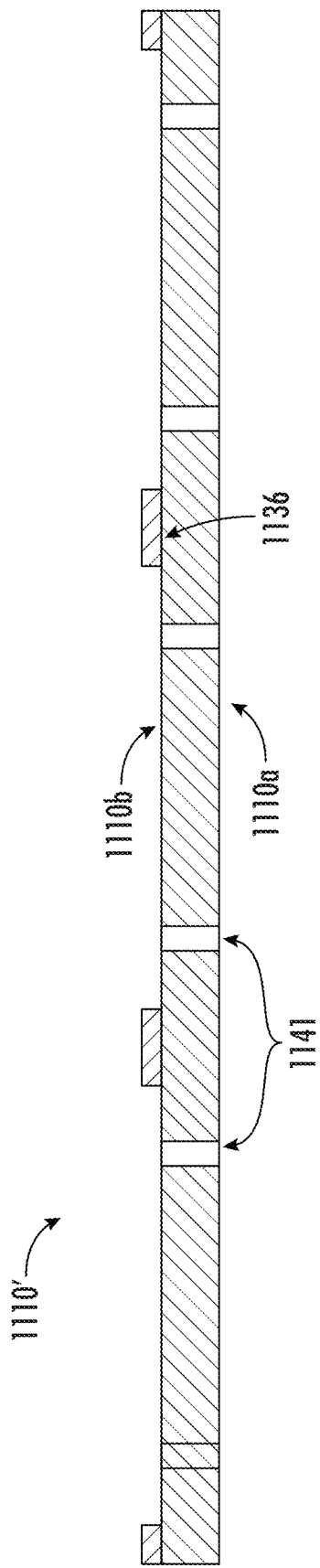

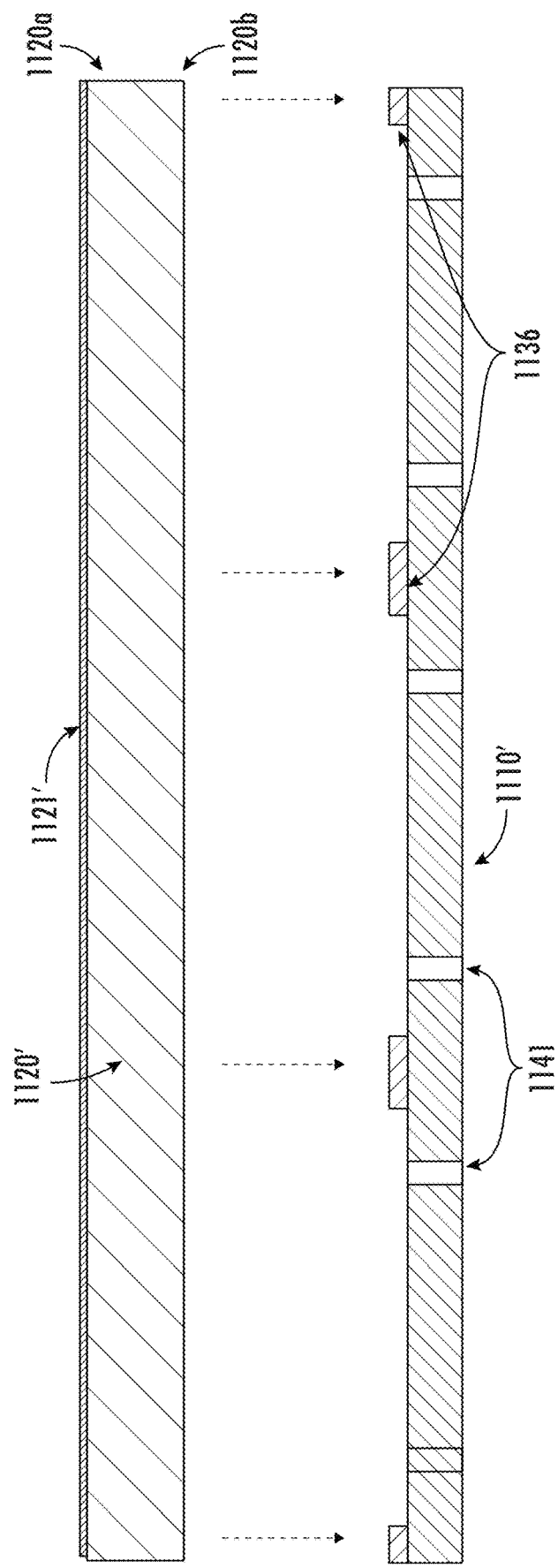

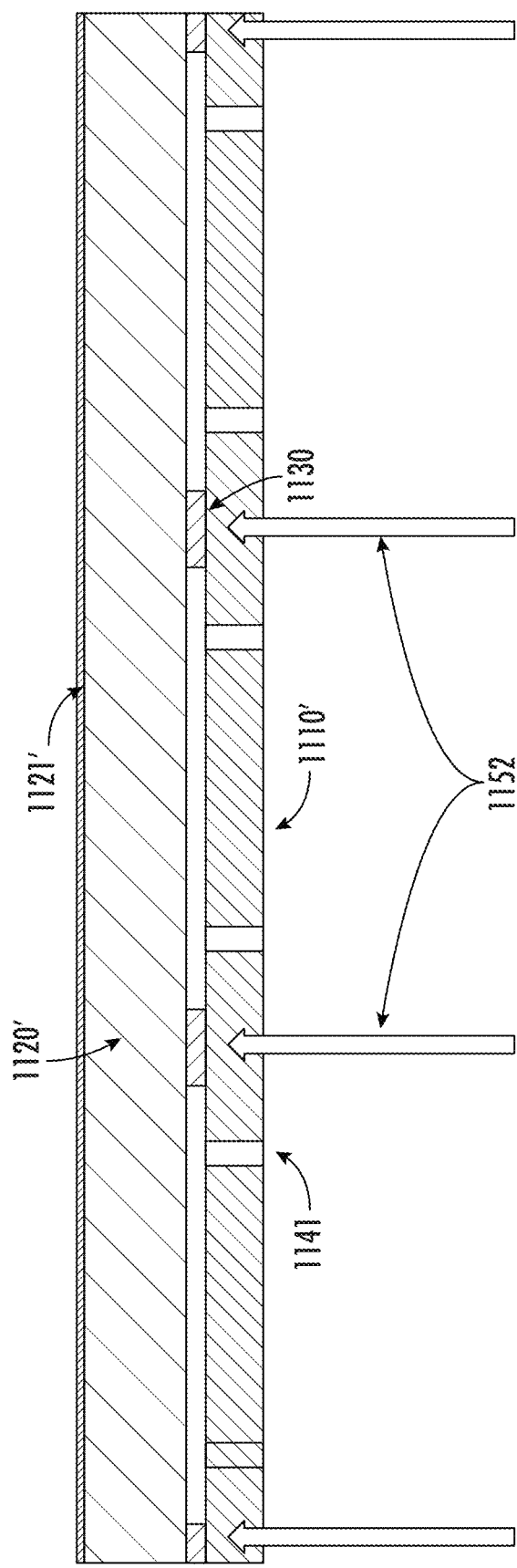

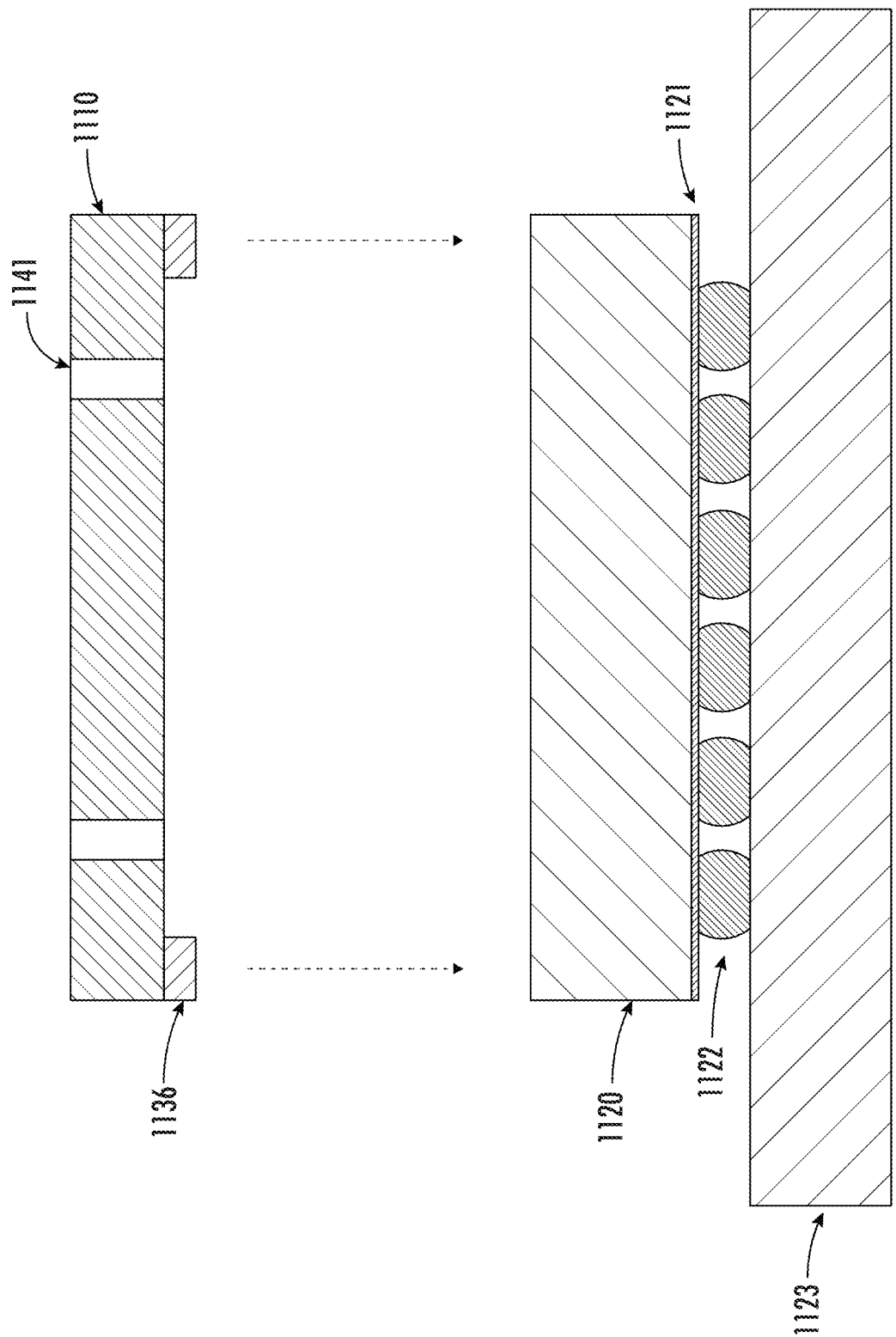

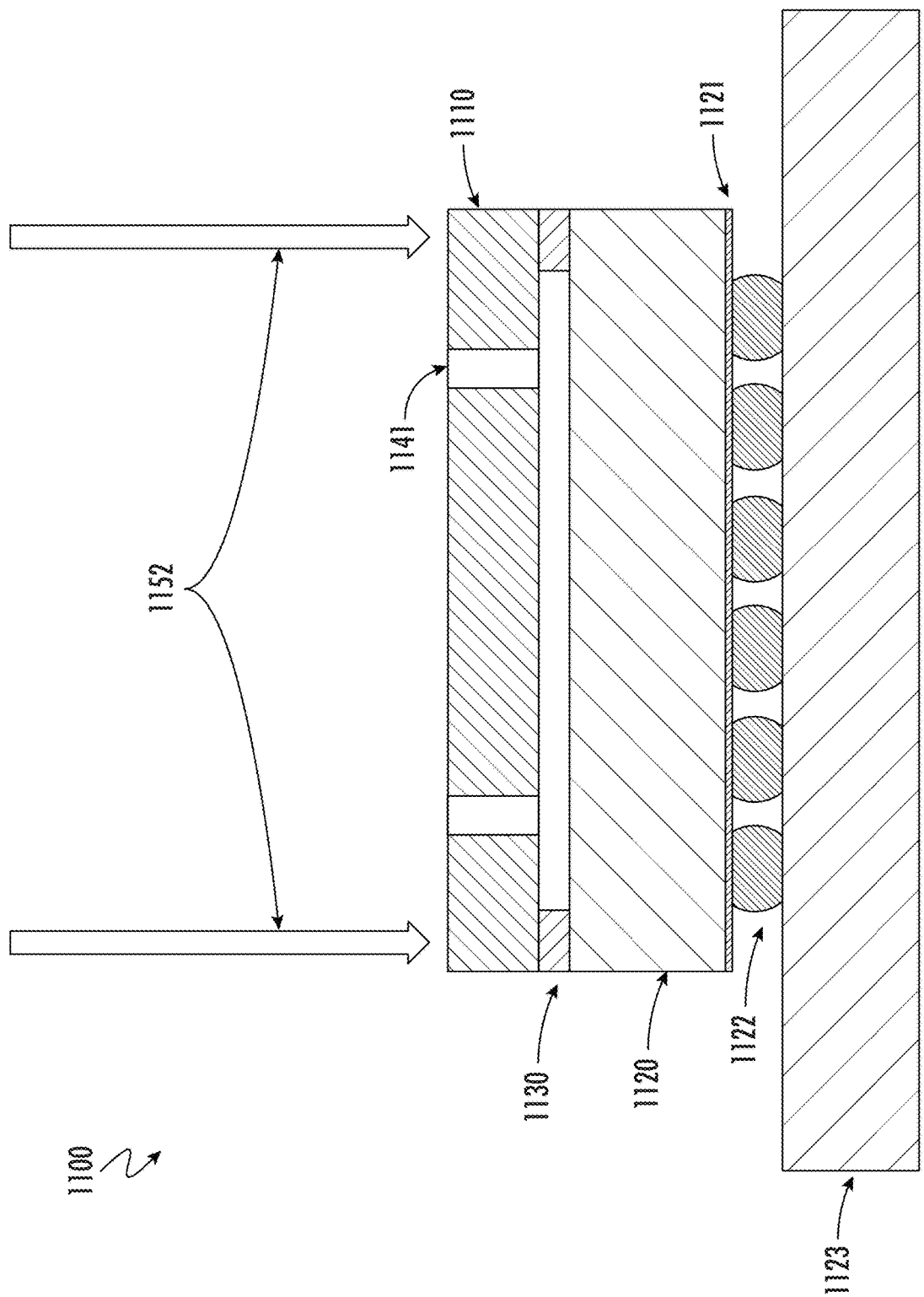

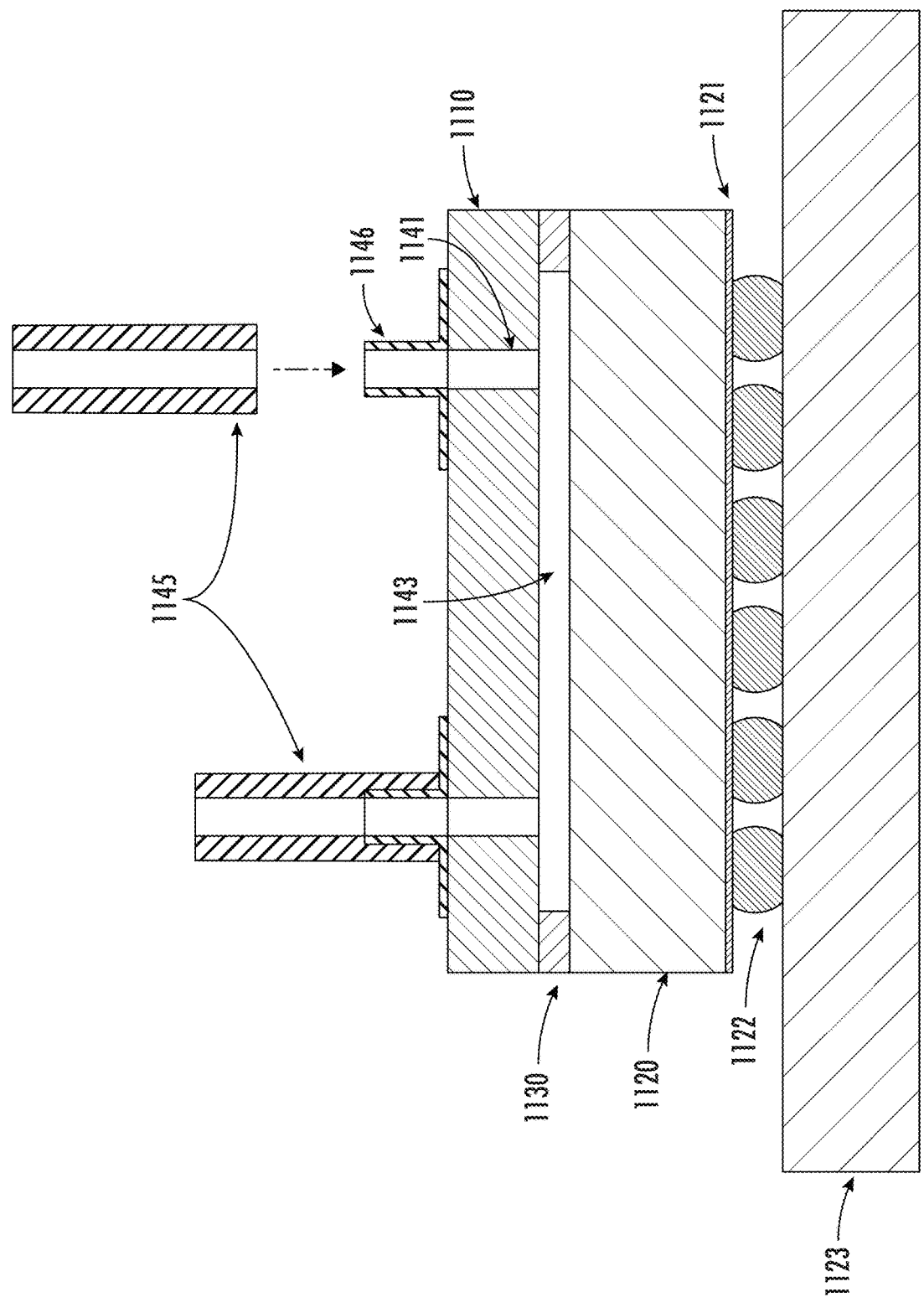

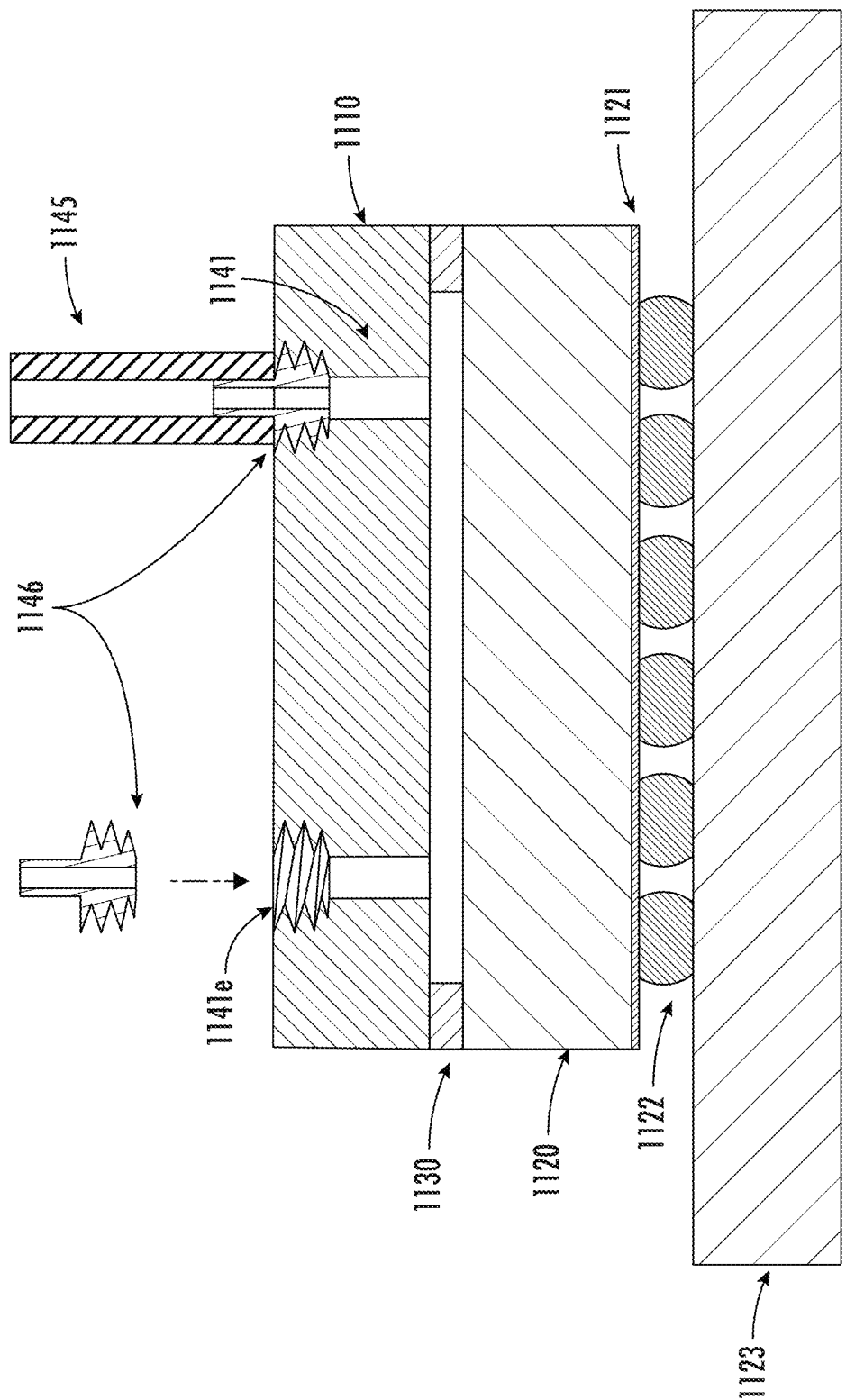

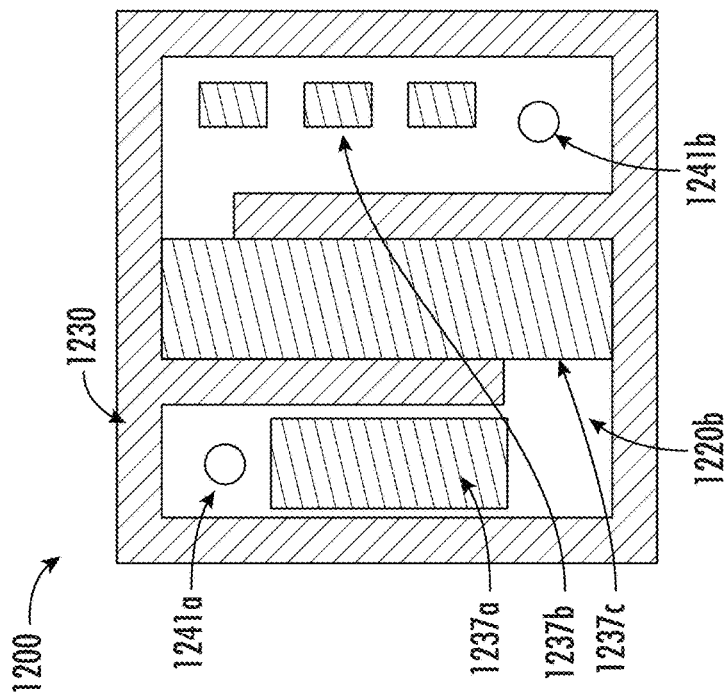
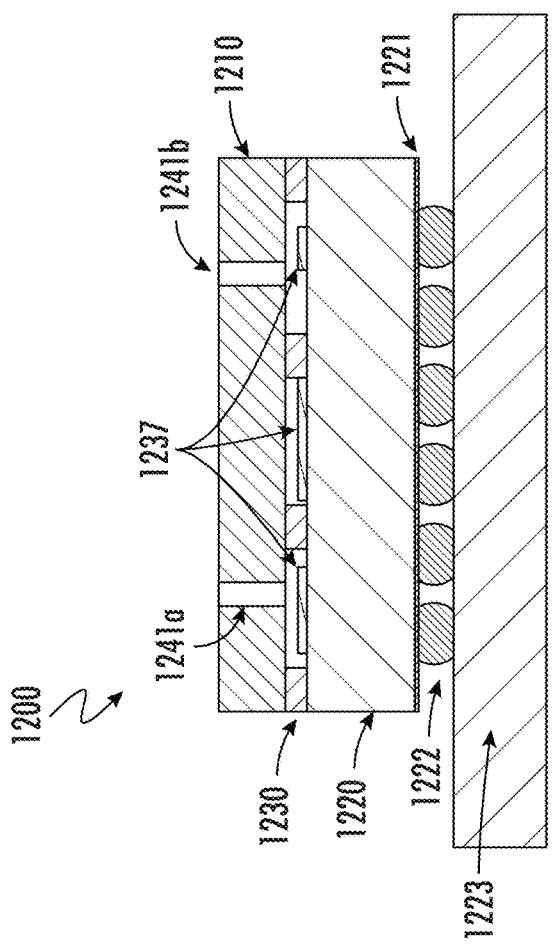
FIG. 20B
FIG. 20A

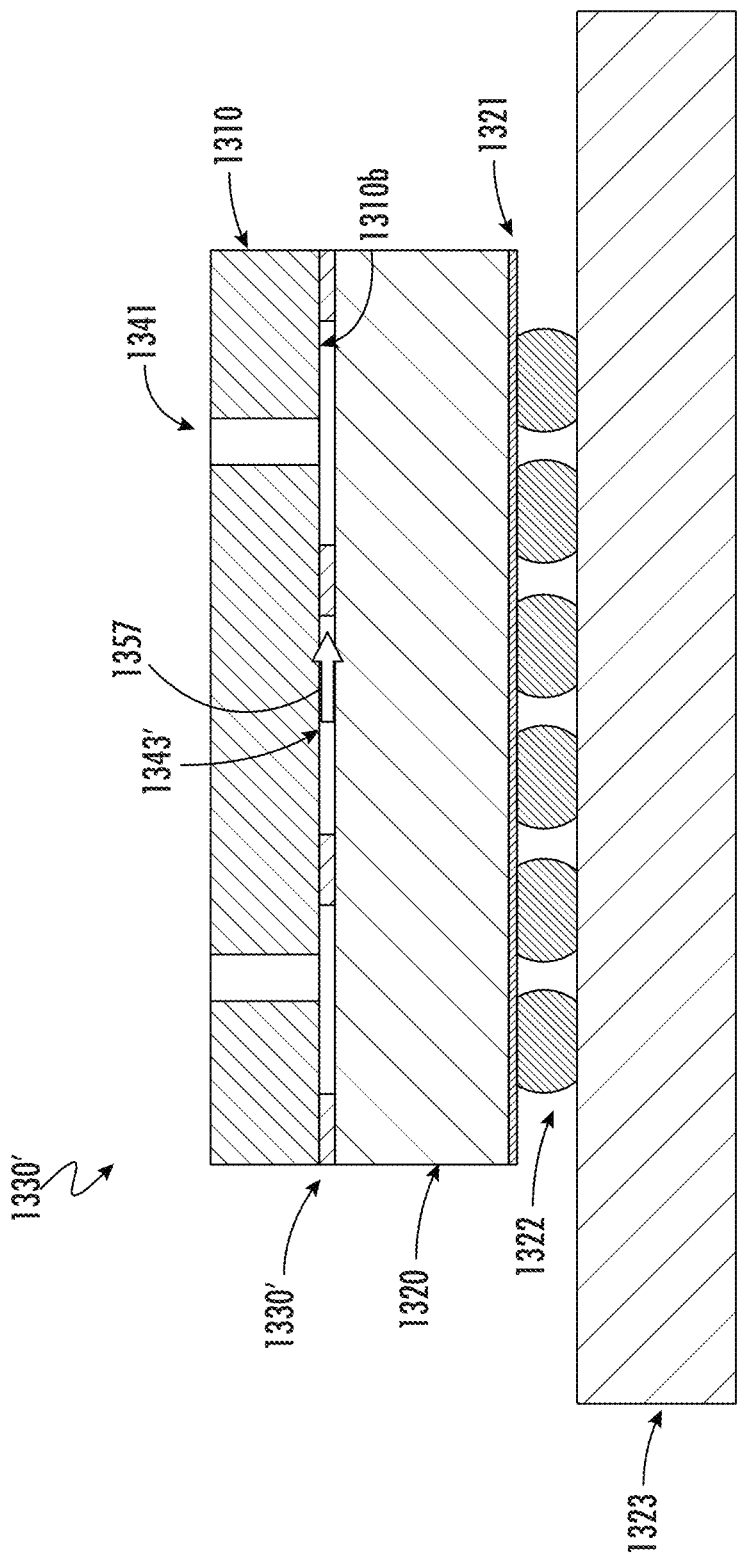

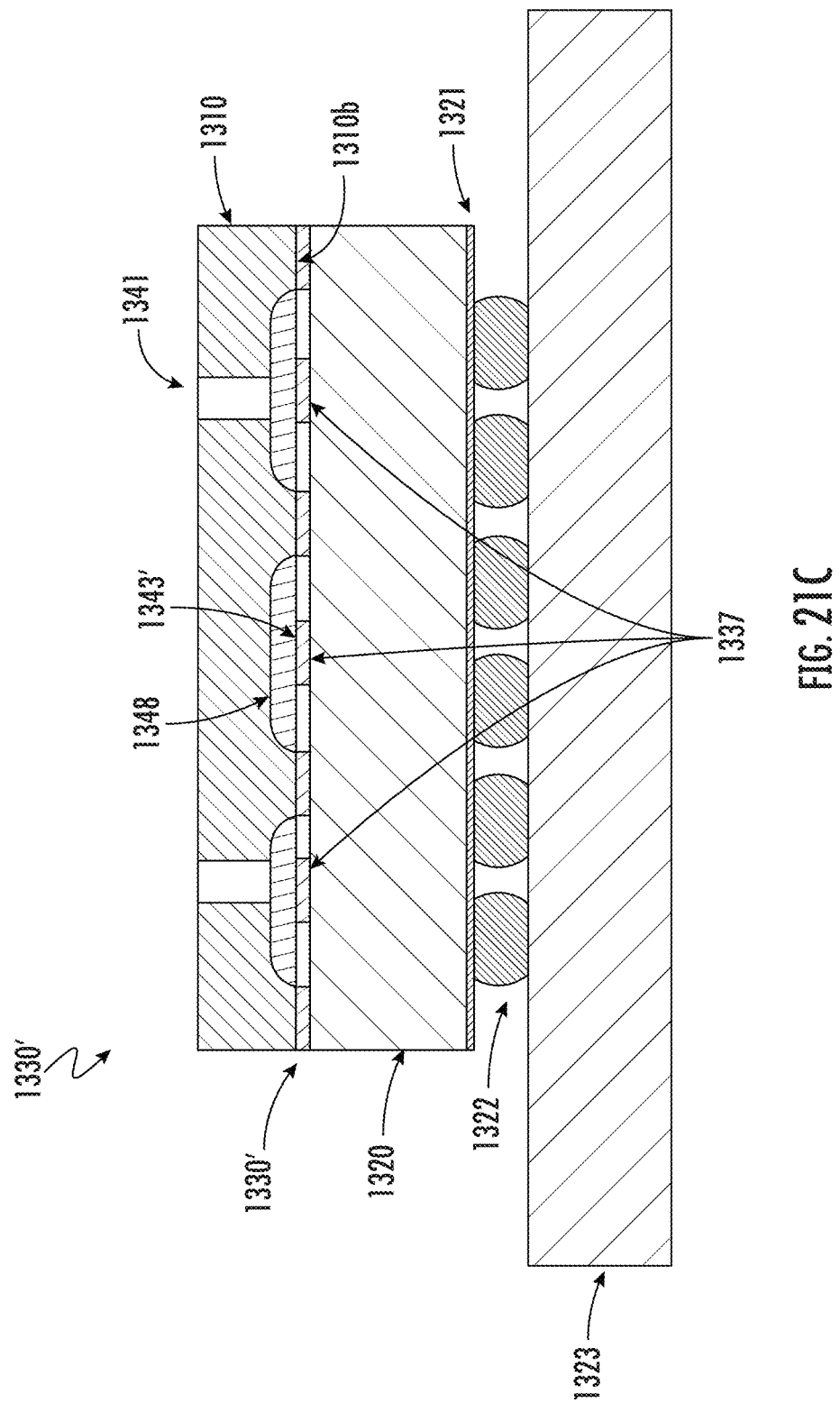

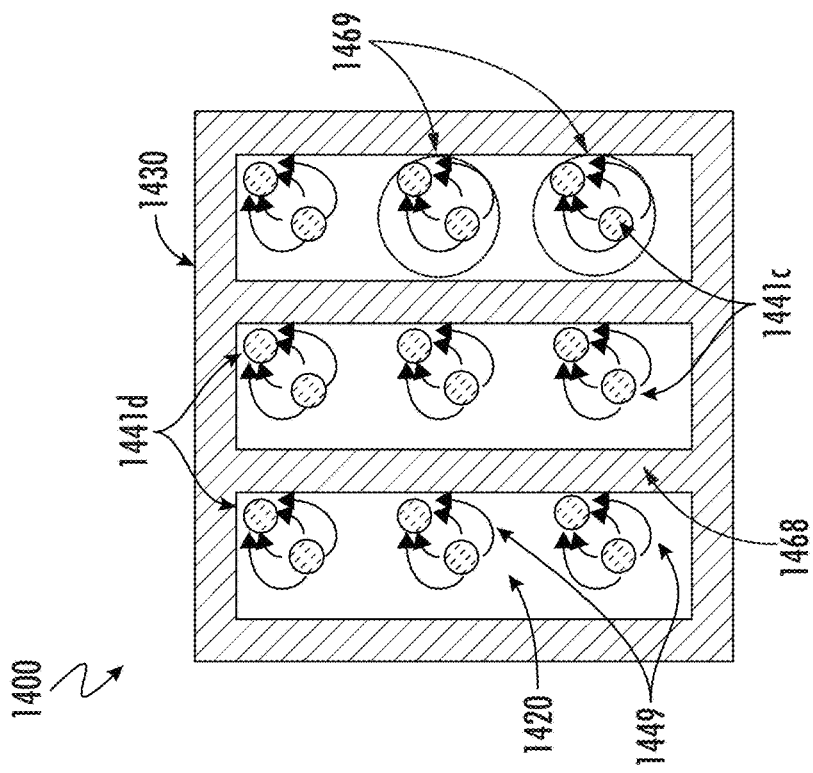
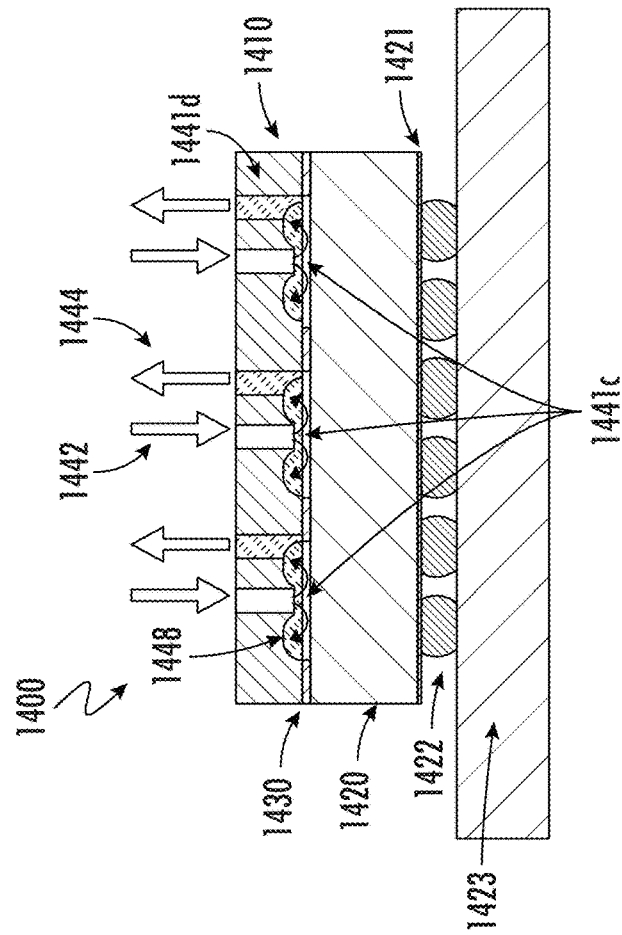
FIG. 23B
FIG. 23A

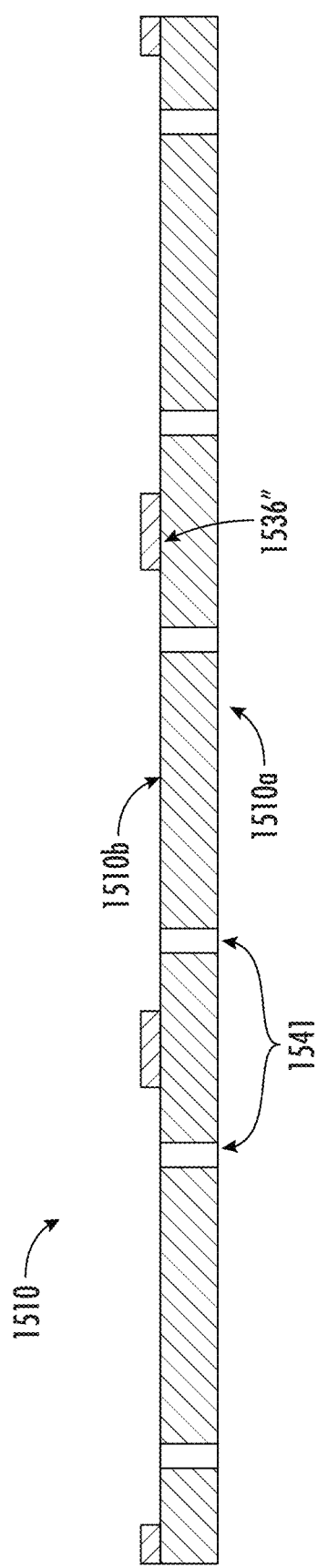

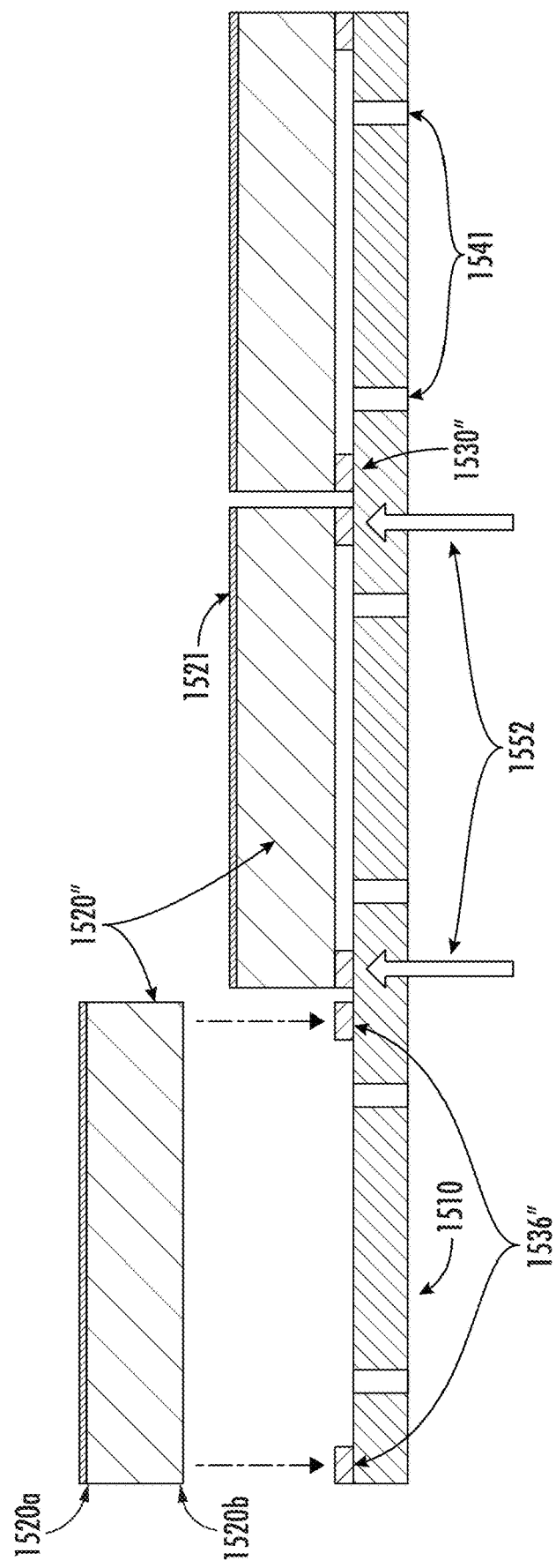

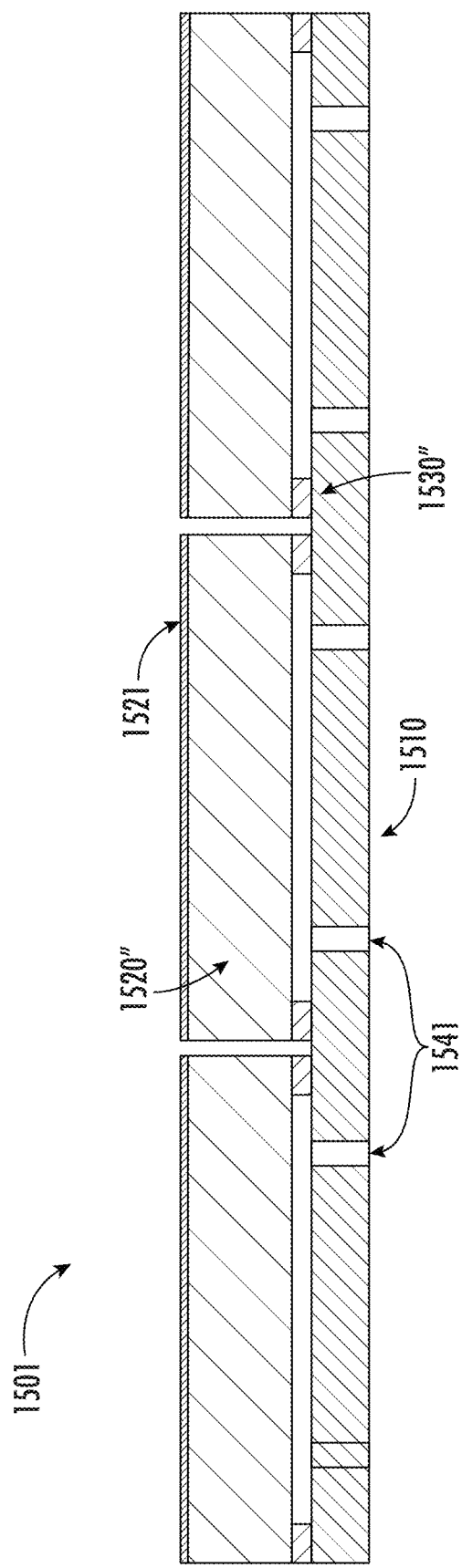

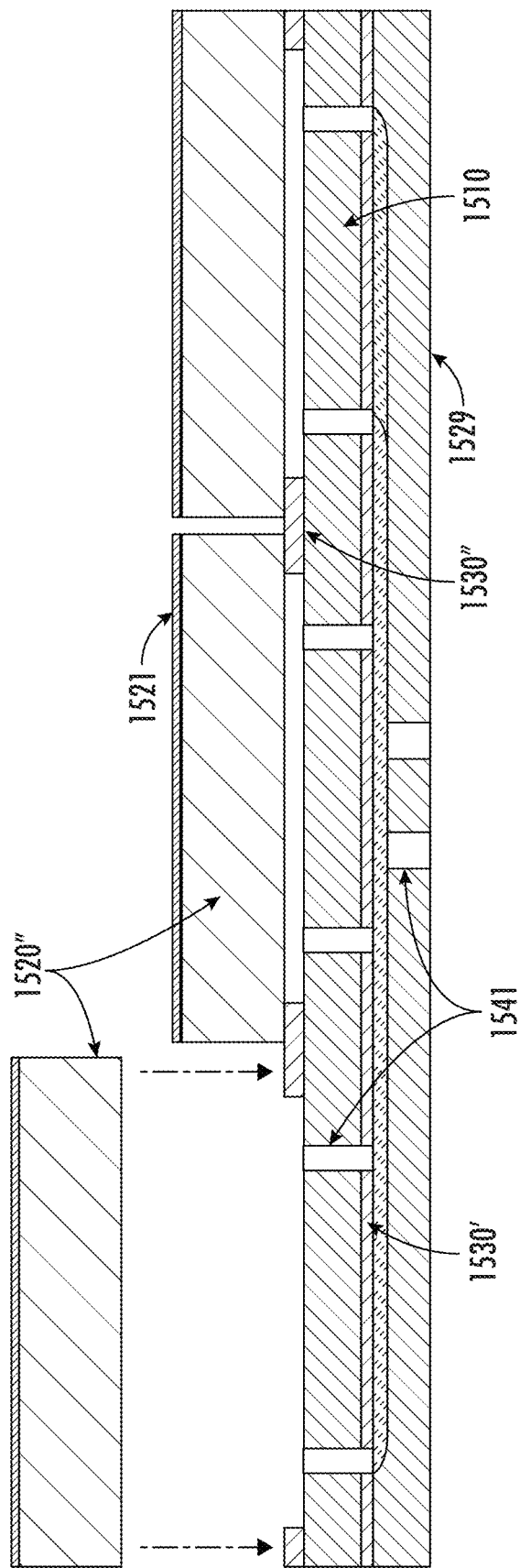

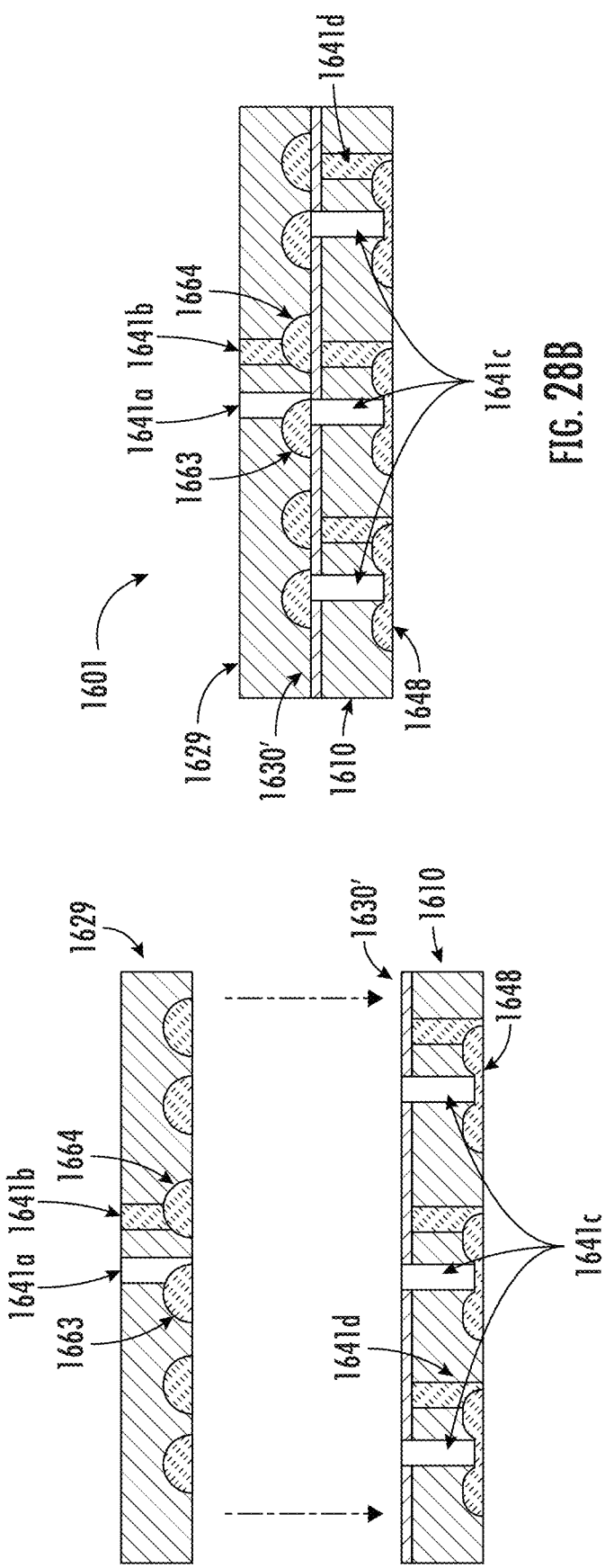

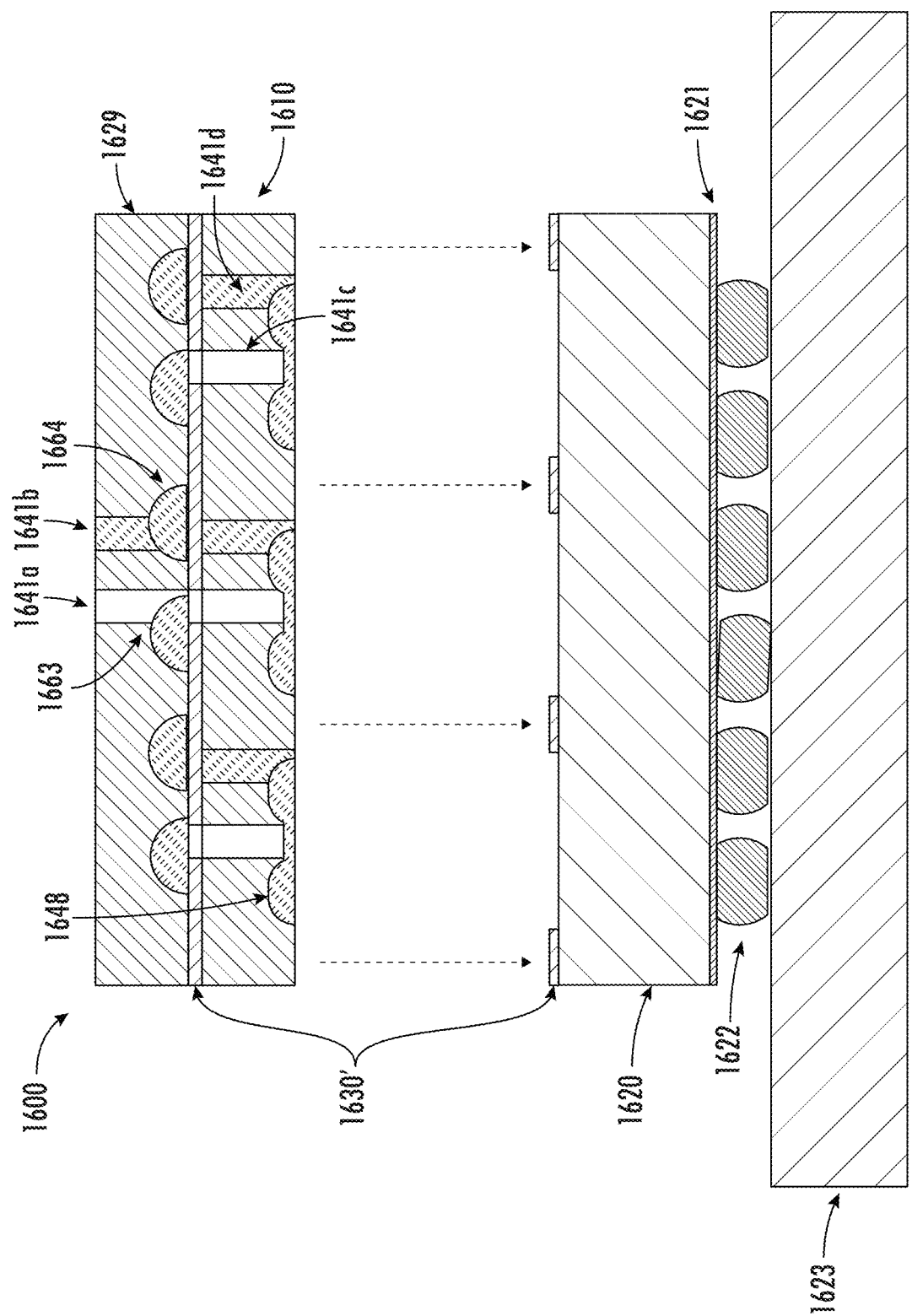

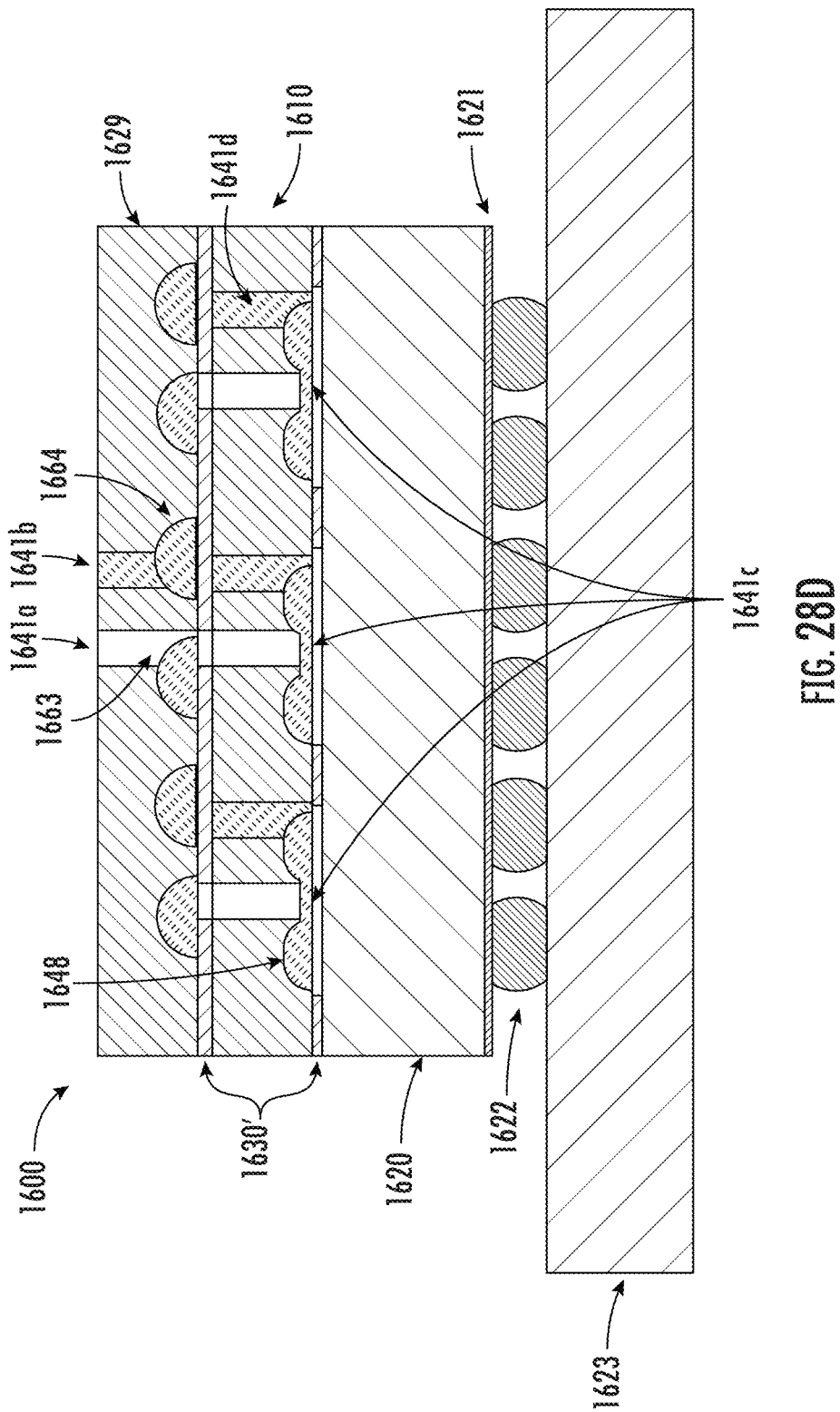

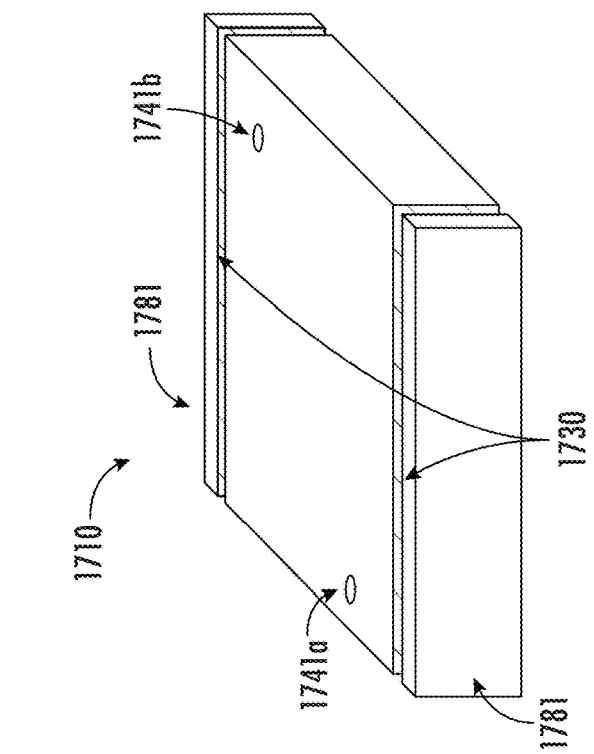
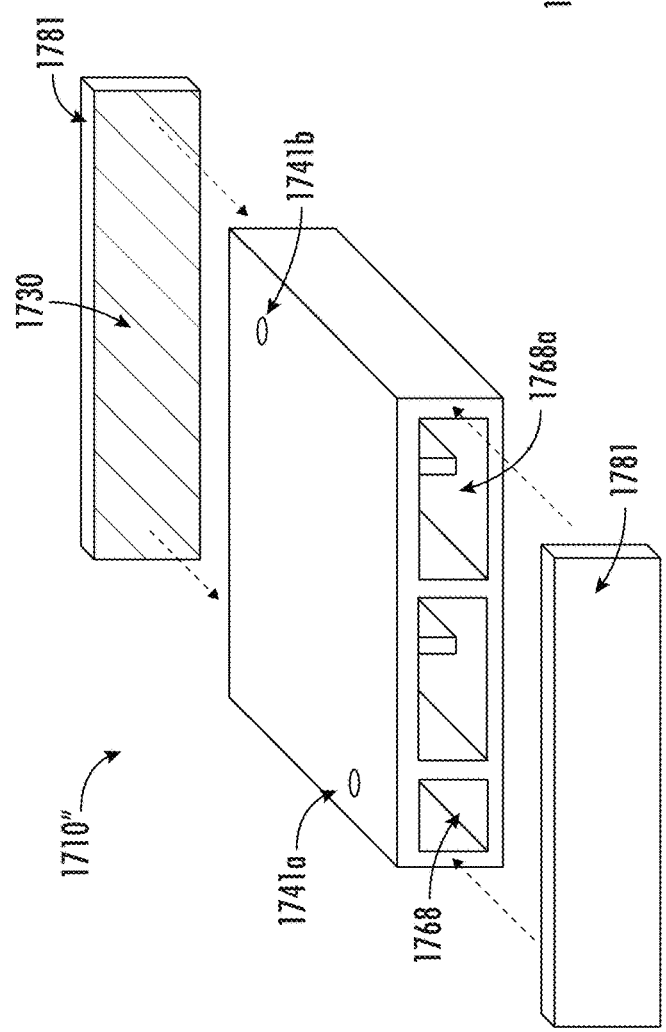
FIG. 29D
FIG. 29C

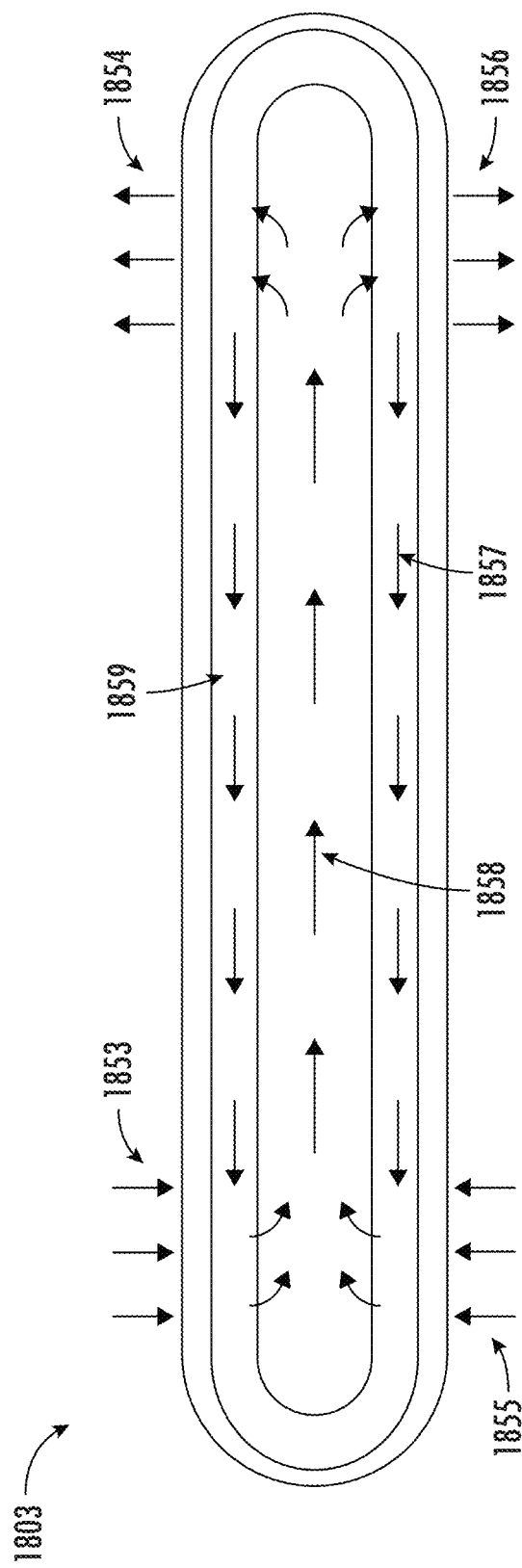

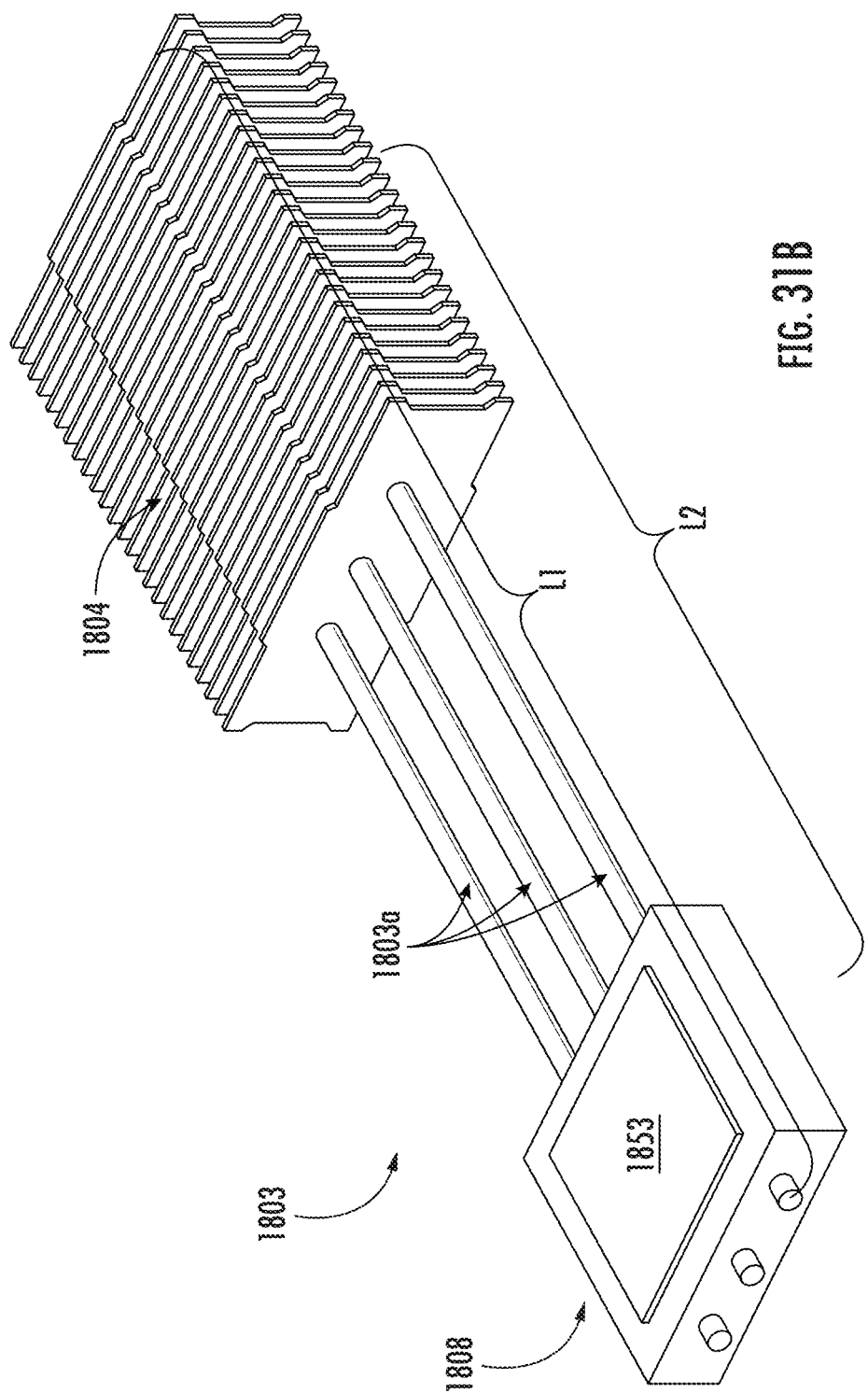

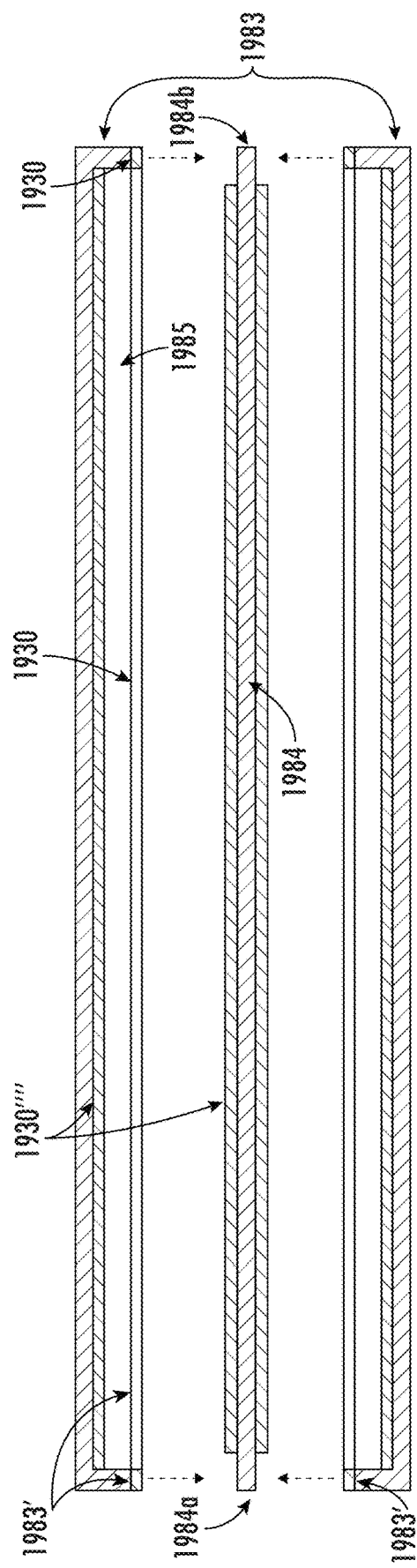
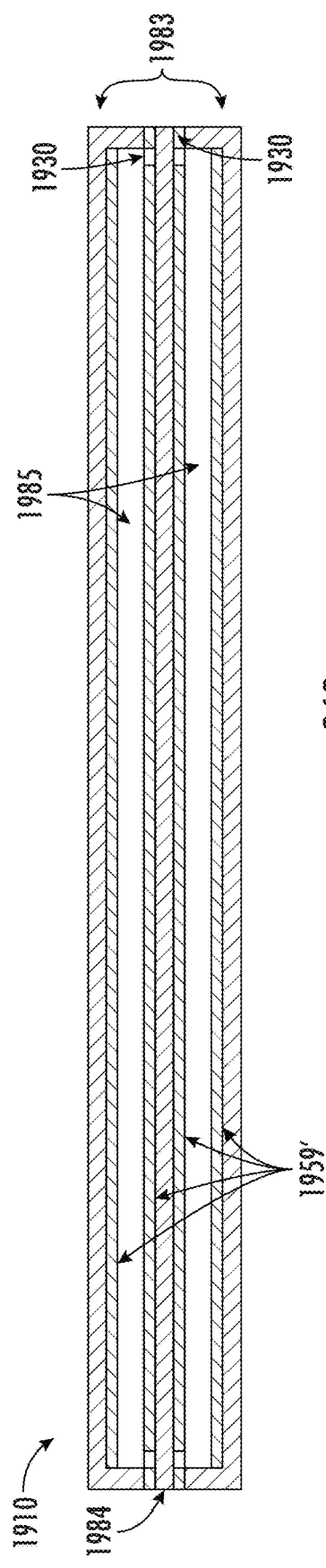
FIG. 36A
FIG. 36B

SYSTEMS AND METHODS OF NANO-PARTICLE BONDING FOR ELECTRONICS COOLING

CROSS-REFERENCE TO RELATED APPLICATION

This application claims priority to U.S. Application No. 63/296,219, filed Jan. 4, 2022, which is incorporated herein by reference in its entirety.

FIELD

Embodiments disclosed herein generally relate to joining substates, and particularly to joining substrates with nano-particles to enable cooling of electronics equipment.

BACKGROUND

Photonic component assembly and deployment faces a challenge of maintaining precise alignment of single mode optical waveguides within a precise distance over the life of the product. Known joining methods currently used have many concerns.

For example, when organic adhesives, which require thermal or UV curing, are cured shrinkage may produce shifts that introduce unacceptable coupling losses between the components. In another example, solder reflow of co-packaged optics components, organic adhesives may be heated well above their glass transition temperature resulting in component misalignment. Additionally, organic adhesives may swell and take in water in damp heat testing or become distorted by strain associated with different Coefficients of Thermal Expansion (CTE) between the organic adhesive and the materials they are bonded to (e.g., glass, silicon, etc.).

Likewise, non-organic adhesives introduce other challenges. For example, laser welding of components using molten metals or frits may lead to large shifts in components as the welding materials cool and shrink in transitioning from their liquid to solid phases. Further, laser processing temperatures also introduce large thermal gradients in glass and silicon substrates that may produce cracks that may compromise long term reliability performance. As another example, sodium silicate bonding solutions require long cure times (>5 minutes), extending the time on the assembly bench. Additionally, sodium silicate materials undergo significant shrinkage on curing that must be addressed in the assembly approach through rigid fixturing. Embodiments of the present disclosure provide improved bonding methods and systems using nano-particles.

Similarly, as electronics devices are decreasing in size, precise alignment of components on the surfaces of the electronics devices is required. Additionally, with the decrease in size of electronics devices, traditional cooling methods are unemployable as they may not dissipate heat effectively (e.g., a cooling fan). Cooling devices, including cooling manifolds, may be integrated into such electronics devices, however, the cooling devices must be precisely applied as to not interfere with the functionality of the components and the electronics device. Embodiments of the present disclosure provide improved cooling methods and systems for electronics using nano-particles.

BRIEF SUMMARY

Embodiments of the present disclosure provide for low-shift bonding of photonic components involving nano-particles, such as metal nano-particles partially or fully sintered to create a mechanical bond. Example metal nano-particles include nano-copper, nano-copper oxide, nano-silver, or nano-gold particles. The photonic components may be made of glass, metal, ceramics, or plastic, and may be in any shape, such as to include a flat surface, cylindrical surface, or raised features. In various embodiments herein, the photonic components may include or form a substrate or multiple substrates. Embodiments disclosed herein afford precision alignment and attachment of the photonic components.

Some embodiments of the present disclosure utilize low shift sintering of nano-material, enabling active alignment and attachment of optical components without concern for drift of an adhesive curing or metal solidifications. Therefore, there are extremely thin bond lines yielding predictable gap distances between photonic components. Further, some embodiments of the present disclosure enable rework of previously joined nano-particle layers. Rework of previously joined nano-particle layers may be enabled by additional localized heating to promote atomic mobility on the surface of the nano-particles. A liquid shell, or other loosely bound layer around the nano-particles that could allow the joined nano-particles to be displaced slightly under an application of external force allows a realignment as the nano-particles remain in contact. In a small rework shift (e.g., 1-2 um) the nano-particles may experience minimal distortion.

Some embodiments of the present disclosure afford precision alignment, and attachments. The nano-particles may be applied to the substrate in a localized pattern, allowing the remainder of the substrates to be used as a datum surface. Further the methods of application allow a user to apply a layer of nano-particles in a precise and extremely thin layer. The precision and thinness enables evanescent coupling between planar waveguides (e.g., deposited dielectric waveguides, ion exchange waveguides, rib waveguides), in comparison to current methods using adhesives which have a tendency to flow, making the excessive adhesive hard to manage around the substrates.

Various example embodiments described herein are directed to joining photonic components by using low temperature heating to fuse nano-particles together, providing a low shift non-organic technique for bonding substrates together. In this regard, the use of nano-particles enables precision alignment and attachment of optical components. More particularly, in some embodiments, a thin layer of nano-particles, suspended in a medium, are applied to a substrate, a second substrate is pressed downward onto the nano-particle layer, while a heating element directs heat towards the layer of nano-particles, fusing the nano-particles together.

Some embodiments of the present disclosure heat the nano-particle layer to about 200° C. for about 2 seconds to partially sinter the nano-particles. The low temperature and short time period provides enough heat for surface diffusion of atoms to begin, joining the nano-particles at contact points. However, such low temperature and short time period does not provide enough heat for the nano-particles to denature in shape and form.

Embodiments of the present disclosure create a mechanical bond between nano-particles utilizing partial sintering. Mechanical bonds, unlike electrical bonds, only require the nano-particles fuse at contact points, while the nano-particles retain their shape. Electrical bonds require full sintering of the nano-particles to reduce, collapse and close the internal voids between the nano-particles to increase the conductivity of the bond. Full sintering is conducted at high temperatures for a longer time, in comparison to partial sintering. Since electrical conductivity is unnecessary for a mechanical bond, partial sintering to fuse the nano-particles at contact points allows for a desirable high precision bond.

Various embodiments of the present disclosure join substrates with nano-particles. In some embodiments, a Fiber Array Unit (FAU) may be created by joining fibers of a fiber array to a V-groove substrate, by partially joining nano-particles. In some embodiments, the V-groove FAU may be lidded, and the lid may be joined to the fibers by partially sintered nano-particles.

Some embodiments of the present disclosure provide for cooling manifolds integrated with and/or attached to an electronics surface associated with electronics equipment. Notably, the nano-particle material may be used to form a fluid impermeable seal to enable coolant flow therein (e.g., for cooling the electronics equipment). The ability to apply low temperatures to form the seal is beneficial in the context of electronics equipment and allows for scalability and ease of manufacturing. In some embodiments, the cooling manifolds may be manufactured at wafer scale and then cut down to individual cooling manifolds. In some embodiments, the cooling manifolds may be manufactured as individual units.

Some embodiments of the present disclosure provide for cooling manifolds constructed from a low thermal conductivity material to serve as an insulator to limit the thermal cross talk among electronics equipment. Some embodiments of the present disclosure provide cooling manifolds that define a channel configured to receive a coolant fluid configured to remove heat generated by the electronics surface associated with the electronics equipment. In some embodiments, the cooling manifold may be configured to induce nucleate boiling of the coolant fluid throughout the channel, such as by positioning a thin layer of nano-particle medium on the electronics surface (e.g., within the channel).

Some embodiments of the present disclosure provide cooling manifolds configured for jet impingement cooling. In some embodiments, a jet of the coolant fluid may be directed down on to the electronics surface, wherein upon striking the electronics surface, the coolant fluid spreads out in all directions across the electronics surface and forms a thin velocity boundary layer.

Various embodiments of the present disclosure provide for a cooling manifold supporting multiple electronics surfaces, thereby simplifying handling.

Some embodiments of the present disclosure provide ceramic cooling manifolds to cool electronics equipment. In some embodiments, an extruded ceramic honeycomb substrate may be secured to an electronics surface to cool electronics equipment associated with the electronics surface.

Some embodiments of the present disclosure provide a heat pipe formed using nano-particles. In some embodiments, the heat pipe may be configured to transfer heat from an electronics surface associated with electronics equipment to location where larger cooling surfaces are provided.

Some embodiments of the present disclosure provide a microfluidic device. In some embodiments, the microfluidic device may use layers of nano-particles with varying thicknesses to evaluate properties of biological fluids.

In an embodiment of the present invention, a cooling manifold for electronics equipment is provided. The cooling manifold includes a first substrate having a first hole. A layer of nano-particles may be disposed between the first substrate and an electronics surface associated with the electronics equipment, wherein the electronics equipment generates heat. In some embodiments, the layer of nano-particles may be formed after an application of heat to a layer of nano-particle medium positioned between the first substrate and the electronics surface. The layer of nano-particles may define at least a portion of a seal between the first substrate and the electronics surface. The seal may define a channel between the first substrate and the electronics surface. The cooling manifold may be fluid impermeable so as to allow a coolant fluid entering through the first hole to flow through the channel to reduce or remove heat generated by the electronics equipment associated with the electronics surface.

In some embodiments, the layer of nano-particles comprises metallic nano-particles. In some embodiments, the layer of nano-particles comprises a filler particle, and the filler particle may be a CTE matching glass or ceramic particle.

In some embodiments, the cooling manifold further comprises at least one channel wall extending at least partially through the channel. The at least one channel wall extends between the first substrate and the electronics surface. In some embodiments, the at least one channel wall is formed by a second layer of nano-particles disposed between the first substrate and the electronics surface.

In some embodiments, the at least one channel wall forms a tortuous path, while in other embodiments, the at least one channel wall forms a plurality of parallel paths.

In some embodiments, the cooling manifold further comprises at least one cavity formed in the first substrate. The at least one cavity may further define the channel between the first substrate and the electronics surface.

In some embodiments, the cooling manifold, further comprises at least one deposit of nano-particles disposed on the electronics surface. The at least one deposit of nano-particles may be configured to induce nucleate boiling of the coolant fluid within the channel. The at least one deposit of nano-particles may have a deposit thickness less than a thickness of the layer of nano-particles. In some embodiments, the at least one deposit of nano-particles is a plurality of deposits of nano-particles, and the plurality of deposits of nano-particles are surrounded by at least one margin of non-coated electronics surface.

In some embodiments, the at least one deposit of nano-particles enables local convection in nucleate boiling regions, wherein the coolant fluid flows towards the at least one deposit of nano-particles to replace heated coolant fluid.

In seem embodiments, the first substrate further comprises a second hole, and the coolant fluid exits the channel through the second hole.

In some embodiments, the layer of nano-particles is between 5-50 microns thick, in other embodiments, the layer of nano-particles is between 0.5-5 microns thick.

In some embodiments, the layer of nano-particles comprises at least one hole within the seal. The at least one hole may be configured to introduce or remove coolant fluid from the at least one channel.

In another embodiment, a cooling manifold for electronics equipment is provided. The cooling manifold includes a first substrate comprising a plurality of jet impingement regions. Each of the plurality of jet impingement regions comprises a jet impingement hole, a return hole, and a cavity formed in a first side of the first substrate. The cavity is disposed about the jet impingement hole and configured to connect the jet impingement hole to the return hole. The cooling manifold further includes a first layer of nano-particles disposed between the first side of the first substrate and an electronics surface associated with the electronics equipment, wherein the electronics equipment generates heat. The layer of nano-particles may be formed after application of heat to a layer of nano-particle medium positioned between the first substrate and the electronics surface. The layer of nano-particles defines at least a portion of a seal between the first side of the first substrate and the electronics surface wherein the seal defines a channel between the first substrate and the electronics surface. The cooling manifold is fluid impermeable so as to allow a coolant fluid to enter the plurality of jet impingement regions through the jet impingement hole to flow through the channel to reduce or remove heat generated by the electronics equipment associated with the electronics surface, and flow out of the return hole.

In some embodiments, the cooling manifold, includes a second layer of nano-particles disposed between a second side of the first substrate and a third substrate. The third substrate comprises an inlet hole, an outlet hole, and a distribution channel disposed on a first side of the third substrate. The distribution channel is configured to provide fluid communication between the inlet hole and each of the jet impingement holes within the plurality of jet impingement regions. The third substrate further includes a return channel disposed on the first side of the third substrate. The return channel is configured to provide fluid communication between the outlet hole and each of the return holes within each of the plurality of jet impingement regions. The return channel is distinct from the distribution channel.

In yet another embodiment, a cooling manifold for electronics equipment is provided. The cooling manifold includes a first substrate having a plurality of first holes and a plurality of second holes. The cooling manifold further includes a first layer of nano-particles disposed between a first side of the first substrate and a plurality of electronics surfaces associated with the electronics equipment, wherein the electronics equipment generates heat. The first layer of nano-particles may be formed after application of heat to a layer of nano-particle medium positioned between the first substrate and the electronics surface. The layer of nano-particles may define at least a portion of a seal between the first substrate and each of the plurality of electronics surfaces. One of the plurality of first holes and one of the plurality of second holes is contained within the seal. The seal defines a channel between the first substrate and each of the plurality of electronics surfaces.

The cooling manifold further includes a second layer of nano-particles disposed between a second side of the first substrate and a third substrate. The third substrate includes an inlet hole, an outlet hole, a distribution channel disposed on a first side of the third substrate. The distribution channel is configured to provide fluid communication between the inlet hole and each of the plurality of first holes. The third substrate further includes a return channel disposed on the first side of the third substrate. The return channel is configured to provide fluid communication between the outlet hole and each of the plurality of second holes and is distinct from the distribution channel.

The cooling manifold is fluid impermeable so as to allow a coolant fluid entering through the inlet hole to flow through the distribution channel to each of the plurality of first holes, flow through the channel defined between the first substrate and the plurality of electronics surfaces to reduce or remove heat generated by the electronics equipment associated with the plurality of electronics surfaces, and flow out of the plurality of second holes, through the return channel and out of the outlet hole.

In yet another embodiment, a heat pipe for cooling electronics equipment is provided. The heat pipe comprises a first substrate having a first end and a second end and at least one channel therethrough. A first layer of nano-particles is disposed near the first end of the first substrate between the first substrate and an electronics surface associated with the electronics equipment, wherein the electronics equipment generates heat. The first layer of nano-particles is formed after application of heat to a first layer of nano-particle medium positioned between the first substrate and the electronics surface associated with the electronics equipment. The heat pipe further comprises at least one second layer of nano-particles disposed near the second end of the first substrate between the first substrate and a second substrate. The at least one second layer of nano-particles is formed after application of heat to at least one second layer of nano-particle medium positioned between the first substrate and the second substrate. The second substrate is configured to transfer the heat generated by the electronics equipment to an ambient environment via free or forced air convection.

In some embodiments, the at least one channel is at least partially formed by a wick surface, wherein the wick surface is formed from a coating of nano-particles.

In some embodiments, the heat pipe further comprises a coolant fluid contained within the at least one channel and configured to flow within the at least one channel between the first end and the second end of the first substrate.

In some embodiments, the first substrate comprises a first channel plate having a first rim, a second channel plate having a second rim, a ceramic sheet and at least one third layer of nano-particles disposed between the ceramic sheet and the first rim, and the ceramic sheet and the second rim. After an application of heat to the at least one third layer of nano-particles, the first substrate is fluid impermeable so as to allow the coolant fluid flow through the at least one channel to reduce or remove heat generated by the electronics equipment associated with the electronics surface. In some embodiments, the first layer of nano-particles is in contact with the coolant fluid.

In yet another embodiment, a method of forming a cooling manifold is provided. The method comprises applying a layer of nano-particle medium to a first substrate, wherein the first substrate includes a first hole. The method continues by aligning an electronics surface associated with electronics equipment with the layer of nano-particle medium such that the layer of nano-particle medium is in contact with both the first substrate and the electronics surface. The method continues by causing an application of heat to the layer of nano-particle medium to cause connection of contact points between adjacent nano-particles within the layer of nano-particle medium yielding a layer of nano-particles. The layer of nano-particles defines at least a portion of a seal between the first substrate and the electronics surface, wherein the seal is fluid impermeable so as to allow a coolant fluid entering through the first hole to flow through the channel to reduce or remove heat generated by the electronics equipment associated with the electronics surface.

BRIEF DESCRIPTION OF THE SEVERAL VIEWS OF THE DRAWING(S)

Having thus described the disclosure in general terms, reference will now be made to the accompanying drawings, which are not necessarily drawn to scale, and wherein:

FIG. 2A illustrates nano-particles after various stages of sintering, in accordance with some embodiments discussed herein;

FIG. 5A illustrates a cross-section of a layer of nano-particles including an electrode to aid in heating of the nano-particle layer, in accordance with some embodiments discussed herein;

FIG. 5B illustrates a cross-section of a layer of nano-particles joining two substrates with joint infiltration with an organic adhesive, in accordance with some embodiments discussed herein;

FIGS. 7A-7D illustrate various steps of fusing substrates using nano-particles, in accordance with some embodiments discussed herein;

FIGS. 10A-10B illustrate a cross sectional view of a squeeze apparatus to apply a force to the substrates during nano-particle joining, in accordance with some embodiments discussed herein;

FIGS. 12A-12F illustrate a side-view of joining substrates in a V-groove based fiber array unit interconnection to a planar light wave circuit (PLC) waveguide using nano-particles, in accordance with some embodiments discussed herein;

FIGS. 13A-13G illustrate a side-view of joining a fiber array-on-glass fiber array unit interconnection to PLC planar waveguide using nano-particles, in accordance with some embodiments discussed herein;

FIGS. 15A-15B illustrate cross-sectional views of an example first substrate of an example cooling manifold, in accordance with some embodiments discussed herein;

FIGS. 15E-15F illustrate cross-sectional views of joining the first substrate, shown in FIG. 15A and the second substrate, shown in FIG. 15D, in accordance with some embodiments discussed herein;

FIGS. 16A-16B illustrate cross-sectional views of forming a cooling manifold joined to a PCB, in accordance with some embodiments discussed herein;

FIGS. 17A-17C illustrate cross-sectional views of various fluid connections for holes within the first substrate, in accordance with some embodiments discussed herein;

FIG. 20A illustrates a cross-sectional view of another example channel configuration, in accordance with some embodiments discussed herein;

FIG. 20B illustrates a top cross-sectional view of the example channel configuration shown in FIG. 20A, in accordance with some embodiments discussed herein;

FIGS. 21A-21C illustrate cross-sectional views of example cooling manifolds, in accordance with some embodiments discussed herein;

FIG. 23A illustrates a cross-sectional view of another example cooling manifold configured to jet impingement cooling, in accordance with some embodiments discussed herein;

FIG. 23B illustrates top cross-sectional view of the example cooling manifold shown in FIG. 23A, in accordance with some embodiments discussed herein;

FIG. 25A illustrates a cross-sectional view of an example first substrate for use in a cooling manifold, in accordance with some embodiments discussed herein;

FIGS. 25B-25D illustrate cross-sectional views of forming an example cooling manifold to support a plurality of electronics surfaces, in accordance with some embodiments discussed herein;

FIG. 26 illustrates a cross-sectional view of an alternative forming of the cooling manifold shown in FIG. 25E, in accordance with some embodiments discussed herein;

FIGS. 28A-28D illustrates cross-sectional views of formation of an example cooling manifold, in accordance with some embodiments discussed herein;

FIGS. 29A-29D illustrate perspective views of formation of an example first substrate for use in a cooling manifold, in accordance with some embodiments discussed herein;

FIG. 31A illustrates a cross-sectional view of an example heat pipe, in accordance with some embodiments discussed herein;

FIG. 31B illustrates a perspective view of an example heat pipe, in accordance with some embodiments discussed herein;

FIGS. 36A-36B illustrate cross-sectional views of formation of an example heat pipe, in accordance with some embodiments discussed herein;

DETAILED DESCRIPTION

Figure 1B:
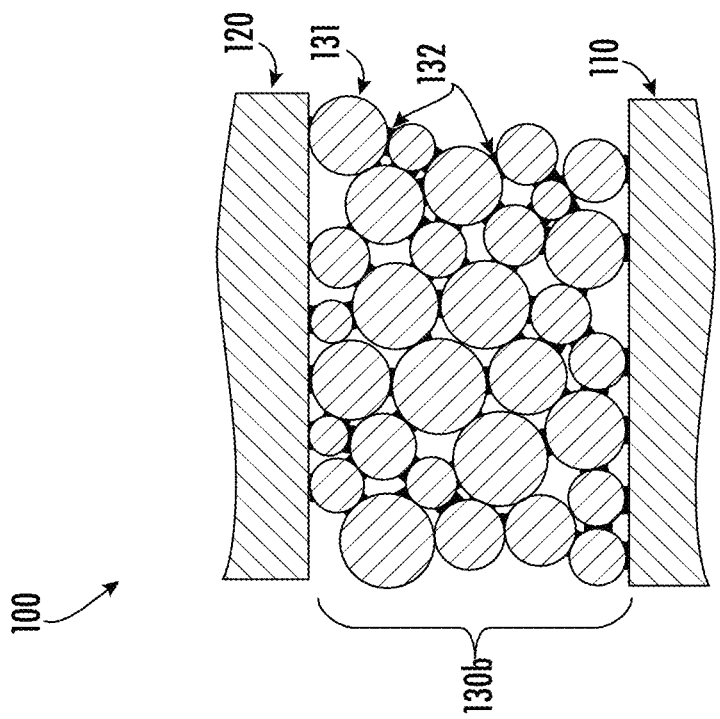
FIG. 1B illustrates a cross-section of the thin layer of nano-particles shown in FIG. 1A after particle joining, in accordance with some embodiments discussed herein.

Some example embodiments will now be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout.

The term "nano-particle" as used herein may refer to a material which is small in size (e.g., between 1 and 100 nm in diameter (or height)). Such a nano-particle may be, for example, a metal nano-particle, which may, for example, include nano-copper, nano-gold, or nano-silver particles.

The term "medium" as used herein may refer to a liquid solvent, such as to be mixed with nano-particles to form a substance to apply to the components to be bonded. Such a liquid solvent may be, for example, a paste, a solvent-based slurries, an ink, or any solvent which suspends the nano-particles for application.

The term "necking" as used herein may refer to the joint or bond formed between connection points of adjacent nano-particles.

The term "heating" as used herein may refer to an application of energy, such as heat. Example application may occur, for example, with a laser, through an oven, via radio frequency, infrared, visible, or ultraviolet light, or microwave heating.

The term "fused" as used herein may refer to a various levels of joinder between two or more nano-particles. For example, the nano-particles may be fused through partial sintering, full sintering, etc.

The term "substrate" as used herein may refer to a material which provides a surface for a material to be deposited thereon.

As noted herein, glass, metal, metal-coated, and other material substrates, may be joined together using fused nano-particles, such as nano-silver and nano-copper powders in accordance with embodiments of the present invention.

Embodiments of the present disclosure provide for low-shift bonding of substrates involving nano-particles, such as metal nano-particles partially sintered to create a mechanical bond. Example metal nano-particles may include nano-copper, nano-copper oxide, nano-silver, and nano-gold particles, although other metal nano-particles are considered. The substrates may be made of glass, silicon, ceramics, metal, plastic, or a combination thereof, and may be in any shape including a flat surface, cylindrical surface, and may include raised features. In various embodiments, the substrates are photonic components, and embodiments disclosed herein afford precision alignment and attachment of the photonic components.

Some embodiments of the present disclosure utilize low shift sintering of nano-materials, enabling active alignment and attachment of optical components without concern for drift of an adhesive curing or metal solidification. Therefore, there are extremely thin bond lines yielding predictable gap distances between the photonic components. In some embodiments, the thin bond lines may be less than 1 um, less than 0.5 um, or less than 0.2 um thick.

Various embodiments of the present disclosure utilize low temperature heat for short periods of time to partially sinter nano-particles—thereby providing a low shift non-organic joining technique. Some embodiments of the present disclosure heat the nano-particle layer to about 200° C. for about 2 seconds to partially sinter the nano-particles. The low temperature and short time period provides enough heat for surface diffusion of atoms to begin to join the nano-particles at contact positions without causing the nano-particles to denature in shape and form.

Some embodiments of the present disclosure create a mechanical bond between nano-particles utilize partial sintering. Notably, such embodiments may employ lower heat and reduced heating time because there is no need to form a low resistance electrical bond. In this regard, electrical bonds would require full sintering of the nano-particles to reduce, collapse and close the internal voids between the nano-particles to increase the conductivity of the bond. Full sintering, however, is conducted at high temperatures for a longer time, in comparison to partial sintering. Since electrical conductivity is unnecessary for a mechanical bond, partial sintering to fuse the nano-particles at contact points allows for a high precision bond without some negative side effects caused by heating at higher temperatures and for longer periods of time.

In some embodiments, the nano-particles may be sintered in an inert atmosphere, or in a reactive reducing atmosphere. Reducing chemical agents may also be incorporated into the medium to promote nano-particle contact during heating. In some embodiments, the nano-particles (e.g., silver or copper nano-particles) may be sintered in air. Unlike in electrical applications where removal of Copper (II) Oxide (CuO) is necessary to reduce electrical resistance, the inert environment is not a requirement for precision mechanical bonding—such as contemplated with various embodiments of the present invention.

Figure 1A:
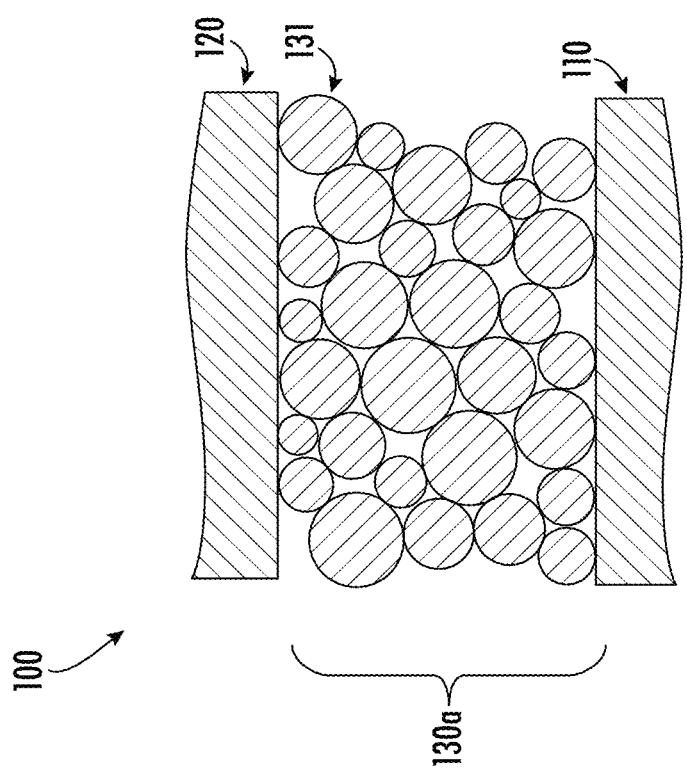
FIG. 1A illustrates a cross-section of thin layer of nano-particles positioned between two substrates prior to particle joining, in accordance with some embodiments discussed herein.

A mechanical bond may be formed by fusing of nano-particles disposed between two substrates. FIG. 1A illustrates a cross-sectional view of a first substrate 110 and a second substrate 120 with a thin layer of nano-particles 130a disposed between the first and second substates, prior to the nano-particles 131 of the layer of nano-particles 130a being fused together. Before application of the nano-particles onto the first substrate, the nano-particles 131 may be suspended in a medium, such as a solvent or a paste. The nano-particle medium may be deposited onto the first substrate and exposed to a thermal process. The thermal process is configured to remove at least part of the medium which allows the nano-particles 131 to pack together and make point contacts with adjacent (e.g., neighboring) nano-particles between the first substrate and the second substrate. Additionally or alternatively, the thermal process may drive off suspension materials slowly, preventing bubbles that may create voids in the thin layer of nano-particles 130a.

With the nano-particles exposed, such as shown in FIG. 1A, the nano-particles may be heated to begin fusing together at their contact points. FIG. 1B illustrates the first substrate 110 and the second substrate 120 joined by the layer of nano-particles after exposure to a heating process yielding a layer of joined nano-particles 130b. Each of the nano-particles 131 in the layer of nano-particles 130b illustrates particle necking connections at the neck regions 132 with adjacent nano-particles 131 between the first substrate and the second substrate.

Nano-particles, due to their extremely small diameter, have different properties than bulk metals. For example, the melting point of nano-particles is much lower (e.g., 150° C.-300° C.) than the melting point of the bulk metals (e.g., 1084° C. for copper and 961° C. for silver). The low melting point arises from surface energy difference associated with extremely small diameter metal particles (e.g., 30-70 nm diameter), where surface atoms are more weakly bound to the crystal lattice, enabling them to migrate on the surface. When the nano-particles are heated to these temperatures, atoms on the surface of the nano-particles become mobile and start to rearrange in a way that minimizes the total surface energy of the nano-particle. The surface atoms gather at the contact points between two adjacent nano-particles (i.e., the neck region), while the interior atoms do not shift such that the diameter of the nano-particle does not change significantly. As a result, particle necking occurs when the nano-particles are heated to a relatively low temperature (e.g., 200° C.).

Particle necking may be achieved through partial sintering. Partial sintering involves heating the nano-particles to low temperatures (e.g., 200° C.) so that adjacent nano-particles bond at contact points, while retaining their shape. Full sintering, in comparison, involves heating the nano-particles until the nano-particles deform, and fuse together at more than the initial contact points. Notably, full sintering reduces the resistivity of the nano-particles to achieve a conductive bond.

As heat is applied to nano-particles, the shape of the nano-particles begin to change. Notably, as higher temperatures and/or more exposure time occurs, the particles denature more. FIG. 2A illustrates a layer of nano-copper-filled ink at various stages of laser heating (e.g., sintering). The first image 139a illustrates nano-particles after an initial heating (e.g., a first thermal process to remove the medium), wherein organic materials about the nano-particles have been partially removed. The second image 139b illustrates nano-particles after partial sintering. Here the nano-particles are bonded at their contact points, while retaining their original shape. The third image 139c illustrates the nano-particles after full sintering. Here the nano-particles have experienced extensive shape changes due to material coalescence and void filling and closure.

Laser heating in electrical interconnections, as discussed and illustrated above, requires the nano-particles to be heated to the point that internal voids close and collapse, or nearly collapse, to minimize the electrical resistance (e.g., 139c of FIG. 2A). However, for mechanical bonds, high electrical conductivity is not a requirement, whereas sufficient nano-particle joining to resist distortion of joined components (e.g., substrates) under stresses that may lead to misalignment is a requirement. As sintering progresses from 139a to 139b, the joined nano-particle network shrinks between 0-1%, and the shear strength of the bond increases to about 10 MPa. In comparison, as sintering progresses from 139a to 139c, the joined nano-particles shrinks about 5-10%, shear strength of the joints increases to between 50-60 MPa, as the shrinkage force increases it becomes harder for the nano-particles to resist tendency to shrink and bond, and the electrical resistivity is reduced.

In some embodiments, the magnitude of joint shrinkage is correlated to the initial nano-particle layer thickness. For example, if a 1.0 um thick nano-particle layer is deposited on a surface, it may shrink by 10-20 nm on initial laser heating, and up to 100 nm on full sintering. Therefore, full sintering may be desirable to maximize bond strength, but may lead to an unacceptable component shift. In some embodiments, the component shift may be avoided by displacing the nano-particle layer during assembly (e.g., applying pressure to the nano-particle layer, such as when the first and second substrate are brought together). In such an embodiment, as the nano-particles are able to flow under the application of pressure, a thin layer of nano-particles may be formed between the two substrates. In some such embodiments, the thin layer of nano-particles may be fully sintered for maximum shear strength, since the component shift will be negligible.

Figure 2B:
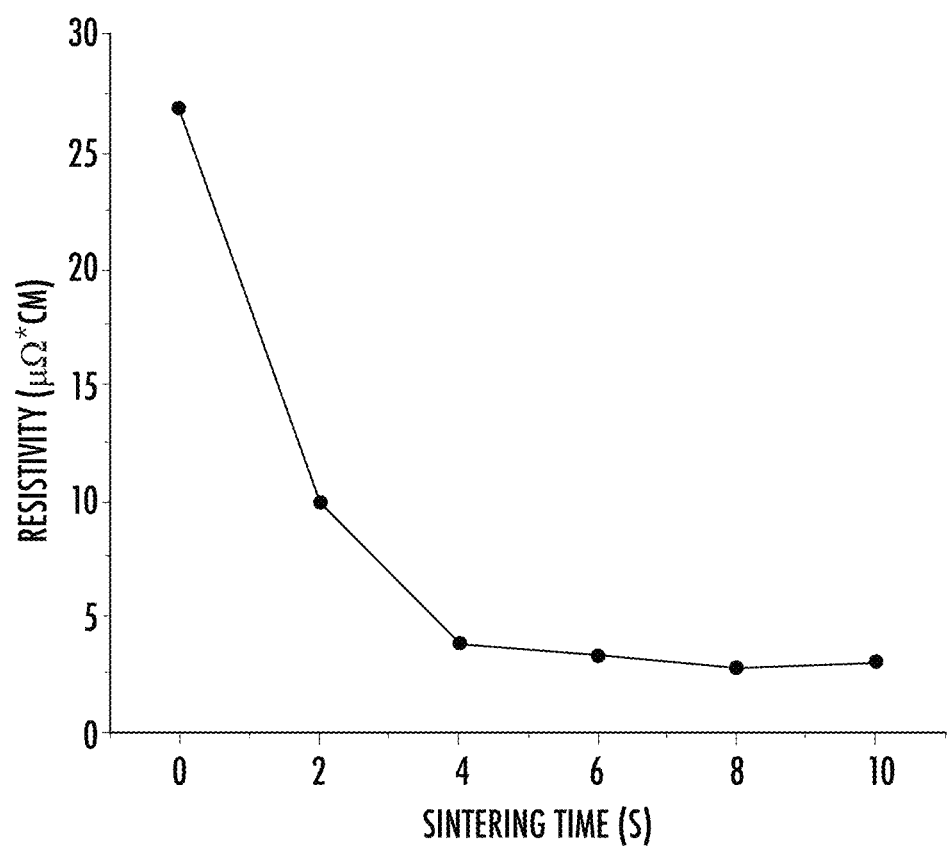
FIG. 2B illustrates the change in electrical resistivity of the nano-particles as a function of laser heating and time, in accordance with some embodiments discussed herein.

As the shape of the nano-particles change to fill the internal voids, the resistivity of the bond decreases (e.g., conductivity increases). FIG. 2B is a chart illustrating the change in the resistivity of the nano-particles as laser sintering time increases (e.g., progress from 139a-139c of FIG. 2A). Although a low resistivity is necessary for successful electrical connections, a mechanical bond between the nano-particles occurs before the nano-particles are fully sintered and, thus, full sintering is not necessary.

Figure 3:
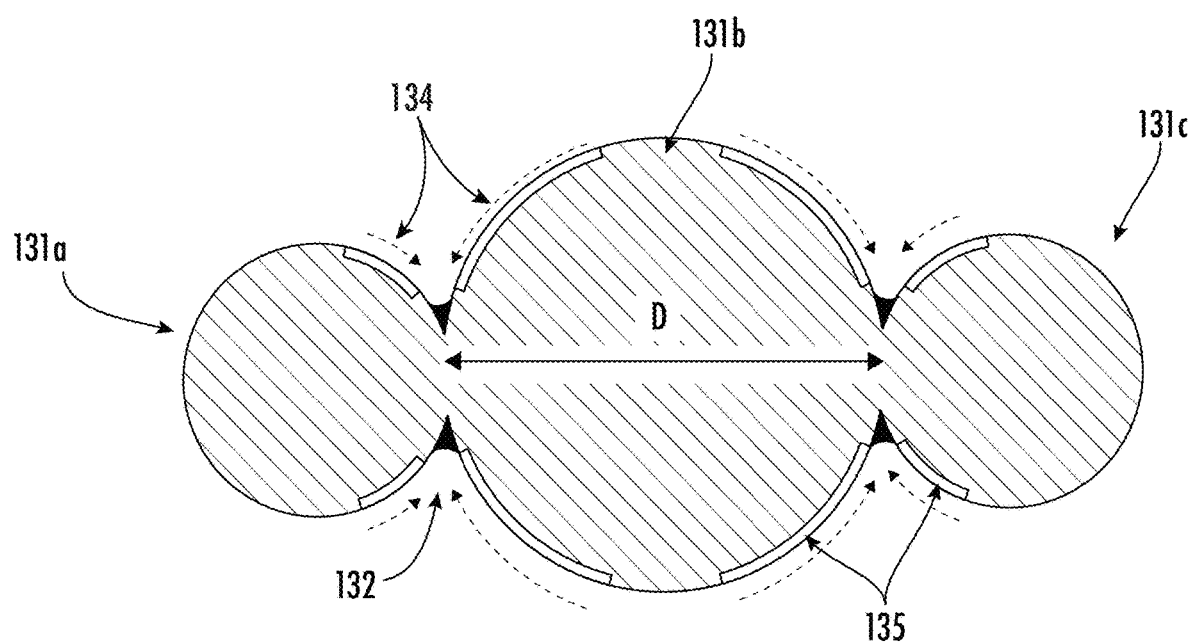
FIG. 3 illustrates surface diffusion of atoms on nano-particles to neck regions where adjacent nano-particles contact each other, in accordance with some embodiments discussed herein.

As discussed above, the overall shape of nano-particles does not change after initial heating, however, as heating continues the shape of the nano-particles begins to change until full sintering occurs. FIG. 3 illustrates three nano-particles 131a, 131b, 131c, after initial heating. As the nano-particles are heated at a relatively low temperature, the atoms on the surface of the nano-particles become mobile and start to rearrange to minimize surface energy, driving surface diffusion of atoms 134 to the narrow neck regions 132. As the atoms collect in the neck regions 132, the total surface area is reduced. Further, other surface locations 135 on the nano-particles experience a depletion of surface atoms, but internal atoms remain trapped in the nano-particle's crystal lattice. As the neck regions 132 grow during initial heating, the distance D across the nano-particles does not change significantly. As a result, the network of nano-particles does not shrink significantly.

In this regard, a thin layer of nano-particles may be used for kinematic alignment, where the precision external geometry of the optical components is used to establish alignment. In some embodiments, a nano-particle layer may be deposited on components in extremely thin layers, for example, 0.1 um, such that the nano-particle presence between optical components does not introduce mechanical misalignment of components. In some embodiments, the extremely thin layer may be less than 1 um, less than 0.5 um, or less than 0.2 um thick.

Similarly, thick layers of nano-particles may be suitable for applications where active alignment of optical components is required. A thick layer of nano-particles may be greater than 10 um, greater than 20 um, greater than 50 um, or greater than 100 um in thickness. A thick nano-particle layer may span a gap between two optical components, and then deform to accommodate the relative motion of one optical component to another during active alignment. Once the two optical components are properly aligned, initial laser heating (or other suitable sintering method) joins the nano-particles without introducing significant shrinkage. The nano-particles may serve as a temporary or permanent bond to hold the optical components in alignment. Although optical components are discussed with reference to alignment, other substrates are considered.

Nano-particles such as nano-silver, and nano-copper are suitable for bonding to glass substrates, metal, and metalized substrates and components. In some embodiments, optical fibers and glass substrates may be metalized (e.g., by traditional metal evaporation or sputtering processes) to enhance joining and increase joint shear strength as compared to nano-particle joints directly on glass substrates.

In some embodiments, during subsequent optical components assembly, a layer of nano-particles may be applied on one or more optical components that have been previously metalized using either traditional metallization or sintered nano-particle coatings. The second layer of nano-particles may provide a bond between the optical components, and enhance joining to the metallization layer.

Various techniques may be used to prepare and deposit a layer of nano-particles onto a substrate. In some embodiments, the nano-particles are suspended in a medium (e.g., a paste) and applied to selected regions of the substrate through stencil openings in a screen printing screen, enabling thin (e.g., the thickness of the screen) or thick (e.g., 5-100 um) layers.

In some embodiments, the nano-particles may be suspended in solvent-based slurries. The slurries may then be printed onto the substrate via ink jet printing, enabling thin films (e.g., 0.1-5 um) over localized regions with small dimensions (e.g., 20-50 um). Ink jet printing may allow the layer of nano-particles to be printed precisely at any location on the substrate (e.g., the region where the optical fiber will be placed in contact with the substrate). In some embodiments, prior to sintering, the solvent may be evaporated by exposure to vacuum and/or moderate oven temperatures (e.g., 60-90° C.).

In some embodiments, the nano-particles may be suspended in a slurry or ink, and applied through transfer printing to selected locations of a drum or print pad, wherein the drum or print pad is subsequently applied to the surface of the substrate to transfer the ink or slurry.

In some embodiments, the nano-particles may be suspended in a liquid solvent and sprayed over a substrate surface using an aerosol sprayer or air brush. In some embodiments, the spray may be masked to only apply nano-particles to select surfaces of the substrate.

In some embodiments, the nano-particles may be suspended in a slurry, and the slurry may be applied over a substrate using doctor blade deposition techniques. Although application methods have been discussed herein, other application methods are contemplated.

In some embodiments, the medium may include filler material. The filler material may be a low-expansion filler material to reduce the coefficient of thermal expansion (CTE) mismatch between the nano-particles and the substrate (e.g., glass, silicon). Once the medium is partially removed via a thermal process, the filler material remains. The CTE of exposed nano-particles and filler material layer may be heavily influenced by the CTE of the filler material, thereby reducing the CTE mismatch between the layer (e.g., exposed nano-particles and filler material combination) and the substrates. The nano-particles may be bonded to materials with differing CTE's as the nano-particles are able to distort within a range defined by the size of interstitial voids of the filler material, as the nano-particles are sintered. The distortion of the nano-particles allows the difference between the CTE of the nano-particles and the CTE of the substrate to differ by more than 1 ppm/K, more than 2 ppm/K, more than 5 ppm/K, more than 10 ppm/K, or more than 20 ppm/K.

Figure 4B:
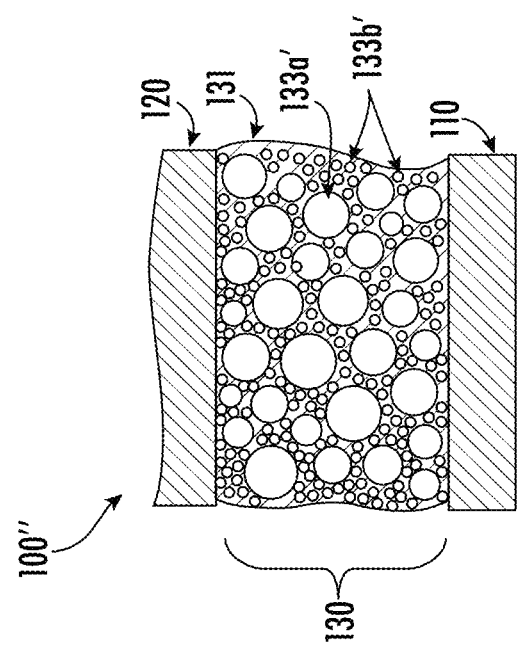
FIG. 4B illustrates a cross-section of a layer of nano-particles with a bi-modal distribution of low expansion filler particles, in accordance with some embodiments discussed herein.
Figure 4A:
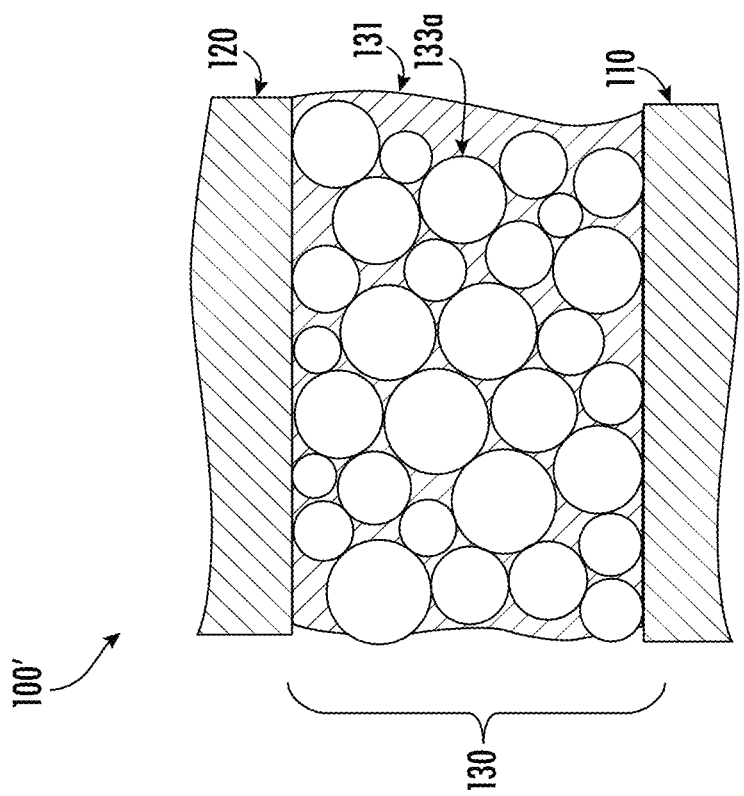
FIG. 4A illustrates a cross-section of a layer of nano-particles with a low expansion filler particle added, in accordance with some embodiments discussed herein.

Filler materials, having a much larger diameter than nano-particles, may make up a large portion of mechanical bond between substrates. FIG. 4A illustrates a cross-sectional view 100' of filler material 133a added into a layer of nano-particles 130. The nano-particles 131 as illustrated, are considerably smaller than the filler material 133a. As such, the nano-particles do not appear as discrete particles, as seen in other figures. The filler material 133a may be selected for its chemical properties, such as the ability to form strong bonds with the selected nano-particles during sintering. Example filler materials are silica, silicon carbide, or graphite powders. Fillers may also be negative CTE materials, such as LiAlSiO4 (β-eucryptite), Li2Al2SinO4+2n (β-spodumenes) and Mg2Al4Si5O18 (cordierite). In some embodiments, the filler material may be selected to enhance heating of neighboring nano-particles during sintering. For example, filler material may be selected because of its ability to absorb light at specific wave lengths, or ability to absorb microwave radiation.

The filler material may be selected so that the diameter of the filler material is smaller than the target thickness of the nano-particle layer. In some embodiments, the target thickness may be 4 times as thick as the filler material diameter. FIG. 4B illustrates a cross section 100" illustrating a filler material having a bimodal particle size distribution. A bimodal filler material may include a large filler material 133a' and a small filler material 133b'. In some embodiments, the mean diameter of the large filler material 133a' is about 7 times as large as the mean diameter of the small filler material 133b'. The large filler material and small filler material may be made of the same material, or two different materials, both having a low CTE.

Figure 4D:
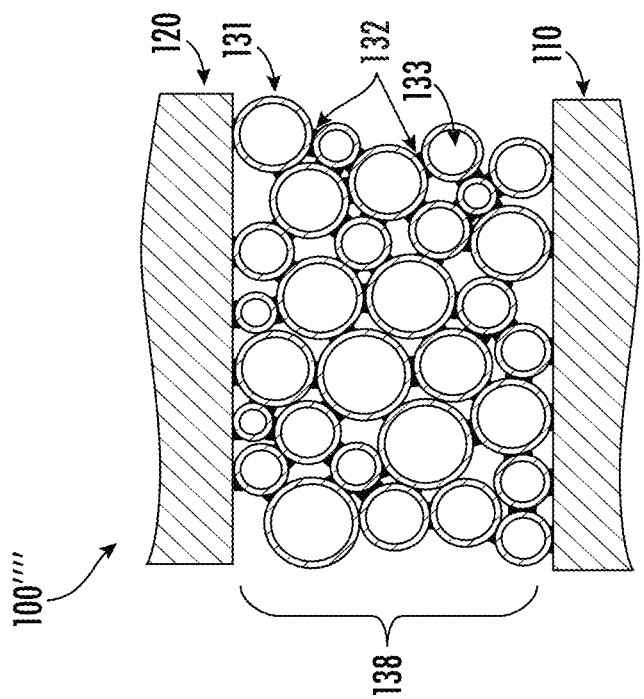
FIG. 4D illustrates a cross-section of a layer of filler particles coated with a thin layer of nano-particles, in accordance with some embodiments discussed herein.
Figure 4C:
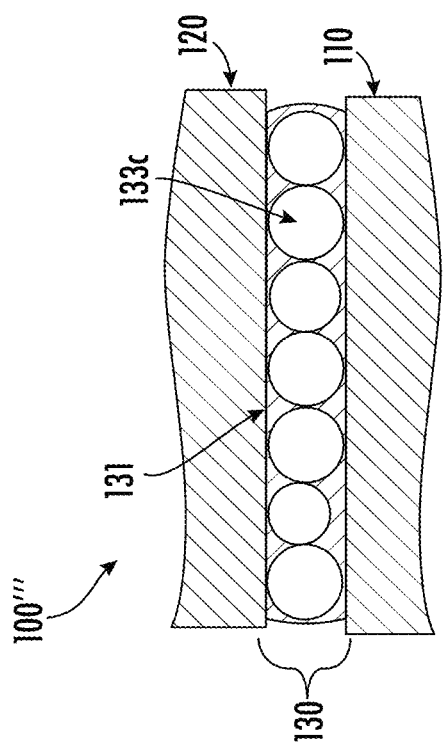
FIG. 4C illustrates a cross-section of a layer of nano-particles with a precision diameter filler particle, in accordance with some embodiments discussed herein.

Filler material may also be chosen with a precisely fabricated diameter to closely ensure the thickness of the mechanical bond between substrates. FIG. 4C illustrates a cross-sectional view 100''' of two substrates joined by a layer of nano-particles 130 including a precision filler material 133c. In some embodiment the precision filler material 133c may be used as a thickness spacer for a thin layer of nano-particles 130. In some embodiments, the precision filler material 133c is nano-particle material fabricated with a precise diameter.

In some embodiments, the amount of nano-particles used may be reduced by coating filler material with nano-particles. With reference to the cross-sectional view 100'''' illustrated in FIG. 4D, nano-particle coatings may be applied on the surface of filler material 133 using a spray drying process or another chemical process that promotes nano-particle layer formation on filler material via, for example, pH modification and/or electrostatic attraction. The joining layer 138 of nano-particle coated filler material 133 may minimize the amount of nano-particle material needed, which may reduce production costs. Further, since the size of the filler material 133 does not change (i.e., shrink) during heating, the thickness of the joining layer 138 may be more precise.

As discussed herein, heating nano-particles may be accomplished through different mechanisms. Some mechanical bonds only need to be heated in specific locations. Laser heating may be used to sinter nano-particles at localized locations. For example, a focused laser beam may sinter nano-particles located directly under an optical fiber, while not heating a neighboring nano-particle joint that has already been laser sintered. Laser heating may provide precise control over heating temperature by adjusting laser power, and pulse duration. The focal spot of the laser and time/power profile of the laser may be adjusted to minimize thermal gradients in glass components, minimizing built in stresses that may lead to long term failures.

In some embodiments, there may be nano-particles in multiple locations to be heated simultaneously. Radio Frequency (RF) and microwave heating may be used to join multiple optical components at multiple locations at the same time. For example, fibers in a fiber array may be simultaneously bonded to a common glass substrate in a single operation.

In some embodiments, Joule heating may be used for localized heating of nano-particles, such as illustrated in the cross-sectional view 100'''''' of FIG. 5A. The layer of nano-particles 130 may be applied on an electrode 151 on the first substrate 110. When current flows through the electrode 151, the nano-particles 131 therein are heated and join together at contact points to engage in particle necking at the neck regions 132. Joule heating may, for example, be utilized in embodiments where other heating methods (i.e., laser, RF, microwave) cannot penetrate to the location of the nano-particle layer.

In some embodiments, a heater electrode may also be provided on the top substrate. Having heaters on both surfaces may improve heating and potentially speed the sintering process. As the mediums are generally poor conductors, it may be hard to run a current through the nano-particle medium from a top electrode to a bottom electrode to enable Joule heating of the nano-particle layer. Therefore, in some embodiments, the nano-particle layer may be printed so that it spans the gap between two adjacent traces or pads on the same substrate.

In some embodiments, a reflow oven may be used to heat the nano-particle layer. A commercial reflow oven may be used to sinter nano-particle layers. When using a reflow oven, the substrates (e.g., the optical fibers) may be held in position, such as via clamping fixtures, clips or similar means.

The methods of heating discussed above may allow the nano-particles to fuse together at contact points of adjacent nano-particles. Heating the nano-particles until partial sintering occurs provides low shrinkage and a lower strength bond compared to fully sintering which provides moderate shrinkage and a high strength bond.

Although partial sintering, as discussed herein, provides a low shrinkage bond, the bond does not have as high of shear strength as a fully sintered bond. In some embodiments, an adhesive may be added after the nano-particles are partially sintered to provide a low shrinkage and high strength bond. FIG. 5B shows a layer of partially sintered nano-particles 130 filled with an adhesive 170. When nano-particles 131 are initially joined, interstitial voids between the nano-particles 131 are connected to one another, forming an open porous network throughout the joining layer of nano-particles 130. As such, the shear strength of the bond may be lower than desired. In some embodiments, to increase the shear strength, an adhesive may be used to backfill the interstitial voids. Although, as discussed above, adhesives have a tendency to shrink in volume as they cure, when an adhesive is applied about a joined nano-particle layer, the nano-particle layer resists the shrinkage of the adhesive, resulting in a stronger bond with shape retention. In some embodiments, the adhesive may be a low viscosity thermal cure adhesive, such as Epo-tek 353ND.

Figure 6B:
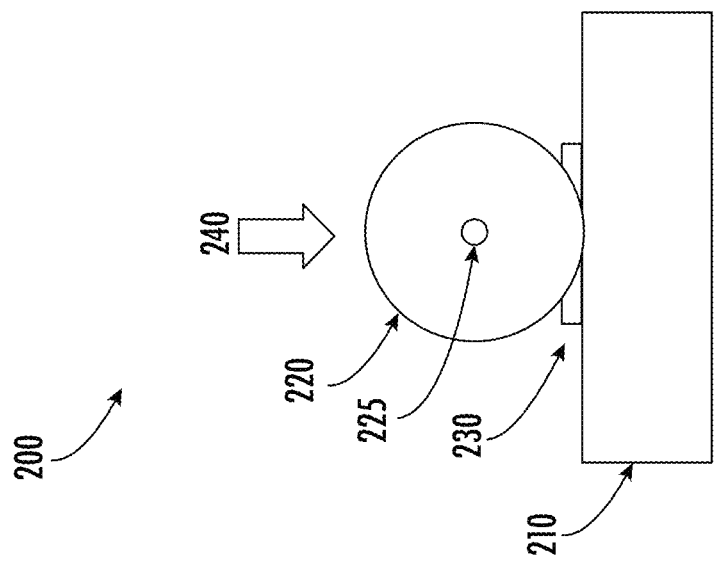
FIG. 6A-6D illustrate various steps of an example fusion between two substrates using nano-particles, in accordance with some embodiments discussed herein.
Figure 6A:
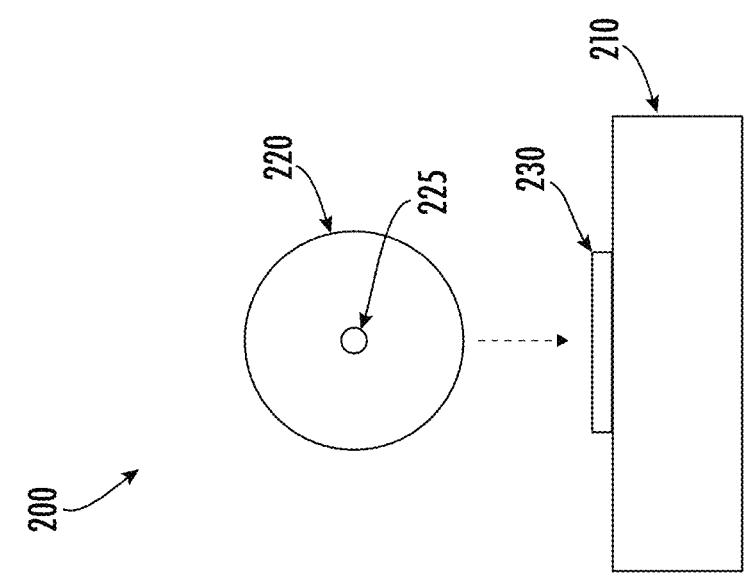

FIGS. 6A-D illustrate an example assembly 200 of substrates joined together using nano-particle joining as discussed above. FIG. 6A shows an assembly 200 having a layer of nano-particles, e.g. "nano-particle layer 230" applied to a first substrate 210. Before application with one of the methods as discussed above (e.g., ink or laser printing), the nano-particles are prepared as discussed above (e.g., suspended in a medium). In some embodiments, the layer of nano-particles on substrate 210 may then be exposed to a thermal process (e.g., an oven) to reduce the medium and expose the nano-particles, such that the nano-particles are in contact with each other and the first substrate 210 providing a more rigid layer of nano-particles.

Once the nano-particles are prepared, the second substrate 220 (e.g., a fiber including a core 225) may be added. The prepared nano-particles (e.g., nano-particles suspended in a medium which is exposed to a thermal process) may provide a rigid layer for the second substrate 220 to be aligned on, such that the rigid layer of nano-particles is not displaced during application. FIG. 6B illustrates a second substrate 220 lowered from its initial position onto the nano-particle layer 230 into alignment with the first substrate 210. In other example embodiments, as the second substrate 220 is lowered onto the first substrate 210 it contacts the layer of nano-particles on substrate 210. If the layer of nano-particles on substrate 210 was not previously exposed to a thermal process, the nano-particle layer 230 may be laterally displaced, forming a narrow gap between the second substrate 220 and the first substrate 210 in the region that neighbors the contact point of the substrates. The nano-particle layer 230 consists of particles much smaller than 1 um in diameter (e.g., 30-70 nm). Therefore, any remaining particles trapped in the gap between the first substrate 210 and the second substrate 220 do not introduce an unwanted vertical shift, offsetting the second substrate 220, such as upon full sintering.

Figure 6D:
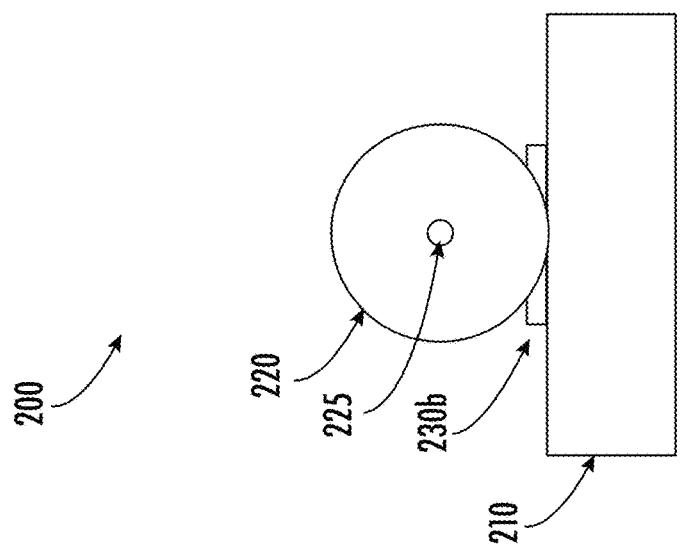
Figure 6C:
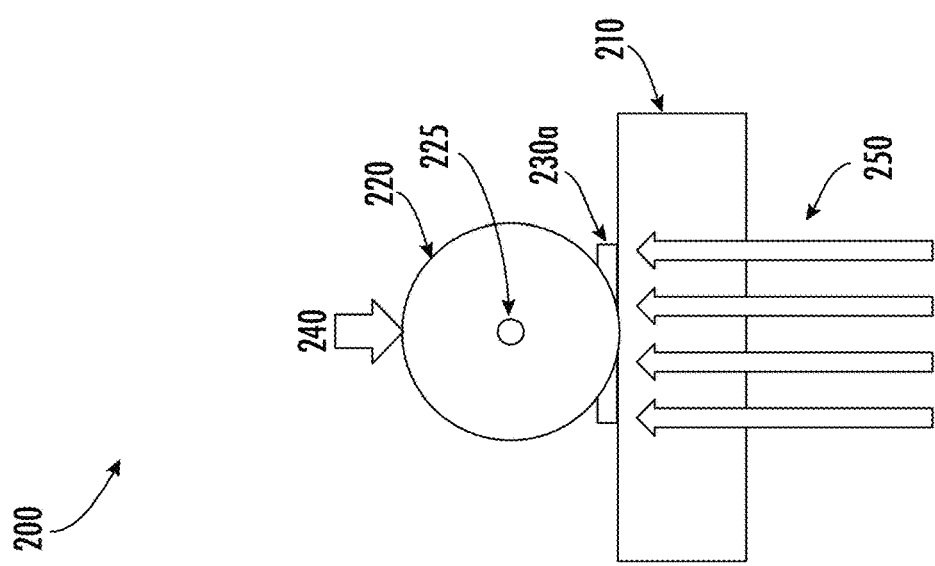

After application of the second substrate 220, pressure may be used to keep it in place while the nano-parties are heated. FIG. 6C shows that as a downward force 240 is applied to the second substrate 220 (holding it in contact with the glass substrate 210), a laser light 250 is directed at the nano-particle layer 230a to cause the nano-particles to fuse together, as discussed above. The laser light 250 may be directed onto the nano-particle layer 230 from above the second substrate 220 or below the first substrate 210. In some embodiments, the laser light 250 heats the nano-particle layer 230 up to 200° C. for a few seconds (e.g., 1-5 seconds). In some embodiments, the nano-particles may be heated between 150° C.-300° C., 175° C.-275° C., or 150° C.-250° C. In some embodiments, the laser may heat the layer of nano-particles for up to 10 seconds, up to 5 seconds, up to 3 seconds, up to 2 seconds, or up to 1 second.

After partial sintering, the first substrate 210 and the second substrate 220 are mechanically joined by the fused nano-particles. FIG. 6D illustrates the assembly 200 with the first substrate 210 and the second substrate 220 joined via the partially sintered nano-particle layer 230b. Although, not shown, in some embodiments, the layer of nano-particles may include a filler material and/or an adhesive may be applied about the sintered layer of nano-particles.

In some embodiments, after the first substrate 210 and second substrate 220 are joined by the nano-particle layer, the substrates may remain precisely aligned after solder reflow, or environmental testing. In some embodiments, the alignment of the first and second substrate may change less than 0.5 um, less than 0.2 um, less than 0.1 um, or less than 0.05 um upon introducing the assembly 200 to a solder reflow oven.

Figure 7A:
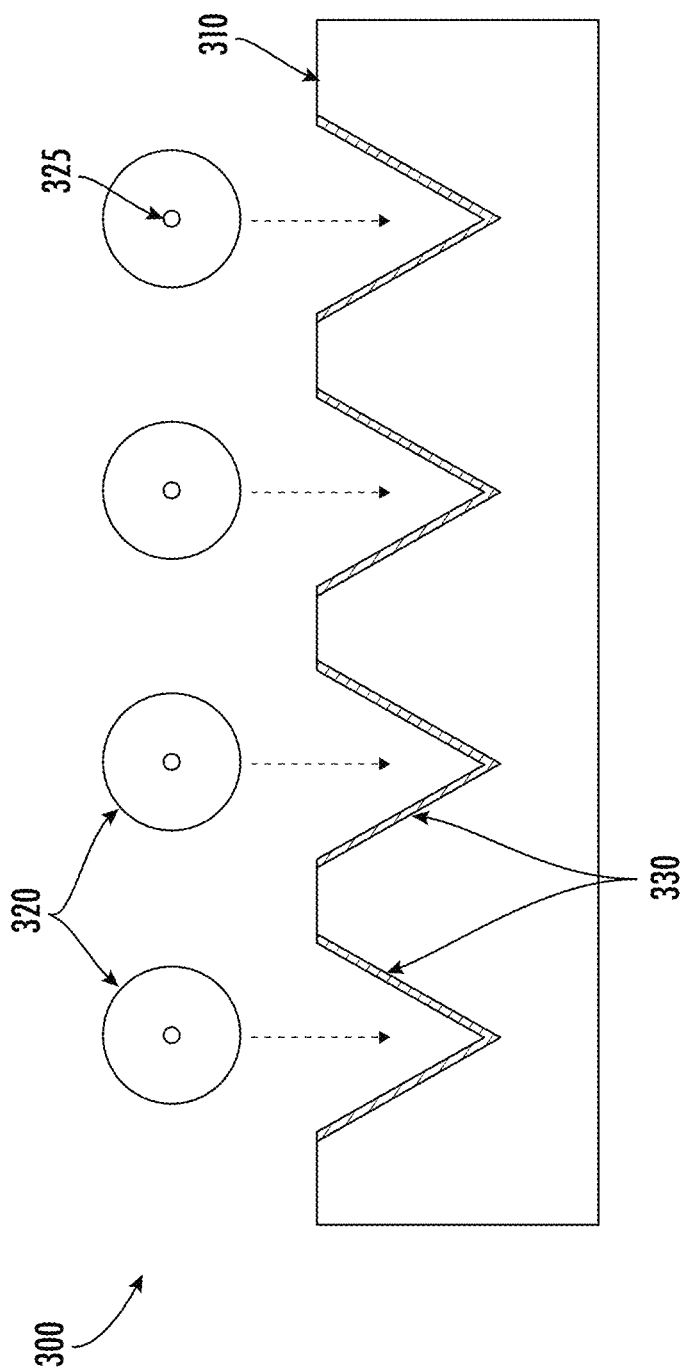

In some embodiments, fibers may be attached to a V-grooved substrate to create a V-grooved fiber array unit (FAU). FIG. 7A illustrates an example first step in the assembly of a fiber array unit 300. A thin layer of nano-particles 330 (e.g. <1 um thick) is prepared, (e.g., suspended in a medium) and applied to each sidewall of the V-groove substrate 310. In some embodiments, the V-grooved substrate may be a V-groove chip. The layer of nano-particles 330 is exposed to a thermal process to reduce the medium and facilitate contact between adjacent nano-particles. An array of optical fibers 320 is aligned over the V-grooves and lowered onto the layer of nano-particles 330. The V-grooves of the substrate 310 may be fabricated with a precise pitch, such that when the array of fibers 320 are attached to the V-grooves of the substrate 310 the cores 325 of the array of fibers 320 are aligned with precise pitch.

Figure 7B:
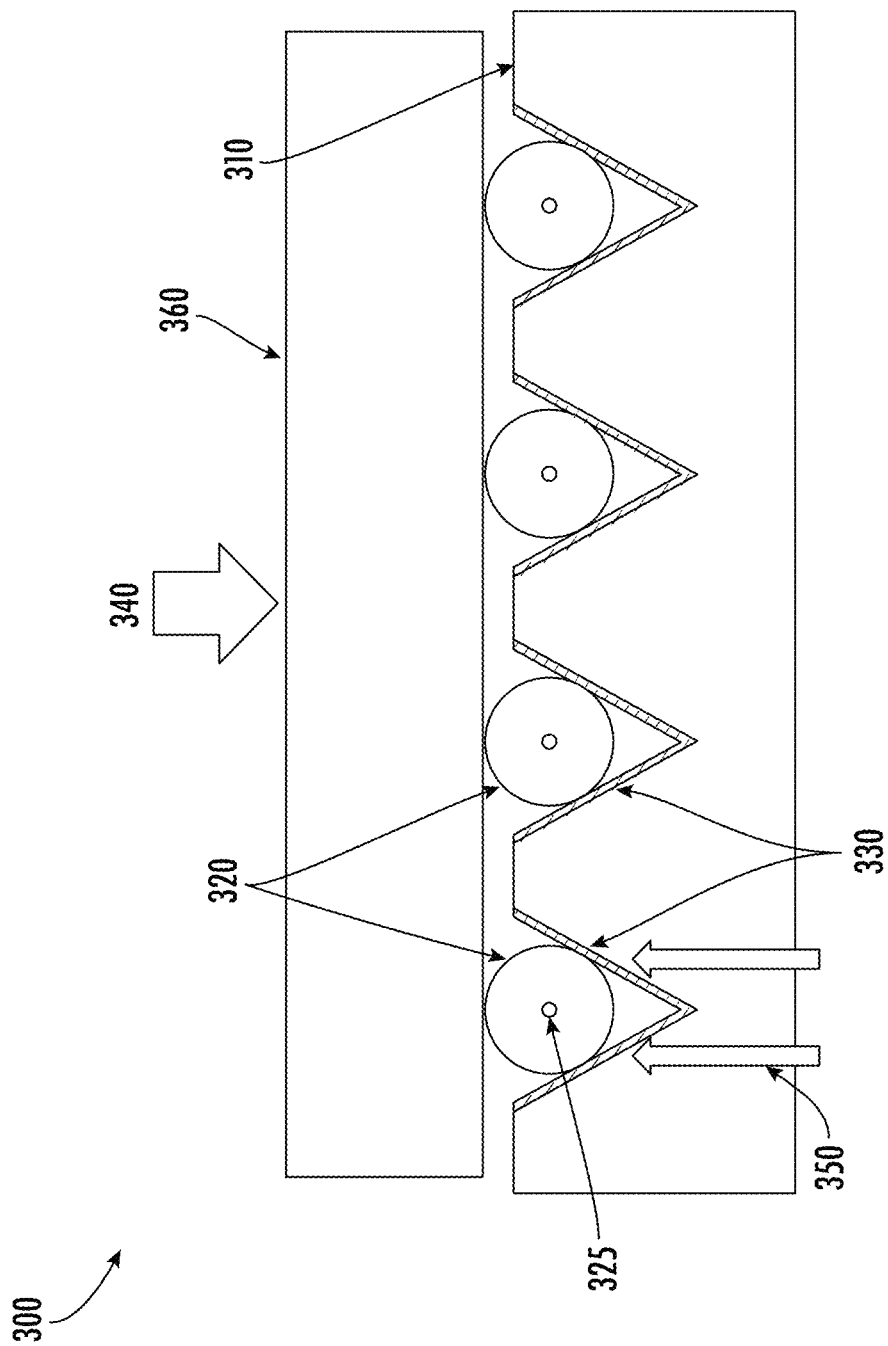

Once the fibers are aligned in the V-grooves, pressure may be applied to ensure that when the fibers are fused, they are aligned with the precise pitch. FIG. 7B shows a pressure substrate 360 positioned over the fiber array 320. The pressure substrate 360 applies force 340 to the fiber array 320 to push the fiber array down into contact with the V-grooves of the substrate 310. While the force is applied, the layer of nano-particles 330 is heated using one of the heating methods described above, such as laser heating 350. Although laser heating is shown passing through the V-groove substrate 310, the laser heating may also be directed down through the fiber array 320 from the top, or through the pressure substrate 360. In some embodiments, the beam direction, shape, and focus location may need to be adjusted to enable localized heating where the optical fiber 320 contacts the nano-particle coated V-groove sidewall. In embodiments utilizing laser heating, the substrate may be optically transparent at the laser wavelength, such as at 800 nm or 1064 nm. FIG. 7C illustrates the FAU 300 with the fiber array 320 bonded to the V-groove substrate 310 by a layer of fused nano-particles 330. An adhesive may also be applied over optical fibers 320 and/or under the optical fibers 320 in V-grooves of the substrate 310.

Figure 7D:
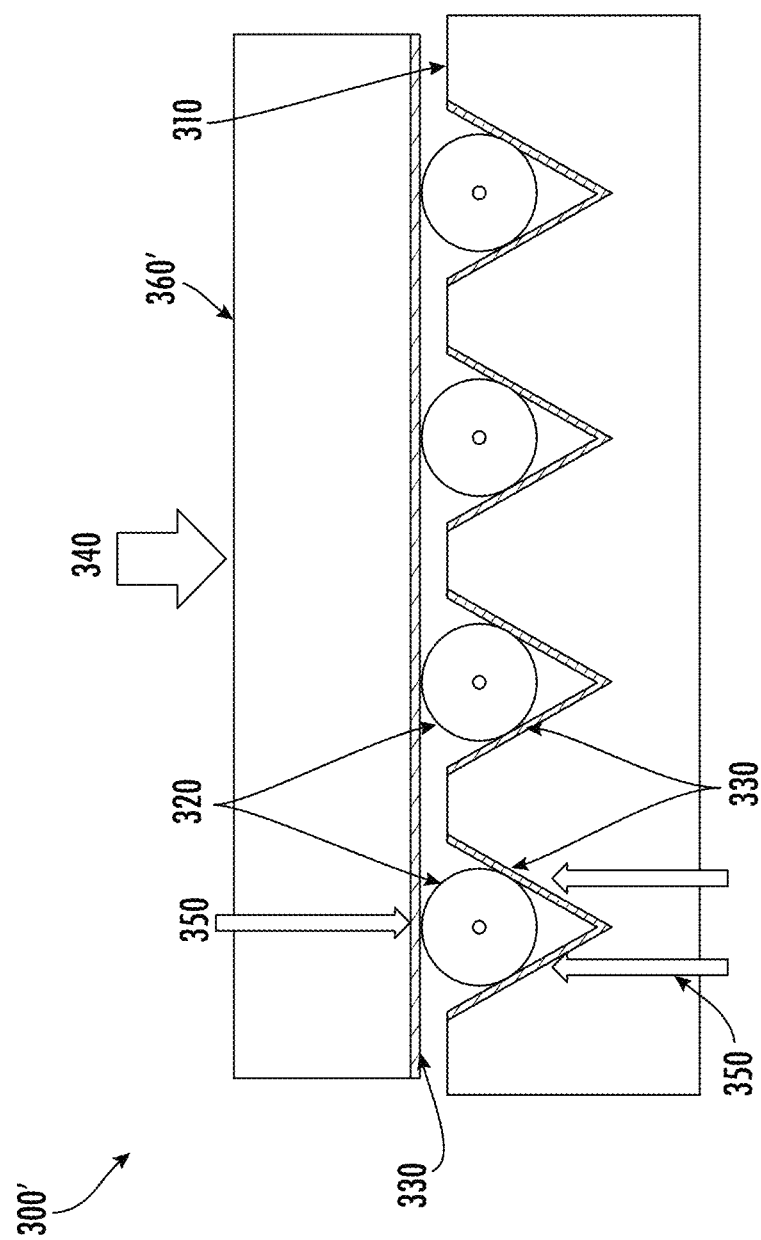

A lid or cover may be added to the V-groove FAU to provide protection and stabilization for the fibers. FIG. 7D illustrates a lidded fiber array unit 300'. In some embodiments the pressure substrate, may be a glass lid 360'. A bottom surface of the lid 360' may be coated with a second layer of nano-particles 330. While the glass lid presses on the fiber array 320, laser heating may be directed towards multiple points, for example, where the fiber array contacts the V-grooved substrate 310, and where the fiber array contacts the lid 360'. As described above, laser heating may be directed from a single side (either the top or the bottom) if the nano-particle layer is only applied to selective areas of the lid and/or the V-grooved sidewalls. In embodiments where the layer of nano-particles is not across the entire surface (e.g., the nano-particles are only in locations where the fiber array will contact) the laser energy may pass through the uncoated portions of the assembly, such that the energy reaches both layers of nano-particles (e.g., on the lid and within the V-groove sidewalls).

After the FAU is manufactured, an adhesive may be added to increase the strength of the bonds. In some embodiments, the cavities between the lid 360' and the V-groove substrate 310 may be filled with an adhesive. The adhesive may be UV curable or thermally curable, an organic adhesive, or an inorganic adhesive. The adhesive is preferably selected to have a lower elastic modulus, to limit the upward force on the fiber array during heating, or a low-expansion filler material may be added to reduce the CTE of the joint to better align with the CTE of the surrounding glass V-groove materials. The adhesive may have a low viscosity (e.g., ~1 cP) to allow the adhesive to flow into small cavities within the FAU via capillary force.

Although the materials herein have been described as being a glass substrate, a fiber array, and a glass lid, it should be understood that any appropriate substrates may be used. For example, the substrates may be silicon based, metallic, or ceramic materials.

Figure 8A:
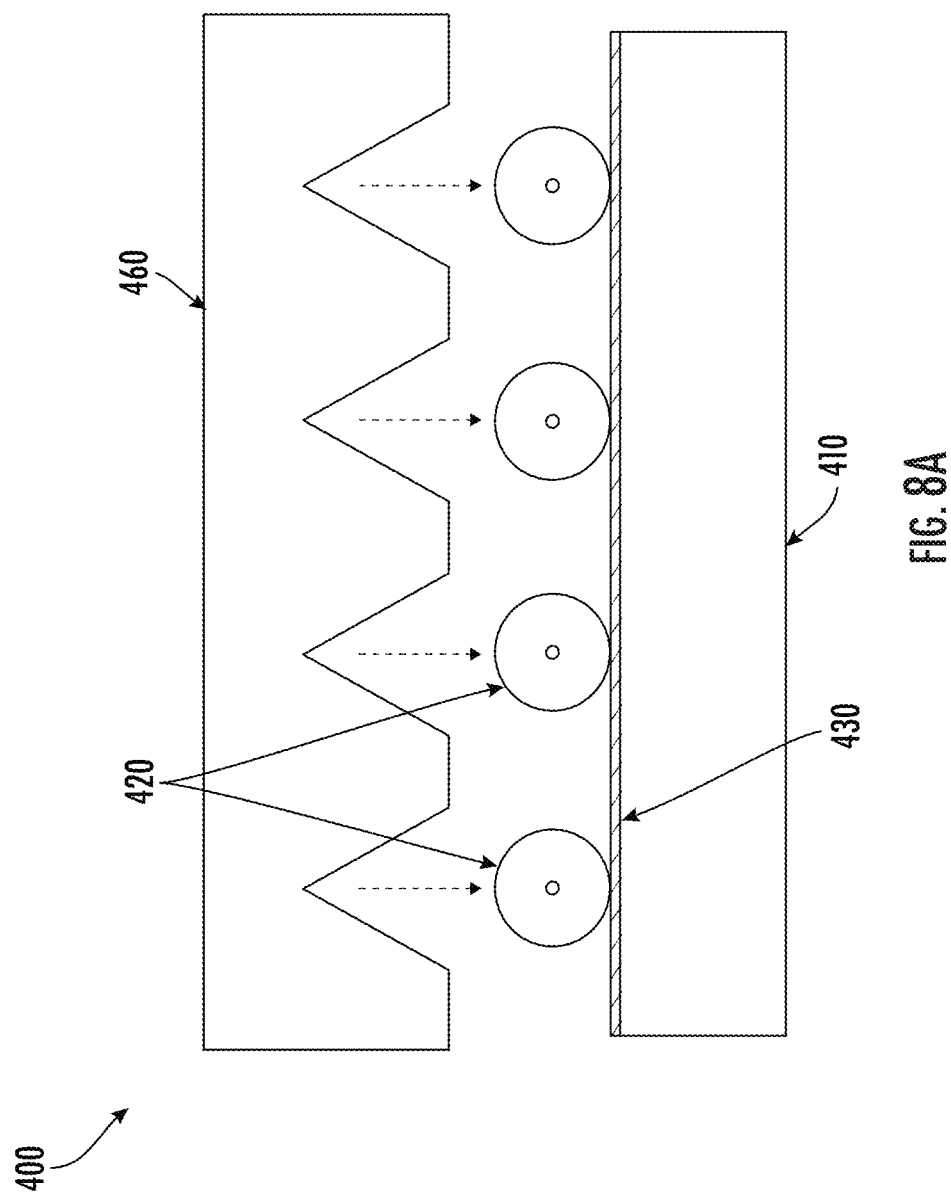
FIGS. 8A-8B illustrate a V-grove substrate used to align two substrates for joining via nano-particles, in accordance with some embodiments discussed herein.
Figure 8B:
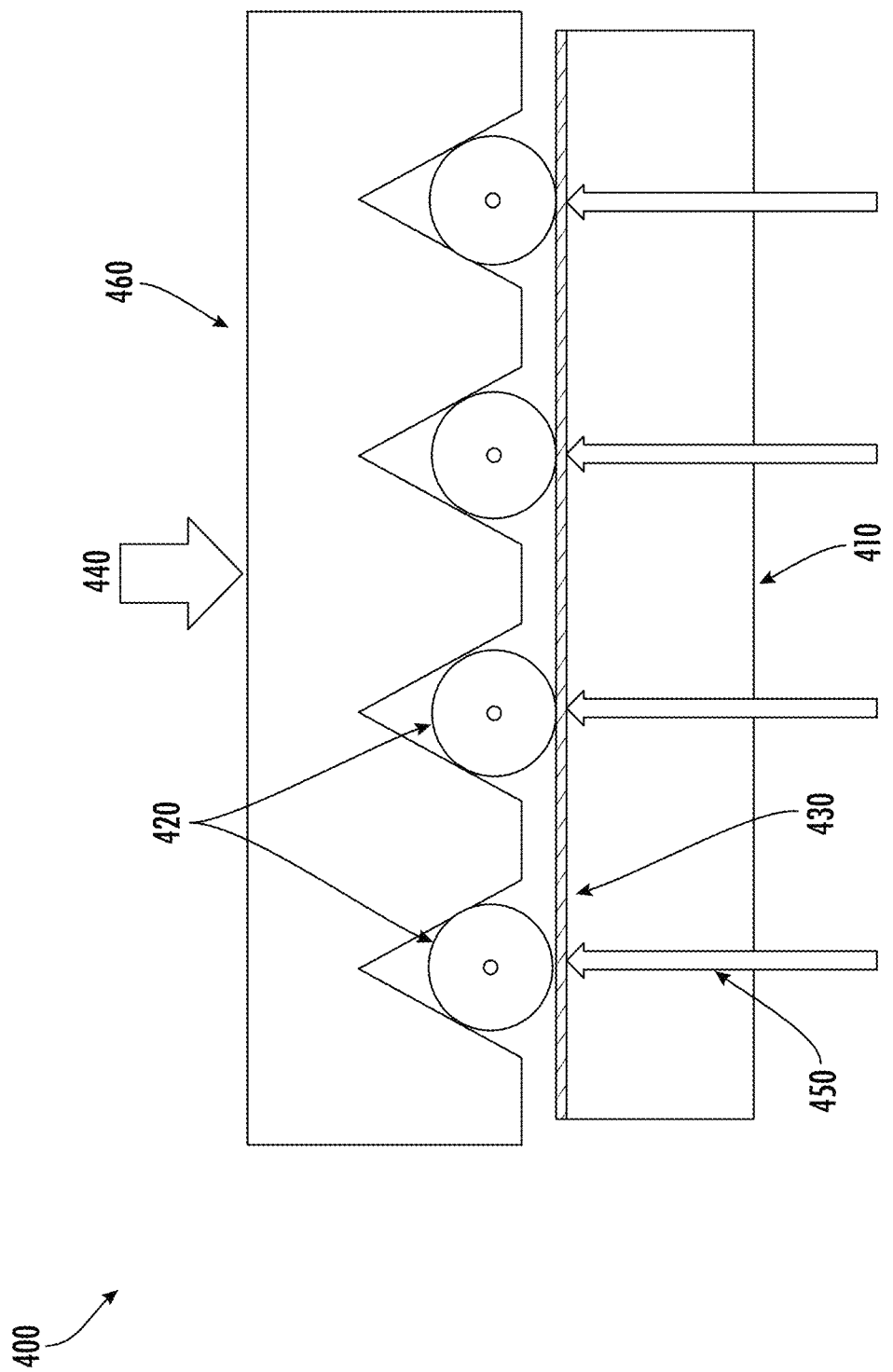

Nano-particle joining may be used to attach a fiber to a flat substrate such that the fibers are spaced apart from one another (e.g., in a desired alignment). In some embodiments where a substrate with a circular cross-section (e.g., a fiber) is attached to a flat surface, the substrates may be aligned using an alignment substrate, to facilitate precision attachment. FIGS. 8A-8B illustrate example process steps for fiber attachment to a flat substrate, specifically V-groove alignment of an array of fibers to a glass substrate. FIG. 8A illustrates a first step in alignment and attachment of optical fibers 420 onto a base substrate 410. The nano-particles are prepared and deposited on a layer of nano-particles 430 on the base substrate 410 using one of the deposition processes discussed above, and exposed to a first thermal process. In some embodiments, as illustrated in FIG. 8A, the layer of nano-particles 430 may be applied across the entirety of the base substrate 410, while in other embodiments, the layer of nano-particles may be deposited only in the regions where the optical fibers contact the base substrate. Notably, such local deposits may enable sintering processes that are localized to specific regions, such as microwave heating, or bulk illumination where strong optical absorption only occurs in regions coated with nano-particles.

The alignment structure may also provide a downward force to facilitate contact between the substrates before sintering the nano-particles. Referring to FIG. 8B, an alignment structure 460 may be positioned over the optical fibers 420 and lowered until the alignment structure 460 contacts the optical fibers 420 and applies a downward force 440. A heating process 450, (i.e., laser heating) is applied to each of the optical fibers 420 to sinter the layer of nano-particles 430—effectively joining the optical fibers 420 and the base substrate 410. After the optical fibers 420 are joined to the base substrate 410, the alignment structure 460 may be removed.

Figure 9:
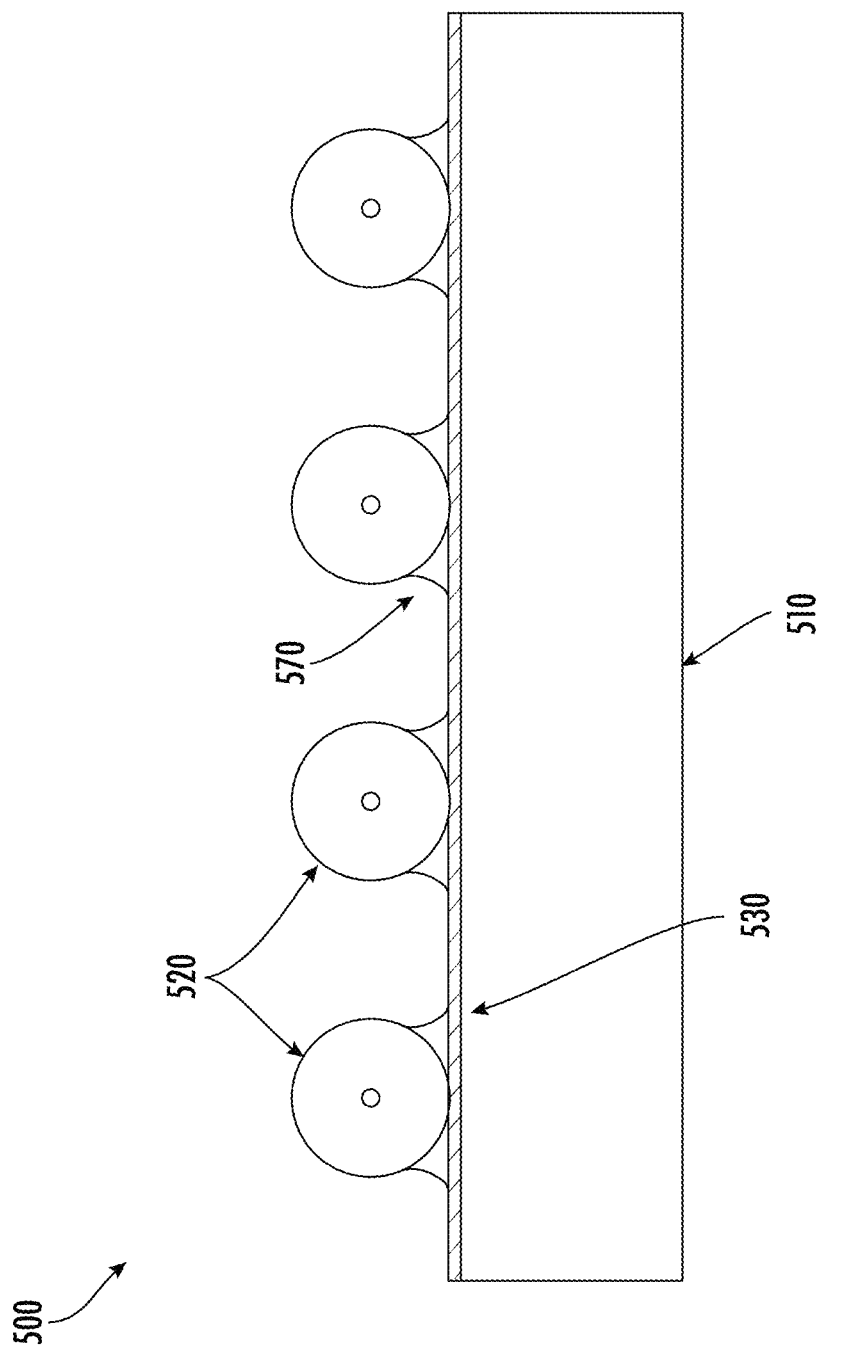
FIG. 9 illustrates a cross-sectional view of substrates joined using nano-particles with an adhesive applied to the region where the substrates are in contact, in accordance with some embodiments discussed herein.

An adhesive may be applied about the sintered nano-particle to increase the strength of the bond. FIG. 9 shows a fiber array 500 resulting from the process described with reference to FIGS. 8A-8B. The fiber array 500 includes an adhesive 570 about the contact location of optical fiber 520 and the base substrate 510. In some embodiments, the adhesive may be an organic adhesive (e.g., UV curable adhesive), or an inorganic adhesive (e.g., sodium silicate).

Figure 10A:
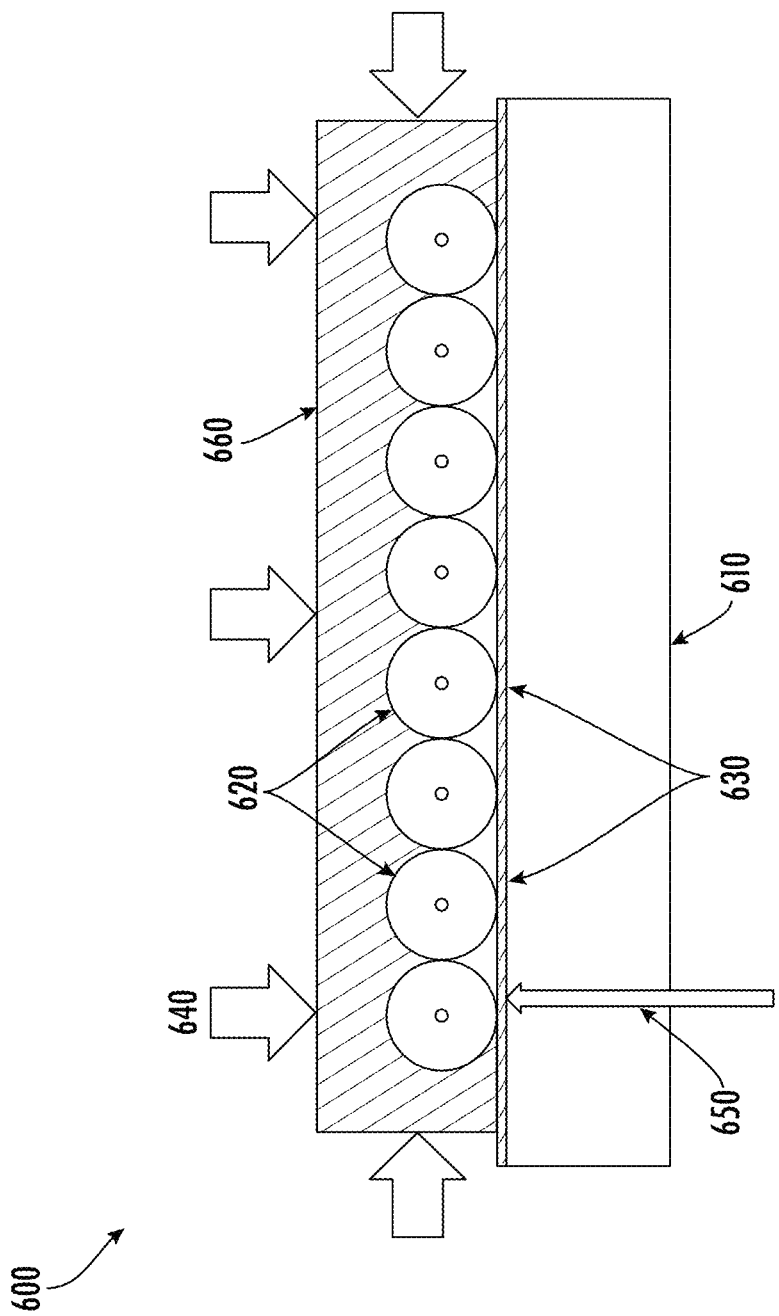

Nano-particle joining may be used to attach a fiber to a flat substrate such that the fibers are abutting one another. FIGS. 10A-10B illustrate an example embodiment of a squeeze alignment mechanism. FIG. 10A shows a base substrate 610 with a thin layer of prepared nano-particles 630 applied. Multiple optical fibers 620 (e.g., fibers in a fiber array) are applied to the layer of nano-particles 630, such that the optical fibers 620 are in contact with the layer of nano-particles 630, and the other optical fibers 620. A squeeze pad 660 may be used to hold the optical fibers 620 in alignment on the base substrate 610, and in alignment with the other optical fibers 620. Additionally, the squeeze pad 660 may provide force 640 on the optical fibers 620, pressing the optical fibers 620 onto the base substrate 610, and towards adjacent optical fibers 620. While the squeeze pad 660 is in place, each of the optical fibers 620 is joined to the base substrate 610 by heating the layer of nano-particles 630 (e.g., laser heating from below). In some embodiments, a layer of nano-particles 630 may be applied about the optical fibers 620, to join each of the optical fibers together. FIG. 10B illustrates the fiber array 600 after the base substrate 610 and the optical fibers 620 are joined by the layer of fused nano-particles 630, and the squeeze pad 660 is removed.

Figure 11B:
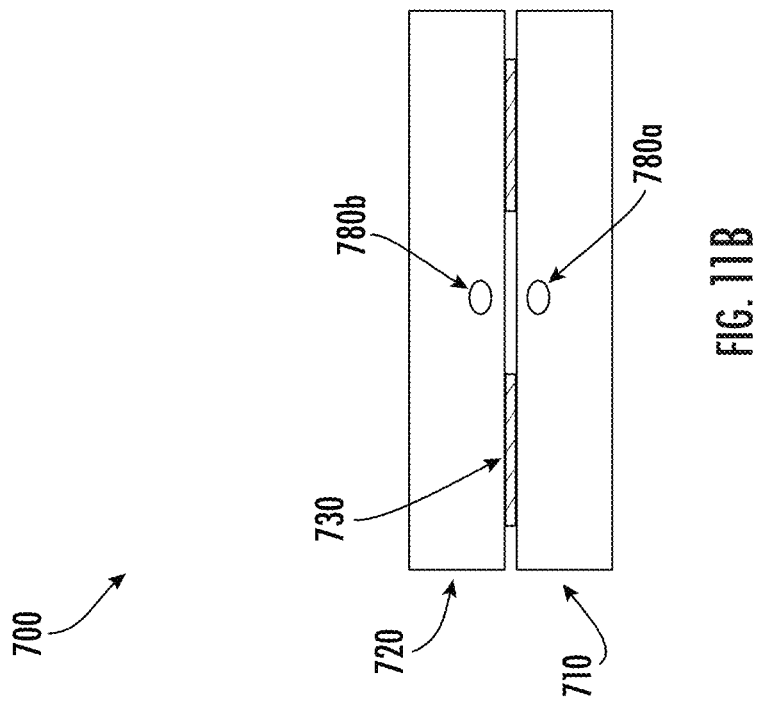
FIGS. 11A-11B illustrate a cross-sectional view of joining of two substrates for evanescent coupling, in accordance with some embodiments discussed herein.
Figure 11A:
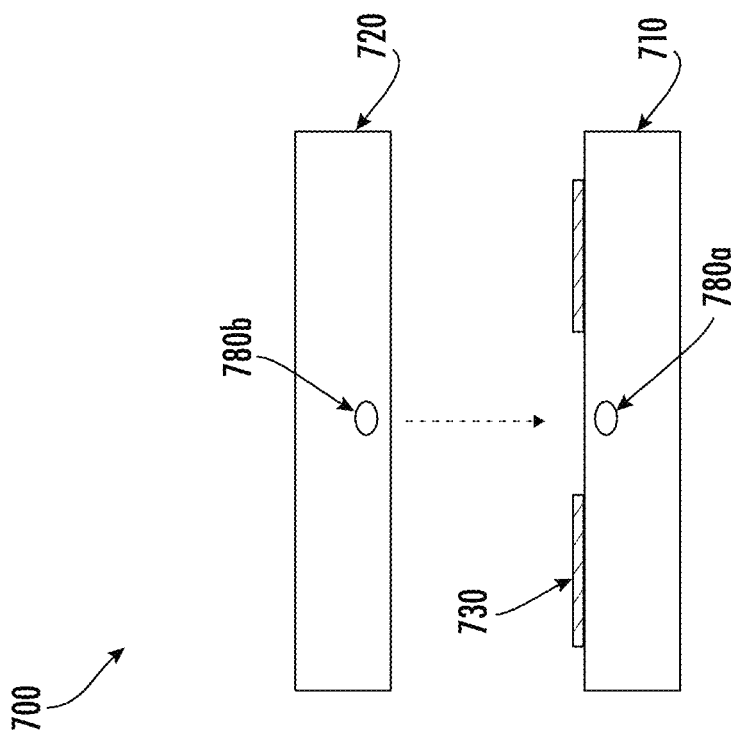

The nano-particle joining process as described herein may also be applied to attach two flat substrates. FIGS. 11A-11B illustrate a joining process that results in evanescent coupling between planar waveguides. A first planar light wave circuit (PLC) 710 has a thin (e.g., 0.1-0.5 um thick) discontinuous layer of prepared nano-particles 730 applied to the top surface wherein a gap in the layer of nano-particles allows evanescent coupling and alignment of the waveguides 780a, 780b. A second PLC substrate 720 is laterally and angularly aligned so the ion exchange waveguide 780b of the second PLC substrate 720 overlaps the ion exchange waveguide 780a (planar waveguide) of the first PLC substrate 710. After waveguide alignment, the layer of nano-particles 730 is heated, for example with laser heating, such that the first PLC substrate 710 and the second PLC substrate 720 are bonded together as illustrated in FIG. 11B. In some embodiments, the interface between the first PLC substrate 710 and the second PLC substrate 720 may be filled with an index matching adhesive. The adhesive may be chosen due to properties that improve coupling between the waveguides 780a, 780b.

The FAU's as described above may be coupled with a PLC substrate including a planar waveguide to provide a strong mechanical connection, with a low profile. FIGS. 12A-12F illustrate joining a V-groove substrate (shown from the side), designed for end face coupling, to PLC waveguides.

Figure 12B:
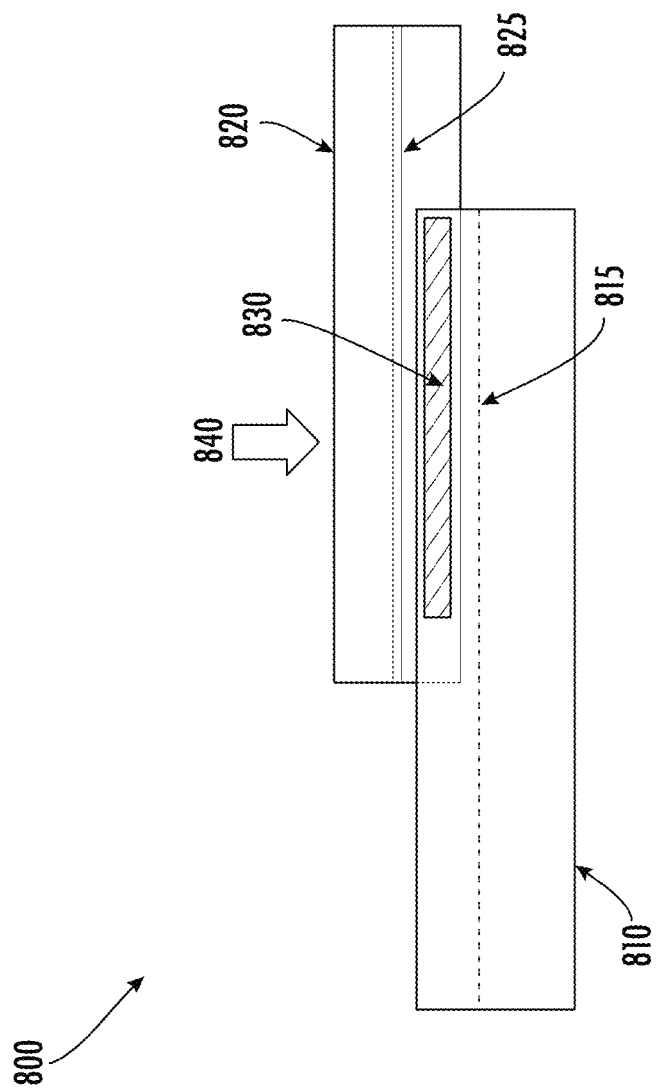

An FAU may be made according to the methods as discussed above with reference to FIG. 7. FIG. 12A illustrates an explanatory side view, of the first step of making a waveguide with a V-grooved fiber array unit (e.g., the FAU 300 of FIG. 7). A layer of prepared nano-particles 830 is applied to the V-groove side walls of the V-groove substrate 810 (e.g., the V-grooves of FIG. 7A). Alternatively, the layer of nano-particles 830 may be applied on the surface of the optical fiber 820. The bottom 815 of the V-groove is illustrated as a dotted line. An optical fiber 820 is aligned over the V-groove of the substrate 810. FIG. 12B illustrates a side view of FIG. 7C, wherein the optical fiber 820 is placed in the V-groove of the substrate 810, and a force 840 is applied to the optical fiber 820 while the layer of nano-particles 830 is heated, for example, by laser heating.

Figure 12C:
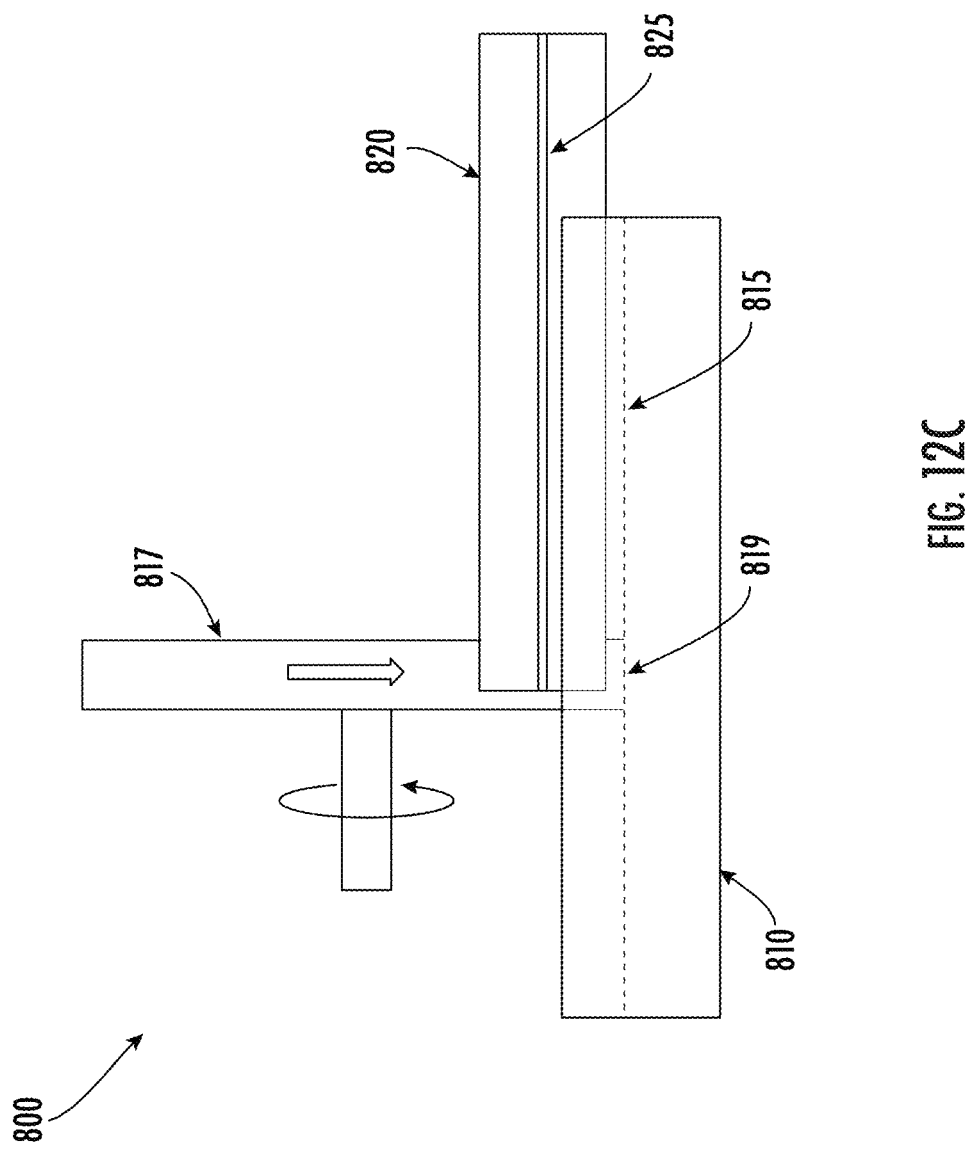
Figure 12D:
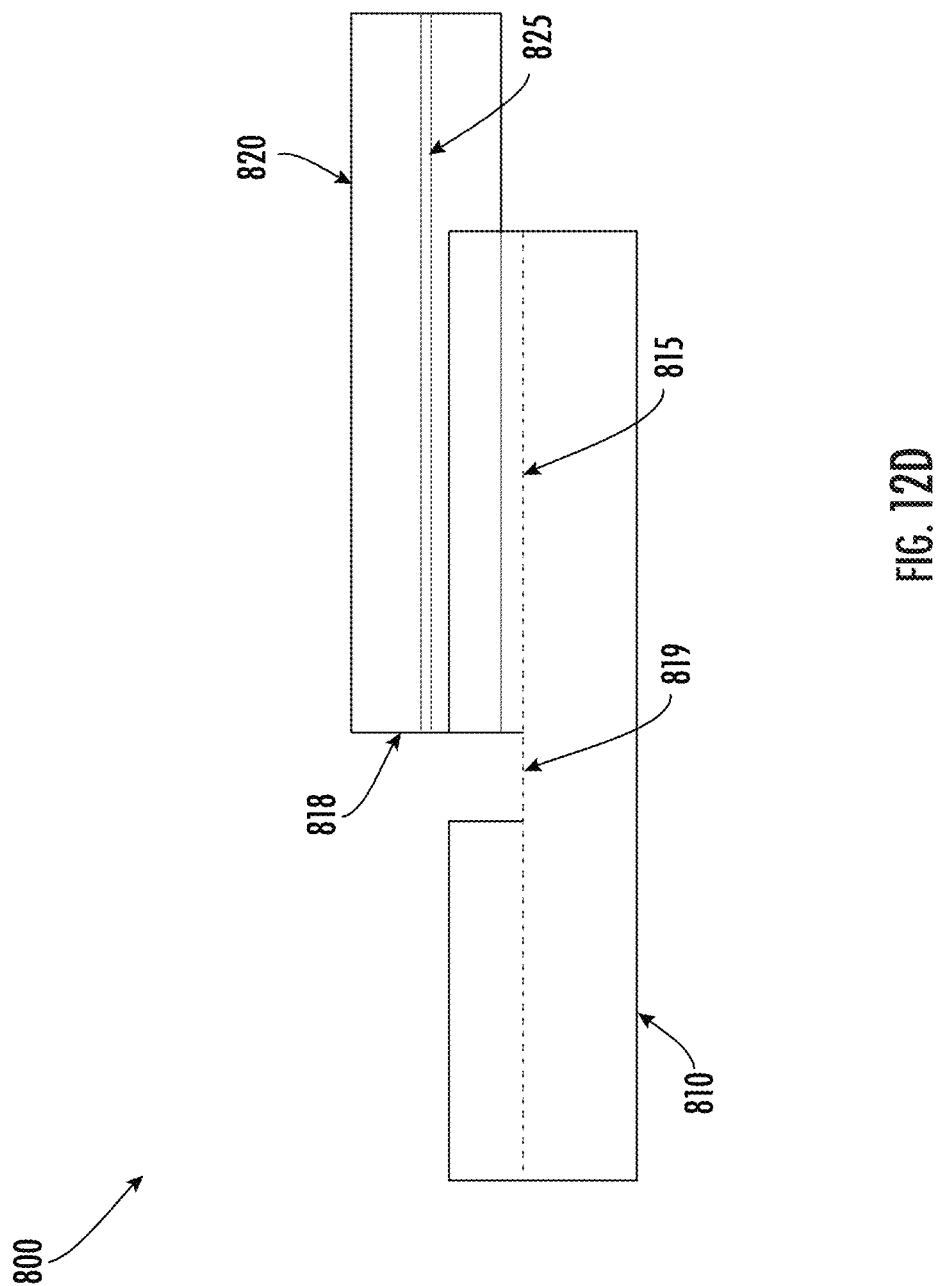

The ends of the fibers attached to the substrate may not be the same length. In order to create precision alignment, the fibers may be cut to all be the same length. Accordingly, in some embodiments, the V-groove substrate may include notches where the ends were cut. FIG. 12C shows a side view of a saw 817 (e.g., a dicing saw) sawing the ends of optical fibers 820, so that the optical fibers 820 are all the same length. The saw 817 may create a shallow notch 819 in the V-grove substrate 810. FIG. 12D illustrates the sawed ends 818 of optical fibers 820 and sawed notch 819 which are ready to be coupled to a PLC waveguide for low losses. In some embodiments, the optical fibers 820 may be cleaved prior to insertion into the V-grooves using, for example, a laser cleaving process.

Figure 12E:
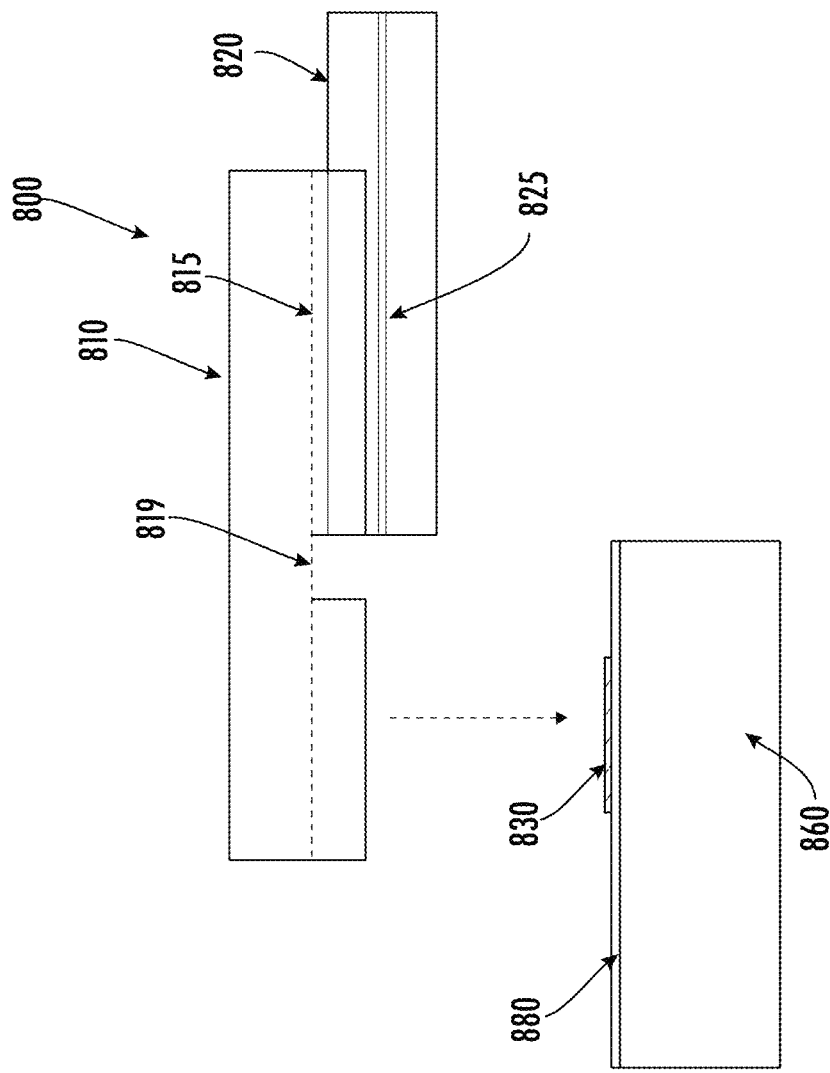

Once the fibers are all the same length, the FAU is oriented for application to a waveguide. FIG. 12E illustrates a side view of the V-grooved based FAU 800 prior to attachment with a PLC substrate 860. The FAU 800 of FIG. 12D is rotated 180 degrees (e.g., turned upside down). A layer of nano-particles 830 is placed on the PLC substrate 860. In some embodiments, the layer of prepared nano-particles may be deposited on the surface of the V-grooved substrate 810 facing the PLC substrate 860. In some embodiments, the layer of nano-particle 830 may be deposited on the PLC substrate 860 such that the nano-particles 830 are not directly over the planar waveguide 880, as a way to minimize optical scattering losses out of the planar waveguide 880.

After the FAU and PLC substrate are aligned, the nano-particles may be bonded. FIG. 12F illustrates a side view of the V-grooved FAU 800 placed and aligned on the PLC substrate 860 such that the PLC planar waveguide 880 is aligned with the core 825 of the optical fiber 820. Once the waveguide 880 and core 825 are laterally and rotationally aligned, the layer of nano-particles 830 is heated, for example, using laser heating, to join the PLC substrate 860 and the V-grooved based FAU 800 together.

In some embodiments, lateral alignment of the V-grooved based FAU 800 and the PLC substrate 860 planar waveguide 880 may use passive alignment features on the PLC substrate 860. For example, raised lateral stops may be photo-lithographically patterned into the PLC substrate at a precise distance away from the planar waveguide. Lateral alignment may also be accomplished using a vision system, wherein Vernier marks or groups of parallel lines made on slightly different pitches on the PLC substrate surface and the V-groove FAU surface may be used to precisely align the two components prior to nano-particle joining, for example, by laser heating or sintering.

In another example embodiment, a FAU configured on a flat substrate (e.g., the assembly 400 of FIG. 8 or 600 of FIG. 10) may be interconnected to a PLC planar waveguide. FIGS. 13A-13G illustrate a side view of the process of making an FAU and using the FAU to interconnect a PLC planar waveguide.

Figure 13A:
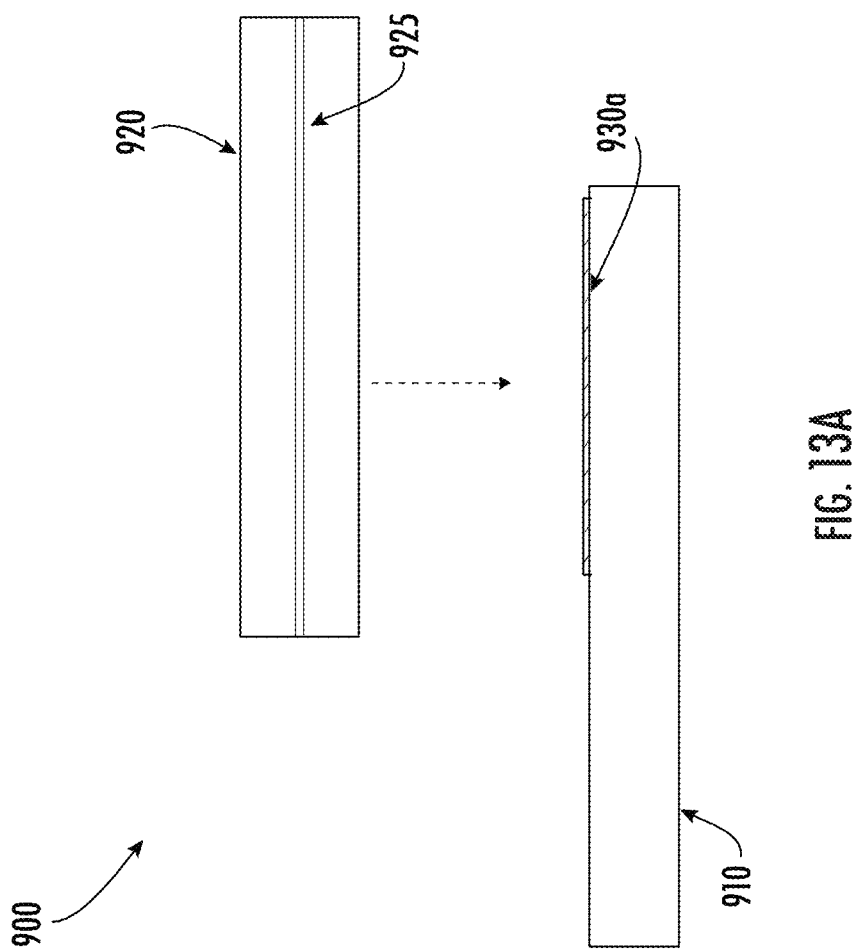
Figure 13B:
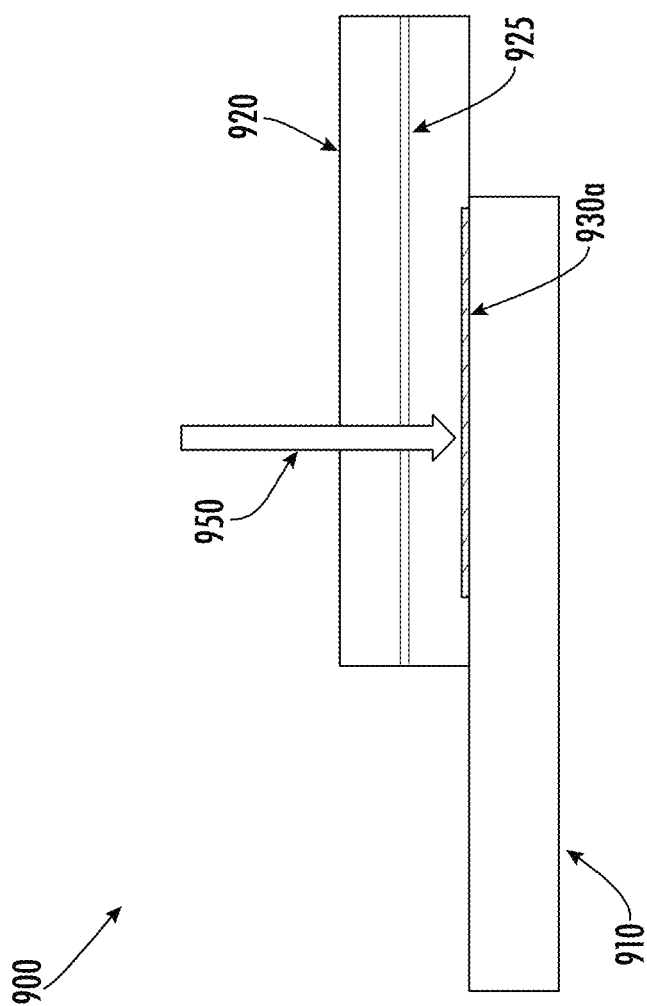

A FAU on a flat substrate may be made, for example, in accordance with the assembly of FIG. 8A-B, 9, or 10A-B. FIG. 13A illustrates a side view of an array of optical fibers 920 having a core 925 aligned with a layer of prepared nano-particles 930a on a base substrate 910. The optical fibers 920 may be positioned such that the fiber end faces are positioned over roughly the middle of the base substrate 910. The optical fibers 920 are pressed down on the layer of nano-particles 930a (e.g., using either a V-groove alignment substrate (e.g., 460 of FIG. 8) or a squeeze pad (e.g., 660 of FIG. 10)) and heating via, for example, laser beam 950 joins the optical fibers 920 to the base substrate 910. FIG. 13B illustrates the resulting fiber array unit 900.

Figure 13C:
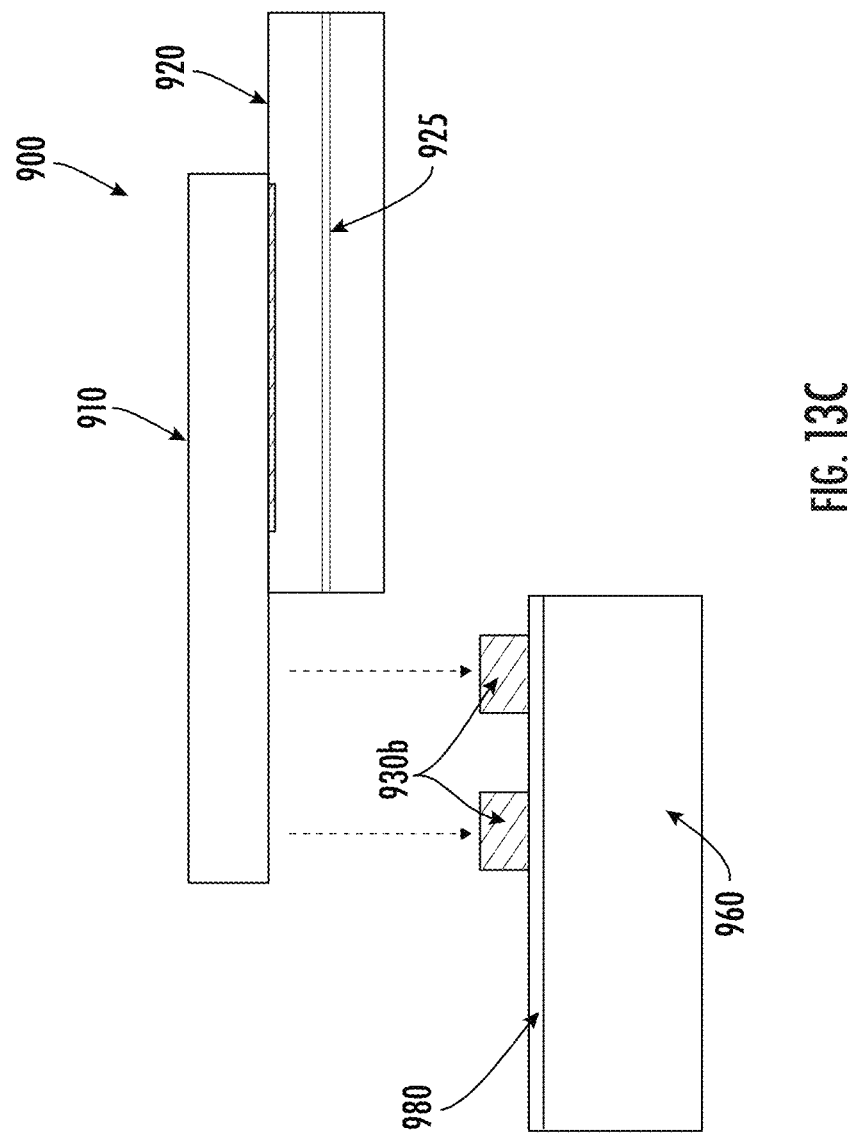

After assembly of the FAU, the FAU is orientated for joining with a PLC. FIG. 13C illustrates the first step in forming the FAU-PLC substrate bond. The FAU 900 is rotated 180° (e.g., turned upside down) and aligned with the PLC substrate 960. A thick (e.g., 5-100 um) layer of nano-particles 930b is applied to the PLC substrate 960 with a method as described as above, for example, with a doctor blade. The FAU 900 is lowered into contact with the thick layer of nano-particles 930b. In some embodiments, the thick layer of nano-particles may be greater than 10 um, greater than 20 um, greater than 50 um, or greater than 100 um thick. The layer of nano-particles may flow and deform slightly, such that the FAU optical fiber core 925 may be actively aligned, laterally and rotatably, with the planar waveguide 980 of the PLC substrate 960.

Figure 13D:
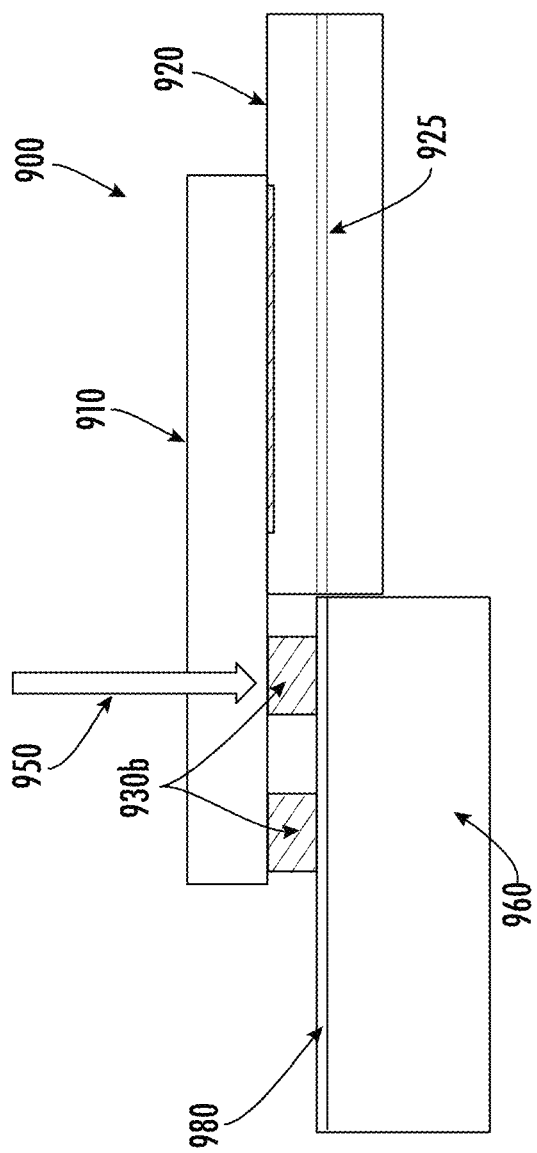

After alignment of the FAU and PLC the nano-particles may be joined. FIG. 13D illustrates heating the layer of nano-particles 930b, once the core 925 and the waveguide 980 are aligned, for example, with laser heating, causing the nano-particles to join together without significant reduction in dimension, as discussed above. The partial sintering of the layer of nano-particles joins the FAU 900 and the PLC substrate 960. The partially sintered thick layer of nano-particles 930b may accommodate a CTE mismatch with the PLC substrate 960 via small distortions of bonded nano-particles enabled by neighboring interstitial voids.

Figure 13E:
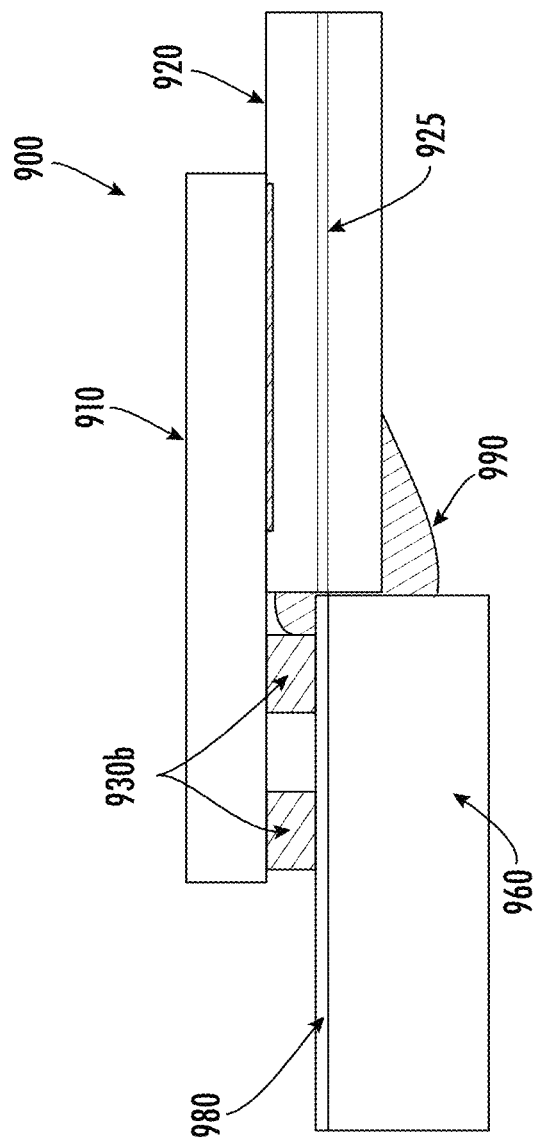

In some embodiments, as illustrated in FIG. 13E, an adhesive 990 may be added about the optical fiber 920 and the PLC substrate 960 to strengthen the bond. The adhesive may be a UV curable organic adhesive with an index to minimize back reflection at the optical fiber 920 end face. The adhesive 990 may also be applied to infiltrate voids in the layer of partially sintered nano-particles 930, as discussed above, to strengthen the nano-particle bond.

Figure 13G:
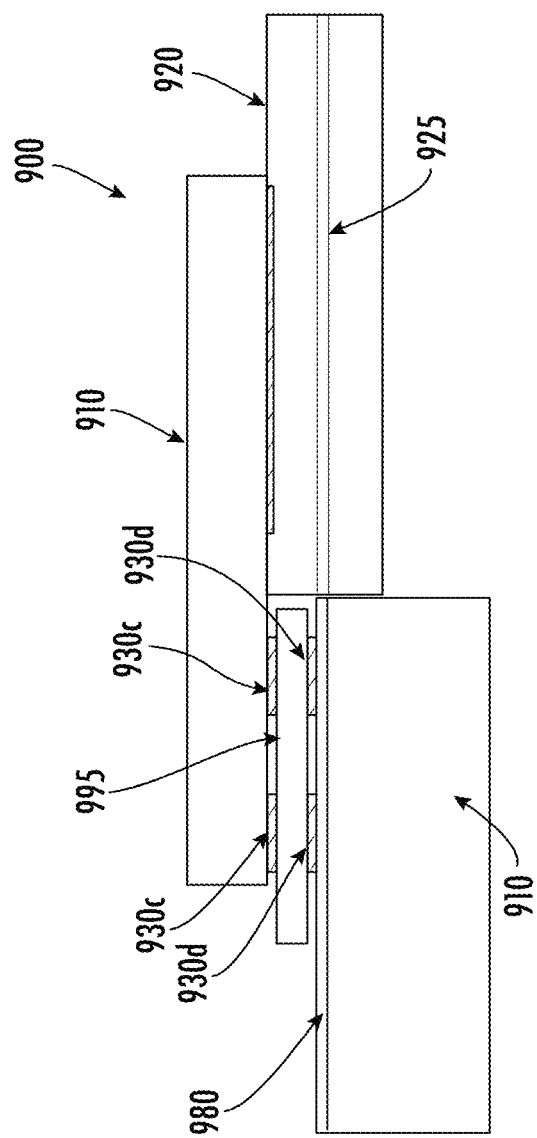

In addition to or in the alternative of a thick layer of nano-particles, a spacer substrate with precision thickness may be used. For example, as illustrated in FIG. 13F, a spacer substrate 995 may be used in addition to two thin layers of nano-particles 930d. A precision thickness glass spacer substrate 995 may be selected to displace the base substrate 910 from the PLC substrate 960, such that the core 925 of the optical fiber aligns with the planar waveguide 980 of the PLC substrate 960. In some embodiments, the spacer substrate 995 may be attached to the base substrate 910 with a thin layer of nano-particles 930c, and attached to the PLC substrate 960 with another thin layer of nano-particles 930d. Both of the thin layers of nano-particles are heated, for example, with laser heating, to encourage partial sintering of the nano-particles to join the FAU 900 and the PLC substrate 960, as illustrated in FIG. 13G.

In some embodiments, the precision thickness spacer substrate 995 may be formed using a glass fusion process, a precision redraw process, or a similar process for glass substrates. In some embodiments, the spacer substrate 995 may be pre-attached to the PLC substrate 960 with a layer of partially sintered nano-particles 930. The joining interface may survive solder reflow conditions, without distortion or creep. In this case, the final nano-particle layer may be sintered, for example, via laser heating, from the top side.

In some embodiments, the spacer substrate 995 may be a fiber array raft, or other similar appropriate passive alignment mechanisms.

Although, as described herein, partially sintered nano-particle layers are used to join photonic components, other applications which join materials which nano-particles may bond to, including glass, ceramics, metals, and polymers, alone or in combination, are contemplated. For example, joining of optical lenses and support components, joining of dielectric filters to glass support substrates in micro-optic WDM (Wavelength Division Multiplexing) assemblies, joining glass FAUs to PLC's where nano-particle materials are applied to one or both interfacing surfaces, and assembly of optical components that require arbitrary displacement and rotation, are contemplated.

Although the above examples describe use of a layer of nano-particles, as is consistent with description herein, such examples may utilize the various different forms of a layer of nano-particles (e.g., with filler material, where the layer of nano-particles is applied to filler material, etc.).

As discussed above nano-particles may be used to join various components. In addition to joining photonic components, nano-particles may be used to join cooling manifolds to electronic equipment, for example, semi-conductors, and other devices which generate heat, which needs to be dispersed to keep the electronic equipment functional.

Example Systems

Figure 14:
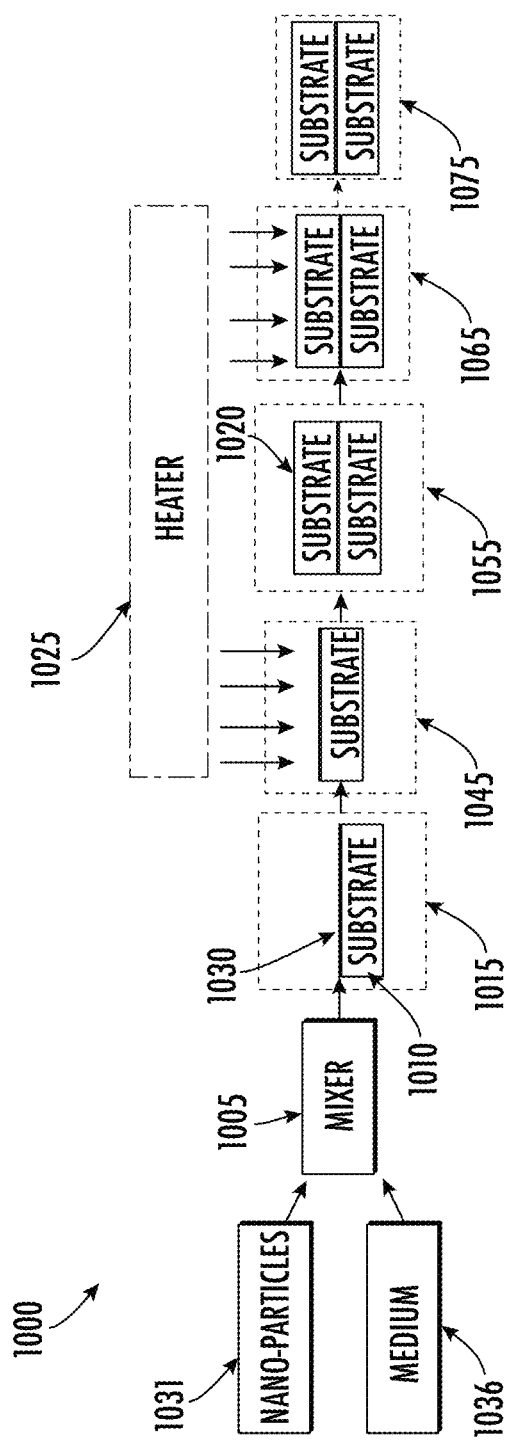
FIG. 14 illustrates an example system for joining photonic components, in accordance with some embodiments discussed herein.

Joining of substrates using nano-particles, as discussed above, may be accomplished through a joining system. FIG. 14 shows an example system 1000 for joining substrates. The nano-particles 1031 may be suspended in a medium 1036, such as by a mixer 1005. In some embodiments, a filler material may also be introduced to the mixer 1005. The mixture 1030 of nano-particle suspended in the medium is then applied to a first substrate 1010 via, for example, an applicator 1015. In some embodiments, the mixture 1030 may first be applied as a coating onto a plurality of filler particles. In such embodiments, the applicator 1015 then applies a layer of the coated filler particles to the first substrate.

The mixture on the first substrate 1010 is then exposed to a thermal process, such as by a heater 1025. In some embodiments, the thermal process may include use of an over or a laser, although other thermal processes are contemplated. The thermal process may remove at least a portion of the medium, yielding a layer of nano-particles in contact with other nano-particles and in contact with the first substrate 1010.

A second substrate 1020 is aligned, and placed on the layer of nano-particles, such as with an alignment mechanism 1055. In some embodiments, the alignment mechanism 1055 may be within the same component as the applicator 1015, and in other embodiments, the alignment mechanism 1055 and the applicator 1015 may be separate. At 1065, the heater 1025 (e.g., the same heater or a separate heater) may apply heat to the substrates and nano-particle assembly, such as at no more than 300° C. so that the nano-particles fuse at the contact points of adjacent nano-particle to cause secure alignment of the assembly—shown at 1075. In some embodiments, the heater 1025 may be two heaters, such that a first heater applies a thermal process, and the second heater applies a second thermal process, wherein the thermal process may be the same or different. The thermal processes may be oven heating, RF heating, IR heating, Laser heating, or other suitable types of heating.

In some embodiments, the system may include additional assemblies wherein a third and/or fourth substrate may be included in the system.

Example Glass Cooling Manifolds

Cooling manifolds may be integrated with and/or attached to electronics equipment to diminish the heat generated by the electronics equipment. In some embodiments, cooling manifolds may be manufactured in wafer scale and then cut down into individual units, while in other embodiments, each cooling manifold may be manufactured as an individual unit. A cooling manifold may be made from a glass sheet applied onto an electronics surface associated with electronics equipment, wherein a coolant fluid is introduced into a channel between the glass sheet and the electronics surface to remove heat produced by the electronics surface.

In some embodiments, the cooling manifold may be composed of a low thermal conductivity material, like glass, which serves as an insulator to limit thermal crosstalk among electronics equipment. The cooling manifold may also be formed to include channels for coolant between inlets and outlets. Notably, nano-particles (such as arranged in layers of nano-particle medium) can be utilized in formation of the cooling manifold to take advantage of the beneficial properties and formation capabilities (particularly with respect to concerns of maintaining electronics and optics within the electronics equipment during formation of the cooling manifold). Said differently, the layer of nano-particles may be used to form a fluid impermeable seal for the channels through low temperature heating, which can limit potential negative effects on the electronics equipment, such as described herein.

FIGS. 15A-H illustrate the formation of an assembly 1100 from wafer scale, wherein a first substrate 1110' (e.g., a glass sheet) is attached with a layer of nano-particles 1130 to a wafer, e.g. second substrate 1120' having a plurality of electronics surfaces 1120b. After attachment, the first substrate 1110' and plurality of electronics surfaces 1120b may be separated into individual cooling manifolds 1101 (shown in FIG. 15G).

FIGS. 15A-B illustrate a cross-sectional view of the first substrate 1110' defining a first side 1110a and a second side 1110b. The first substrate 1110' may be configured as a large pane of material configured to be cut into smaller and/or individual first substrates. In some embodiments, the first substrate 1110' may be cut prior to application with electronics surfaces 1120b (shown in FIG. 15E), while in other embodiments, the first substate sheet 1110' may be cut after application to the electronics surfaces 1120b.

In some embodiments, the first substrate 1110' may define multiple holes 1141, extending through the first substrate 1110'. The holes 1141 may be formed by a laser process, such as laser ablation or laser damage and etch processing having a diameter between 0.5-5.0 mm. In some embodiments, the holes 1141 may serve as ports for guiding a coolant fluid 1157 through the cooling manifold 1101 after assembly (see e.g., FIG. 15H).

A layer of nano-particle medium 1136 may be deposited on a second side 1110b of the first substrate 1110', as illustrated in FIG. 15B, at selected locations using one of a variety of processes, such as aerosol printing, ink jet printing, screen printing, or transfer printing, as discussed supra.

In some embodiments, the layer of nano-particle medium 1136 may comprise purely metallic nano-particles, and in some embodiments the layer of nano-particle medium 1136 may include filler material, for example, glass or ceramic CTE matching particles, or other low or negative CTE fillers. The composition of the layer of nano-particle medium 1136 may influence the thickness of the layer of nano-particle medium 1136. For example, in embodiments wherein the layer of nano-particle medium 1136 is composed of purely metallic nano-particles, the layer of nano-particles 1130 may define a thickness between 0.5-2.0 um. While in other embodiments, where the layer of nano-particle medium 1136 includes filler materials, the layer of nano-particle medium 1136 may be thicker, for example between 30-50 um.

Figure 15D:
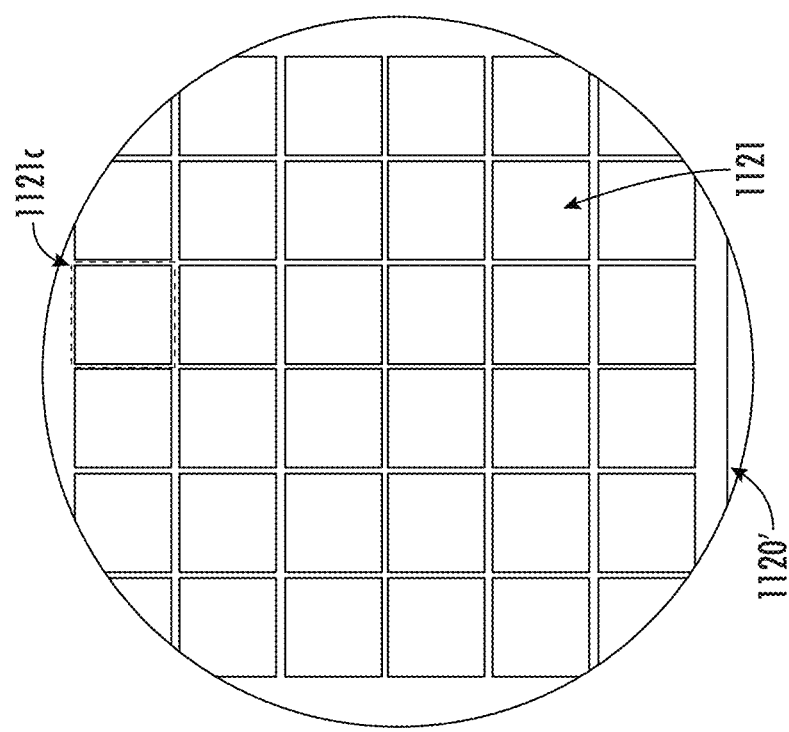
FIG. 15D illustrates a top view of a second substrate, in accordance with some embodiments discussed herein.
Figure 15C:
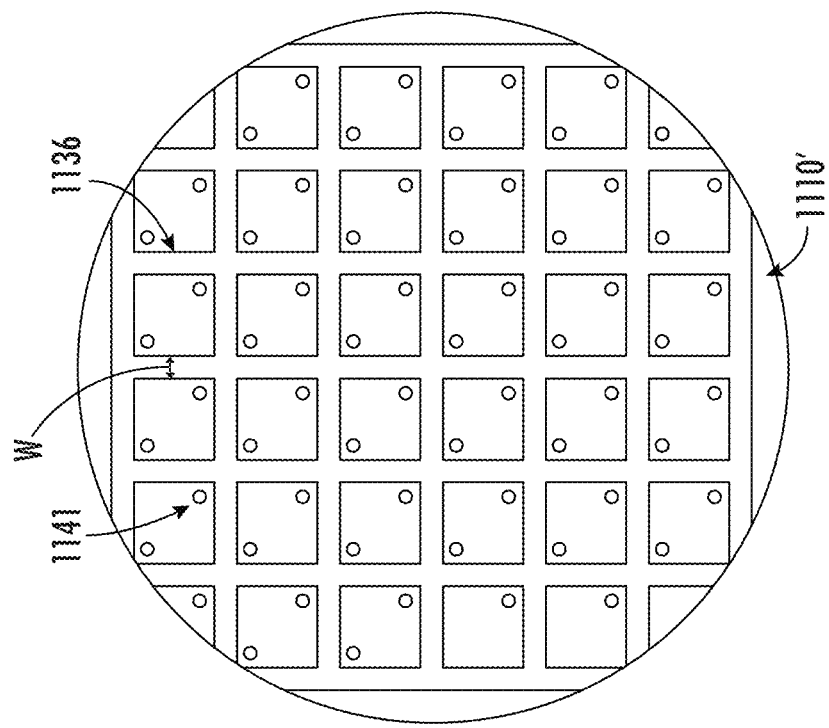
FIG. 15C illustrates a top view of the first substrate, shown in FIG. 15A, with a layer of nano-particles, in accordance with some embodiments discussed herein.

In some embodiments, the layer of nano-particle medium 1136 is patterned on the first substrate 1110' in the form of a grid, as illustrated in FIG. 15C. The grid may define a width W, and a thickness. The width W of the layer of nano-particle medium 1136 may be large enough to cover a perimeter 1121c of an integrated circuit 1121 disposed on a second substrate 1120' (shown in FIG. 15D). In some embodiments, the layer of nano-particle medium 1136 may extend between 0.5-3.0 mm beyond a center of the perimeter 1121c.

The second substrate 1120' may define a first side 1120a and a second side 1120b that may be referred to an "electronics surface". In some embodiments, the second substrate 1120' may be a semiconductor wafer, wherein an integrated circuit 1121' is fabricated on the first side 1120a. The second substrate 1120' may be aligned with the first substrate 1110' so that the electronics surface 1120b of the second substrate 1120' (e.g., a side opposite the integrated circuit 1121'), may face the layer of nano-particle medium 1136 deposited on the first substrate 1110', illustrated in FIG. 15E. In some embodiments, the first substrate 1110' may be glass. The glass composition may be tuned to match the CTE of the second substrate 1120' (e.g., semiconductor chip).

The second substrate 1120' may be configured as a large semiconductor wafer with individual integrated circuits 1121 configured to be cut into smaller and/or individual semiconductor wafers. In some embodiments, the second substrate 1120' may be divided prior to application with the first substrate 1110', while in other embodiments, the second substate 1120' may be divided after application of other substrates, and in some embodiments the second substrate 1120' may not be divided.

The electronics surface 1120b of the second substrate 1120', may be brought into contact with the layer of nano-particle medium 1136 so that the perimeter 1121c of the electronics surface 1120b is aligned with the layer of nano-particle medium 1136. Force may be applied to squeeze the second substrate 1120' and the first substrate 1110' together, creating contact between the layer of nano-particle medium 1136 and the electronics surface 1120b of the second substrate 1120' (shown in FIG. 15F).

In some embodiments, the layer of nano-particle medium 1136 may be configured to deform and flow when engaged with the second substrate 1120'. In some embodiments, the paste or solvent may be used to ensure contact between the first substrate 1110' and the second substrate 1120'. After initial contact, the layer of nano-particle medium 1136 may be heated to drive off the solvent or another binder. In some embodiments, heating may last up to 30 minutes, 60 minutes, or 90 minutes, in an oven of up to 60° C., 90° C., or 120° C.

After removal of the paste and/or solvent a layer of nano-particles 1130 remains between the first substrate 1110' and the second substrate 1120'. The layer of nano-particles may be sintered to cause secure connection between adjacent nano-particles, by heating the layer of nano-particles 1130 at up to 200° C. In some embodiments, heat may be applied using laser, infrared radiation (IR), ultra-violet radiation (UV), radio-frequency (RF), or microwave radiation. FIG. 15F illustrates radiation 1152 directed at each location of the layer of nano-particles 1130. In some embodiments, a squeezing force may be applied during the application of the radiation 1152 to force the second substrate 1120' into contact with the layer of nano-particles 1130. The radiation 1152 causes the layer of nano-particles 1130 to densify, forming a leak-free hermetic seal impermeable to fluid between the first substrate 1110' and the second substrate 1120'.

The nano-particles within the layer of nano-particles 1130 are configured to form a robust bond when placed directly to glass, ceramic, and metallic oxides, including glass sheets and silicon wafers (e.g., where the silicon is always coated with a thin silicon dioxide layer after brief exposure to atmospheric oxygen). Therefore, substrates made from glass, ceramic, and metallic oxides may be robustly bonded together without additional deposited metallization layers.

Figure 15G:
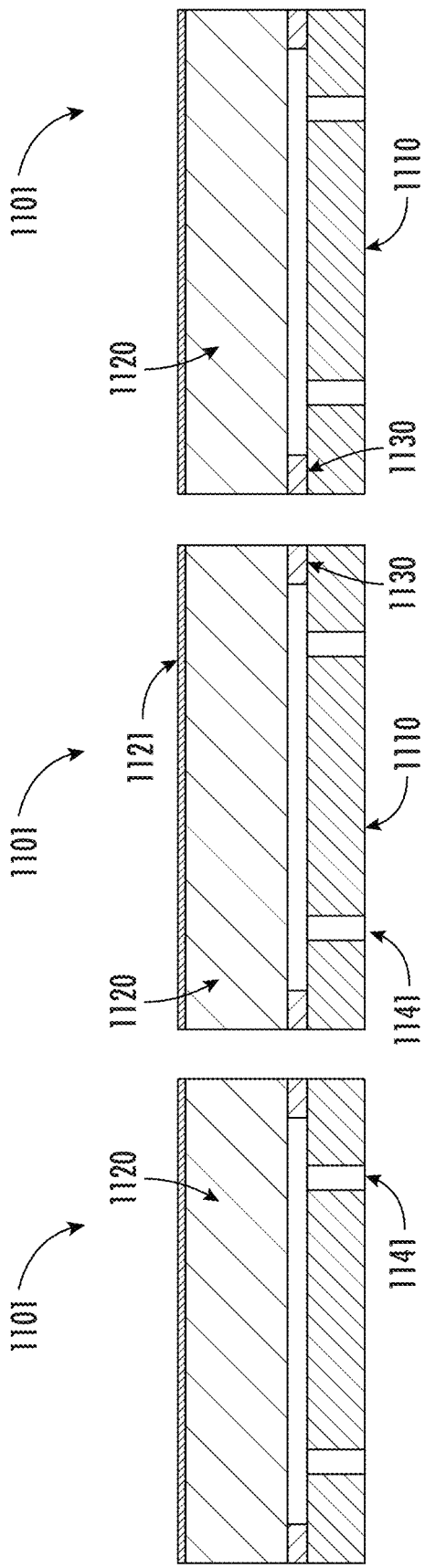
FIG. 15G illustrates a cross-sectional view of the assembly shown in FIG. 15F, now divided into individual cooling manifolds, in accordance with some embodiments discussed herein.

After sintering the layer of nano-particles 1130 to bond the first substrate 1110' and the second substrate 1120' together, the overall cooling manifold 1101' may be diced into individual cooling manifolds 1101, wherein each cooling manifold 1101 includes a first substrate 1110 and a second substrate 1120 bonded via the layer of nano-particles 1130, as illustrated in FIG. 15G.

Figure 15H:
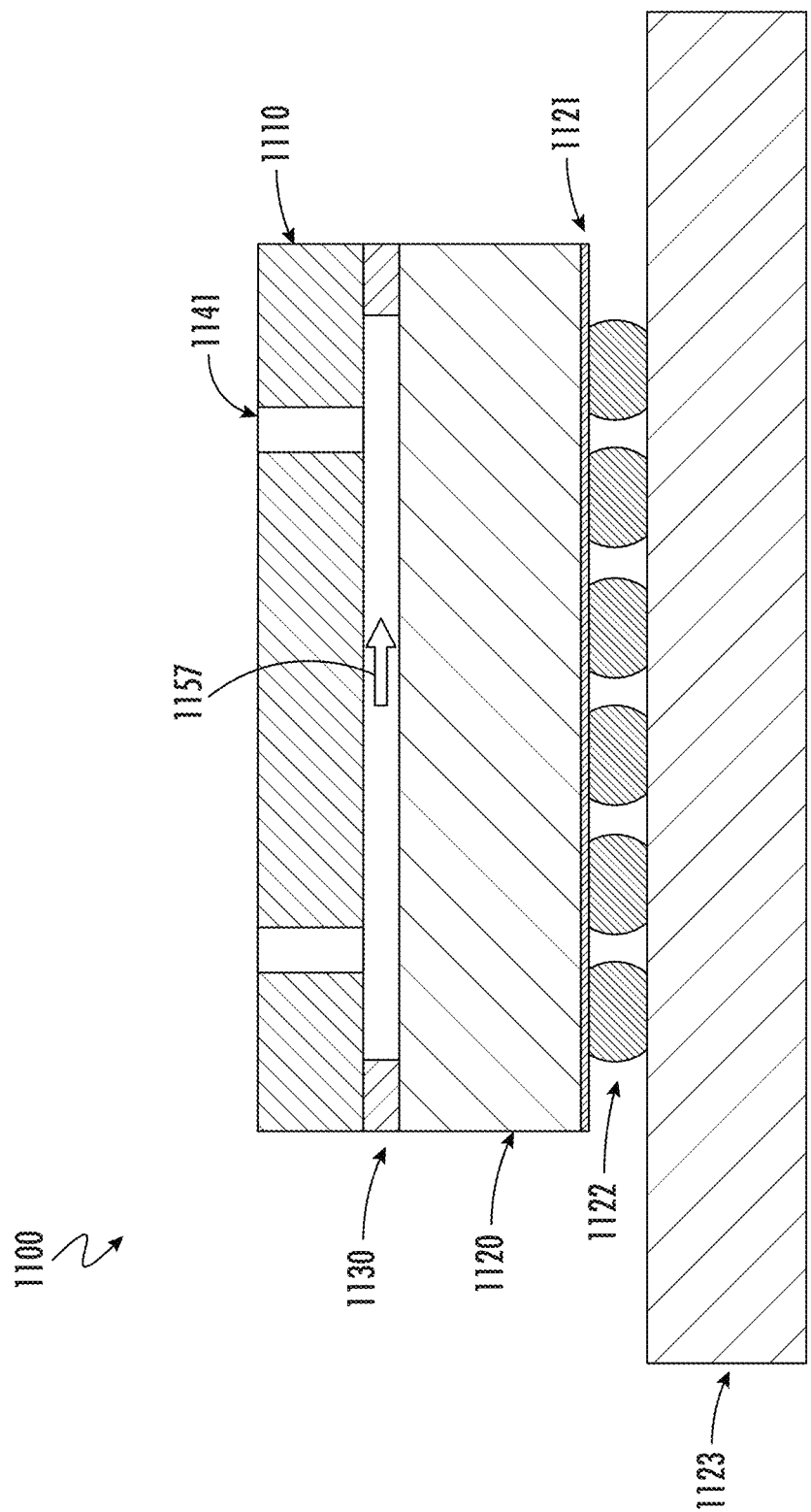
FIG. 15H illustrates a cross-sectional view of an example cooling manifold shown in FIG. 15G joined to a printed circuit board (PCB), in accordance with some embodiments discussed herein.

The cooling manifold 1101 may be attached to a printed circuit board (PCB) 1123, such as using solder balls 1122 as illustrated in FIG. 15H, making an assembly 1100. In some embodiments, the solder balls 1122 may be melted in a solder reflow process, (e.g., with a maximum temperature of 260° C.). As discussed above the layer of nano-particles 1130 bonding the first substrate 1110 to the second substrate 1120 behave like a solid piece of copper after sintering. In some embodiments, the sintered layer of nano-particles 1130 may have a melting point that is far above the melting point of solder balls 1122 used for attachment to PCBs 1123. As a result, the sintered layer of nano-particles 1130 is unaffected by the high temperatures involved in solder reflow chip attachment.

Figure 16C:
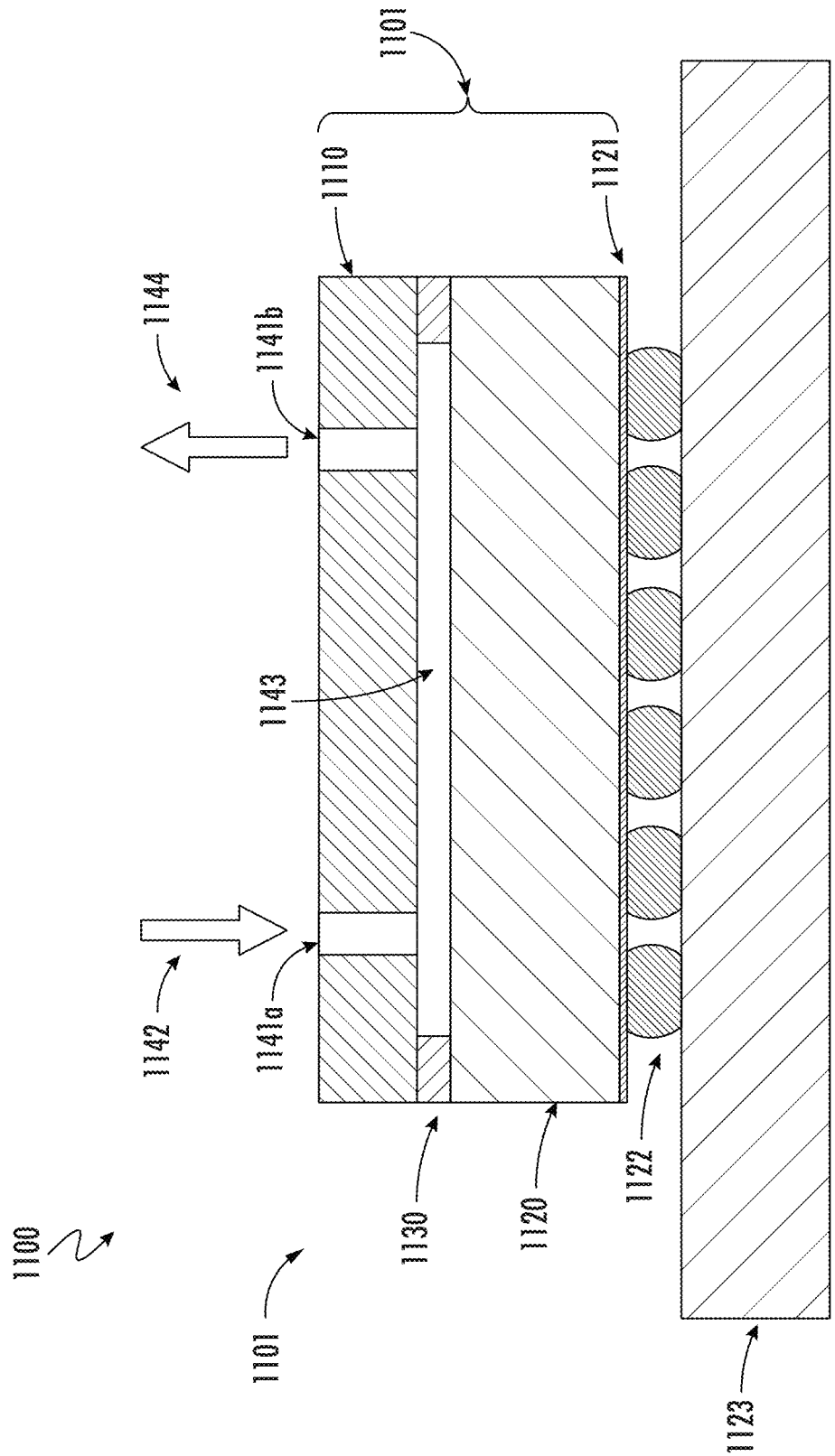
FIG. 16C illustrates a cross-sectional view of a coolant fluid flowing through the cooling manifold shown in FIG. 16B, in accordance with some embodiments discussed herein.

FIGS. 16A-C illustrate steps to form the assembly 1100 using individual substrates. As illustrated in FIG. 16A, the second substrate 1120 may be attached to the PCB 1123 with solder balls 1122 prior to attachment with the first substrate 1110. Upon attachment to the PCB 1123, a layer of nano-particle medium 1136 may be applied to the first substrate 1110, wherein the layer of nano-particle medium 1136 may be aligned with the perimeter 1121c of the second substrate 1120. The layer of nano-particle medium 1136 may be brought into contact with the electronics surface 1120b of the second substrate 1120 (as shown in FIG. 16B). Radiation 1152 may be directed at the layer of nano-particle medium 1136 through the first substrate 1110, while the first substrate 1110 is pressed into the electronics surface 1120b of the second substrate 1120. The radiation 1152 causes the medium suspending the nano-particles within the layer of nano-particle medium 1136 to evaporate, leaving a layer of the nano-particles 1130 on the second substrate 1120. The radiation 1152 power level can be increased to further heat the layer of nano-particles 1130 causing the nano-particles to sinter together, thereby creating a leak-free hermetic seal, impermeable to fluid.

FIG. 16C illustrates the assembly 1100 having a cooling manifold 1101. In some embodiments, a coolant fluid 1157 (as shown in FIG. 15H) may enter a first hole 1141a and flow through a channel 1143 and exit the channel 1143 through a second hole 1141b. The channel 1143 may be defined by the space between the electronics surface 1120b and the second side 1110b of the first substrate 1110, within the layer of nano-particles 1130.

In some embodiments, the second hole may be formed within the layer of nano-particles disposed about the perimeter 1121c of the electronics surface 1120b (as shown in FIG. 15D). In some embodiments, the second hole may be configured as a perforation through the layer of nano-particles 1130, wherein the coolant fluid is able to flow into the channel 1143, or out of the channel 1143 via the second hole. In some embodiments, the second hole may be formed by disposing the layer of nano-particles 1130 about a portion of the perimeter 1121c of the electronics surface 1120b, wherein the second hole is defined by the electronics surface 1120b, the second side 1110b of the first substrate 1110, and the layer of nano-particles 1130. The second hole formed within the layer of nano-particles 1130 may allow for the coolant fluid to flow into the channel 1143 or out of the channel 1143, thereby cooling the electronics surface 1120b.

Returning to FIG. 16C, in some embodiments, the coolant fluid 1157 may define an inlet flow 1142 through the first hole 1141a, and an outlet flow 1144 through the second hole

1141*b*. The coolant fluid 1157 may enter the channel 1143 as a liquid, be heated by heat generated by the electronics surface 1120*b* as the coolant fluid 1157 flows across the channel 1143, and may exit the cooling manifold 1101 as a gas or vapor (and/or liquid) through the second hole 1141*b*.

Figure 17B:
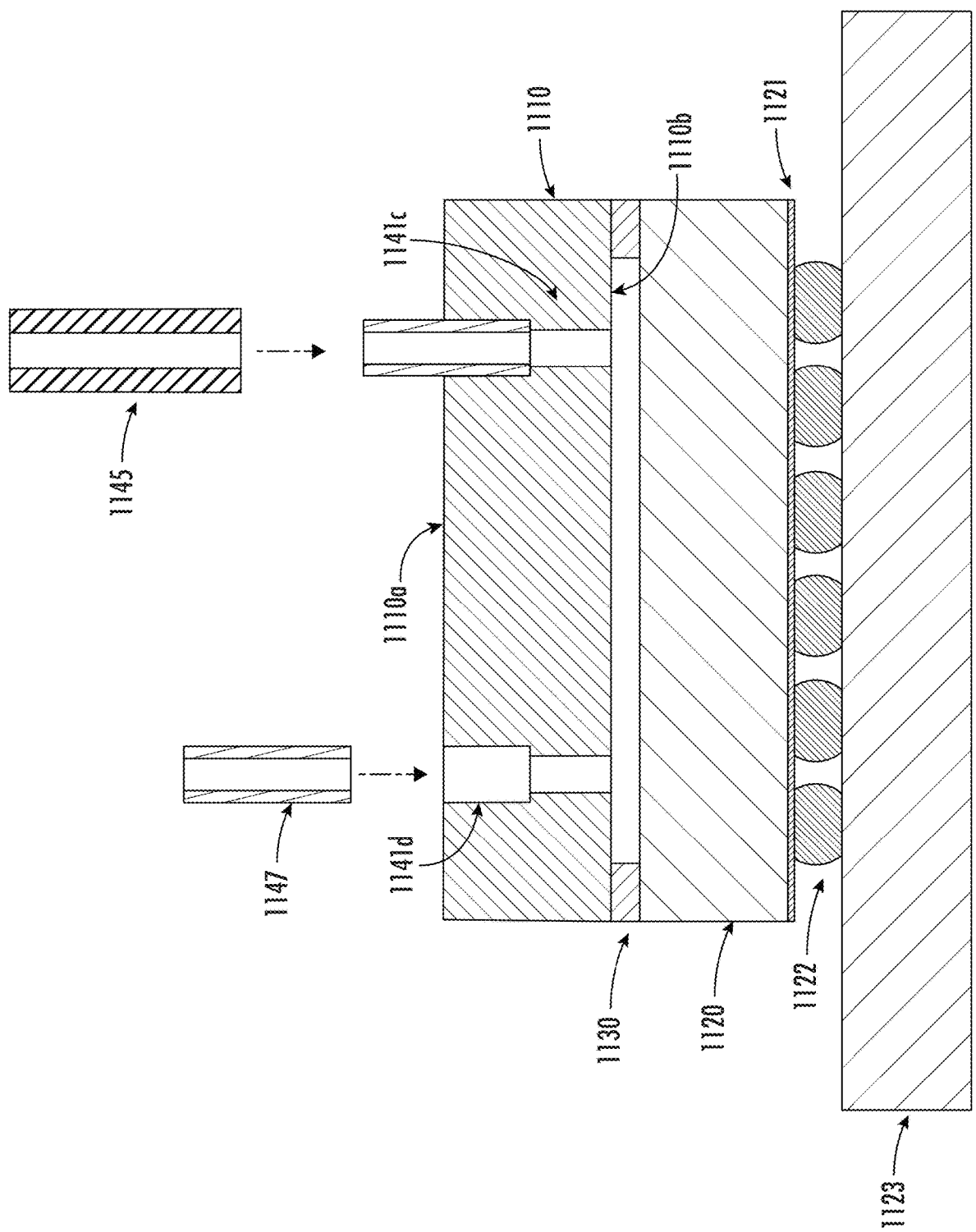

The fluidic interface (e.g., the first hole 1141*a* and the second hole 1141*b*) of the cooling manifold 1101 may enable attachment of external hoses 1145 to supply and remove the coolant fluid 1157 from the channel 1143. FIGS. 17A-C illustrate example configurations of attachment methods of varying external hoses for use within the first hole 1141*a* and the second hole 1141*b* (of FIG. 16C).

FIG. 17A illustrates an example embodiment, wherein a fitting 1146 is bonded to the first substrate 1110. In some embodiments, the fitting 1146 may be a metallic fitting, as metallic fittings may be fabricated with a metal that is CTE-matched to the material (e.g., glass) of the first substrate 1110. An example fitting 1146 may be an Invar alloy. In some embodiments, the fitting 1146 may be bonded to the first substrate 1110 with a high temperature epoxy, and in some embodiments may be bonded with nano-particles, as discussed with reference to other junctions. The external hoses 1145 may be attached to the fitting 1146 with an adhesive, a hose clamp or, in some embodiments, a compression fitting.

In some embodiments, a laser may be used to form the holes 1141 in the first substrate 1110. The holes 1141 may be formed with a uniform dimeter as illustrated in FIGS. 15-17A, or may be formed with two distinct diameters, as illustrated in FIG. 17B. In some embodiments, the diameter of the hole 1141 may change along a length of the hole 1141. In some embodiments, such as illustrated in FIG. 17B, the hole 1141 may define a large diameter portion 1141*d* abutting the first side 1110*a* of the first substrate 1110, and a small diameter portion 1141*c* abutting the second side 1110*b* of the first substrate 1110. The large diameter portion 1141*d* may be sized to receive a tube 1147 that may, for example, be bonded into the large diameter portion 1141*d* using adhesive or sintered nano-particles. The external hose 1145 may be attached to the tube 1147, such as with adhesive and/or a hose clamp. In some embodiments, the tube 1147 may be glass or metallic. In some embodiments, the tube 1147 may include barbs or may provide features required to implement a compression fitting with the external hose 1145.

In some embodiments, the hole 1141 may also provide a uniform diameter though the thickness of the first substrate 1110. The tube 1147 may slip through the first substrate 1110, into the channel 1143. In this case, a stop or other feature may be provided to limit the travel of the tube 1147 during assembly and adhesive curing, such that the tube 1147 does not interfere with the flow of the coolant fluid 1157 through the channel 1143.

In some embodiments, the hole(s) 1141 within the first substrate 1110 may include a threaded section 1141*e* for receiving the fitting 1146, as illustrated in FIG. 17C. The threaded section 1141*e* may be formed using, for example, laser damage and etch processes. The threaded section 1141*e* may be fabricated with a taper so as to match the National Pipe Thread standard fittings with, for example, polytetrafluoroethylene tape to improve sealing and prevent thread damage during fitting insertion into the threaded section 1141*e*. Alternatively, in another embodiment, the threaded section 1141*e* may define straight threads which may receive the fitting 1145 and an O-ring. In some embodiments, the fitting 1145 may be fabricated from metal or a hard plastic material (e.g., PEEK™, Teflon™, Rulon™, or Torlon™) that will survive exposure to solder reflow temperatures without damage.

In some embodiments, at least one channel wall may be formed within the layer of nano-particles disposed about the perimeter of the electronics surface forming the seal of the cooling manifold. The at least one channel wall may be formed of nano-particles extending between the electronics surface and the first substrate. The at least one channel wall may direct the coolant fluid across the electronics surface in a pattern to increase the heat transfer from the electronics surface into the coolant fluid. FIGS. 18A-19B illustrate example cooling manifolds with at least one channel wall.

Figure 18B:
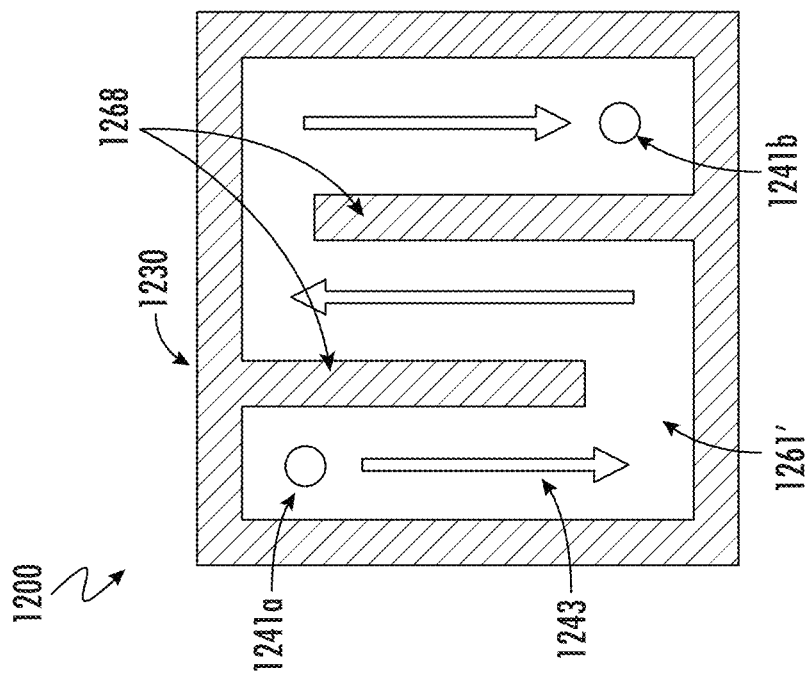
FIG. 18B illustrates a top cross-sectional view of the example channel configuration shown in FIG. 18A, in accordance with some embodiments discussed herein.
Figure 18A:
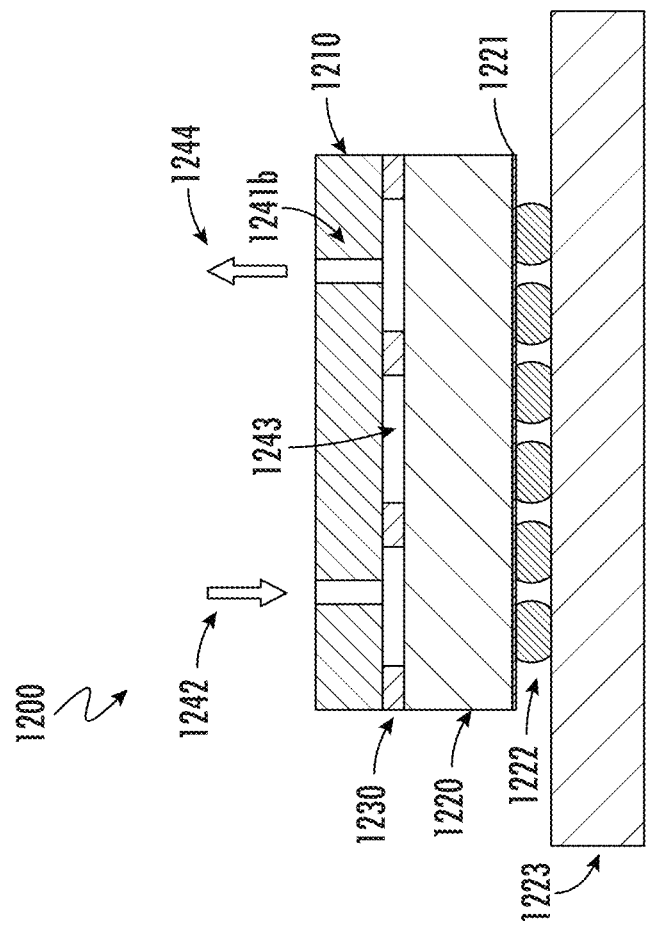
FIG. 18A illustrates a cross-sectional view of an example channel configuration, in accordance with some embodiments discussed herein.

FIGS. 18A-B illustrate the channel 1243 defining a tortuous path 1261' (e.g., a serpentine path) arranged across the electronics surface 1220*b* (as shown in FIG. 20B) by forming at least one channel wall 1268 at specific locations. The coolant fluid is configured to enter into the first hole 1241*a*, flow through the channel 1243, and exit the second hole 1241*b*. While the coolant fluid flows through the channel 1243 the coolant fluid may undergo a phase change between a liquid state upon entry of the first hole 1241*a*, to an at least partial gaseous state upon exit of the second hole 1241*b*. The phase change is driven by the heat generated by the integrated circuit 1221, and other electronics within the second substrate 1220 and disposed on the PCB 1223. In some embodiments, the coolant fluid may have a high heat transfer component and be configured to remove heat from the electronics surface 1220*b* of the second substrate 1220 as the coolant fluid flows along the tortuous path 1261' through the channel 1243.

Figure 19B:
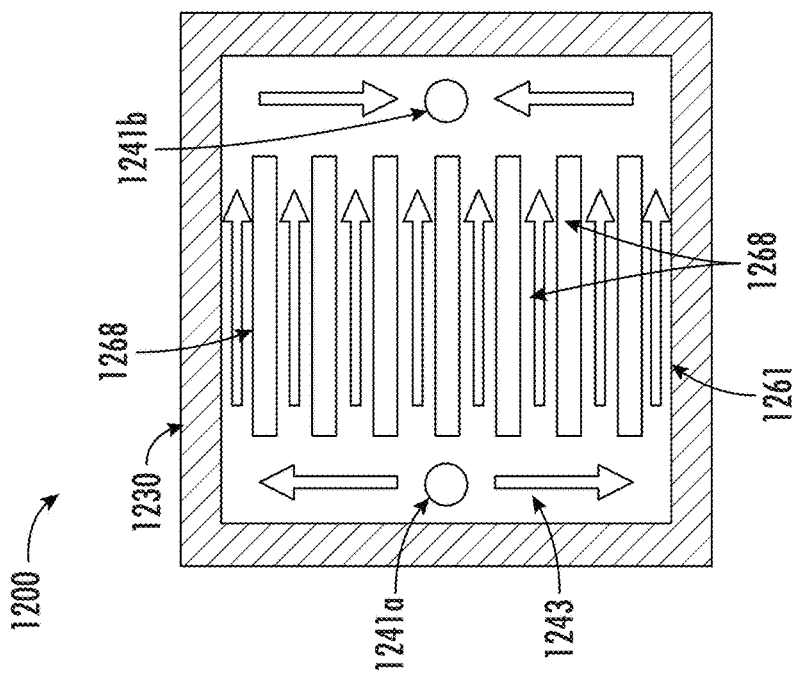
FIG. 19B illustrates a top cross-sectional view of the example channel configuration shown in FIG. 19A, in accordance with some embodiments discussed herein.
Figure 19A:
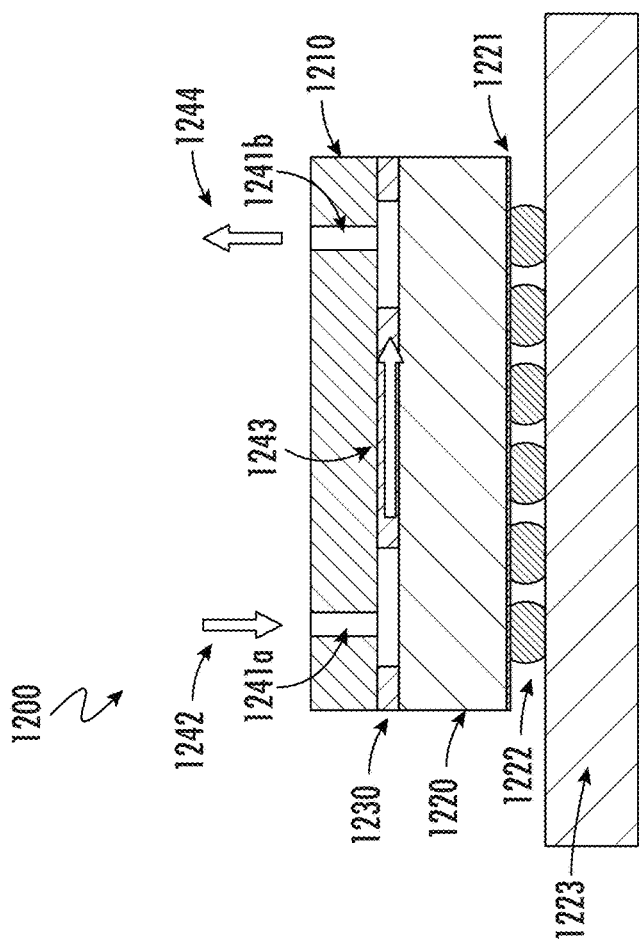
FIG. 19A illustrates a cross-sectional view of another example channel configuration, in accordance with some embodiments discussed herein.

In some embodiments, illustrated in FIGS. 19A-B, the at least one channel wall 1268 may be configured to form a plurality of parallel paths 1261. The plurality of parallel paths 1261 may direct the coolant fluid from the first hole 1241*a* to spread out across the plurality of parallel paths 1261 and exit through the second hole 1241*b*.

In some embodiments, the at least one channel wall 1268 may be formed within the same printing process as the layer of nano-particle medium 1236 about the perimeter 1221*c*. The at least one channel wall 1268 may be configured to extend between the electronics surface 1220*b* and the second side 1210*b* of the first substrate 1210. The deposition process of the at least one channel wall 1268 and the layer of nano-particle medium 1236 used to form the sealing layer may be precisely controlled, for improved flow uniformity across the electronics surface 1220*b*, since the first substrate 1210 and the second substrate 1220 are flat.

In some embodiments, high heat transfer rates at the interface between the electronics surface 1220*b* and the coolant fluid may be achieved through nucleate boiling, such as when the electronics surface is 10-30° C. above the boiling point of the coolant fluid. Nucleate boiling may be induced at specific locations across the electronics surface 1220*b* by printing at least one deposit of nano-particles 1237*a,b,c* at the specific location (as shown in FIG. 20B). In some embodiments, the at least one deposit of nano-particles may be a thin layer of nano-particles. This approach may allow enhanced cooling of specific electronics surface 1220*b* locations that may generate more heat.

FIGS. 20A-B illustrate the at least one deposit of nano-particles 1237*a,b,c* within the channel 1243. In some embodiments, the at least one deposit of nano-particles 1237*a,b,c* may be over a portion of the channel width (e.g. 1237*a*, 1237*b*) or over the entire channel width (e.g., 1237*c*). In some embodiments, the at least one deposit of nano-particles 1237 may be a plurality of deposits of nanoparticles 1237*a*, 1237*b*, 1237*c*. The plurality of deposits of nano-particles 1237*a*, 1237*b*, 1237*c* may be surrounded by at least one margin of non-coated electronics surface 1220*b* (note the holes 1241*a* and 1241*b* are actually in the first substrate 1210, but are illustrated for explanation in FIG. 20B). This configuration may enable local convection in nucleate boiling regions, where cool coolant fluid may flow over the at least one deposit of nano-particles 1237*a,b,c* to replace heated coolant fluid removed by local natural or forced convection. In some embodiments, the at least one deposit of nano-particles 1237*a,b,c* may be patterned to consist of a periodic 1D or 2D array.

In some embodiments, each of the plurality of deposits of nano-particles 1237*a*, 1237*b*, 1237*c* may define a deposit shape, and a deposit thickness. The deposit thickness may extend partially within the channel upwardly from the electronics surface 1220*b*. In some embodiments, each of the plurality of deposits of nano-particles 1237*a*, 1237*b*, 1237*c*, may define distinct deposit shapes, and distinct deposit thickness, and in other embodiments, may define the same deposit shape, and/or the same deposit thickness. In some embodiments, the deposit thickness of the deposits of nano-particles 1237*a,b,c* may be less than a thickness of the layer of nano-particles 1230 that forms the seal defining the channel between the first substrate 1210 and the second substrate 1220.

The layer of nano-particle medium 1236 disposed about the perimeter 1221*c* of the electronics surface 1220*b*, the at least one deposit of nano-particles 1237*a,b,c*, and the at least one channel wall 1268 (as shown in FIG. 18B) may be deposited from the same application process, such as aerosol or ink jet printing, where the velocity of the deposition head and/or the number of printing passes over a region are adjusted to achieve a desired nano-particle layer thickness in a particular region.

Figure 21B:
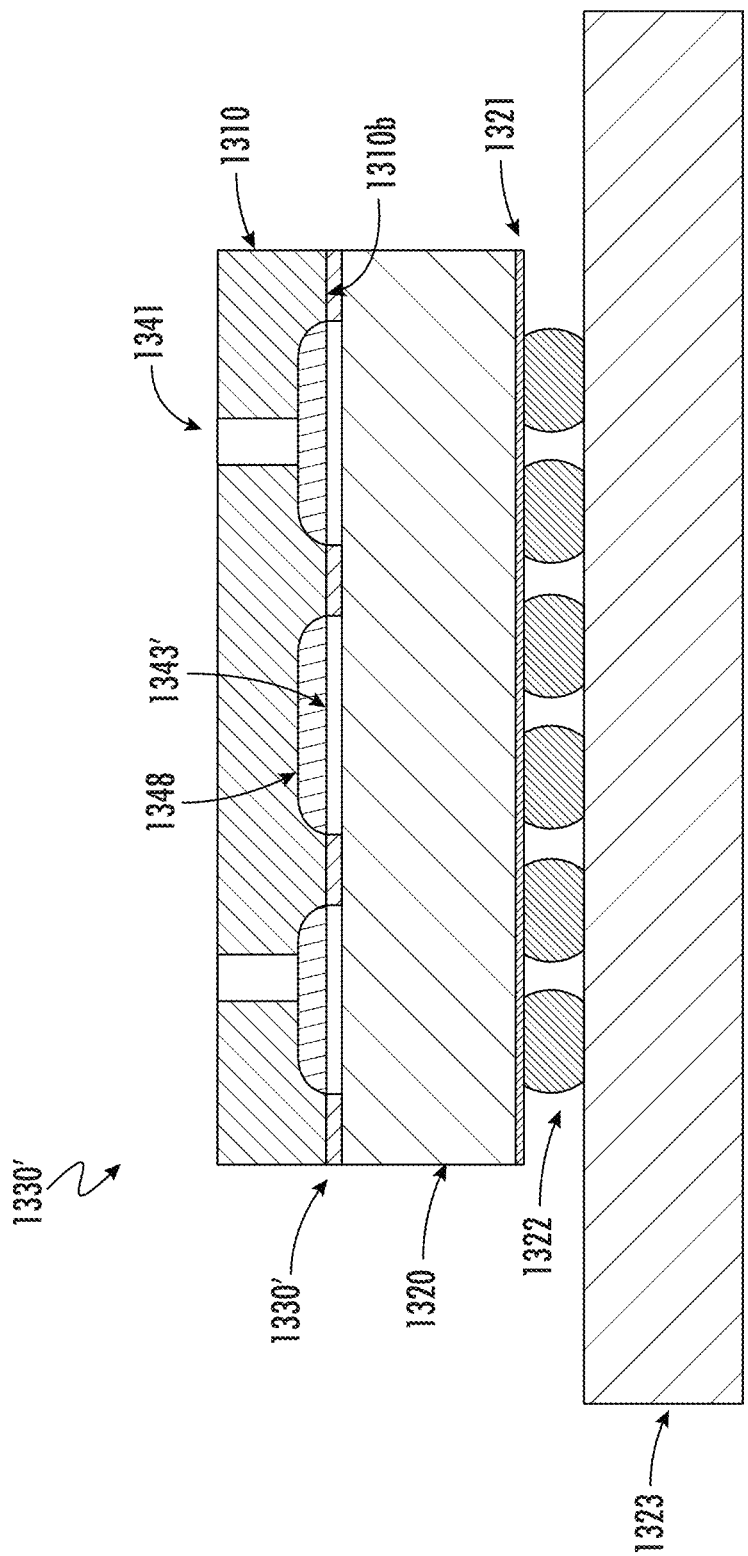

In some embodiments, the first substrate 1210 may have a thickness between 0.7-1.1 mm. In some embodiments, the thickness of the first substrate 1210 may be greater than 2.0 mm. The thickness of the first substrate 1210 may depend on the type of internal features integrated within the first substrate 1210. For example, the first substrate 1110' as illustrated in FIG. 15A may be thinner than the first substrate 1310 as illustrated in FIG. 21B, as the first substrate 1310 has at least one cavity 1348 within the first substrate 1310.

In some embodiments, a thin layer of nano-particles 1330' may be used to form the cooling manifold 1301 by joining the first substrate 1310 and the electronics surface. To account for the reduction of flow from the coolant fluid 1357 at least one cavity 1348 may be formed within the first substrate 1310. FIGS. 21A-C illustrate the formation of an assembly 1300 wherein the cooling manifold 1301 defines at least one cavity 1348 within the first substrate 1310.

In some embodiments, illustrated in FIG. 21A, the first substrate 1310 and the second substrate 1320 may be joined using a thin layer of nano-particles 1330'. Similar to some embodiments discussed above the first substrate 1310 may be pressed downward on the thin layer of nano-particles 1330' such that the thin layer of nano-particles 1330' contact the first substrate 1310 and the electronics (e.g., top) surface of the second substrate 1320 to enable a leak-free seal after sintering of the thin layer of nano-particles 1330' to define a thin channel 1343' between the first substrate 1310 and the electronics surface 1220*b*. In some embodiments, the thin layer of nano-particles 1330' may be between 0.5 um and 10 um thick.

However, the thin channel 1343' may not allow for the coolant fluid 1357 to effectively flow and cause high pressure drops leading to potential failure due to the lack of cooling across the electronics surface.

In some embodiments, to account for the low flow within the thin channel 1343', at least one cavity 1348 may be formed in the second side 1310*b* of the first substrate 1310 resulting in a channel 1343. In some embodiments, the at least on cavity 1348 may increase the size of the flow of the coolant fluid 1357 similar to previous embodiments. FIG. 21B illustrates a cross-sectional view of a tortuous path similar to those shown in FIGS. 18A-B and 20A-B.

In some embodiments, the at least one cavity 1348 may be formed by, for example, laser ablation or laser damage and etch processes, possibly in the same fabrication step that forms the holes 1341 within the first substrate 1310. The at least one cavity 1348 may also be formed by hot pressing the first substrate 1310 onto a mold, such as a precision machined graphite or glassy carbon form. This form may also include features to create the holes 1341 through the first substrate 1310.

The at least one cavity 1348 may be profiled to have various channel cross-sections. FIG. 21B illustrates an example cross-section of the at least one cavity 1348, wherein the at least one cavity 1348 defines rounded edges. In some embodiments, the at least one cavity 1348 may be symmetrical or asymmetrical depending on the properties of the cooling manifold 1301 and the coolant fluid 1357 to be used. The same of the at least one cavity 1348 may include varying depths and widths thereby adjusting the flow velocity of the coolant fluid 1357, and boundary layer thickness in specific locations across the electronics surface to enhance heat transfer performance.

In some embodiments, utilizing the thin layer of nano-particles 1330' may result in a lower cost of manufacture as less nano-particles used, and further, there may be a shorter manufacture time (e.g., due to rapid sintering) via, for example, laser irradiation. The thin layer of nano-particles 1330' may also be desirable to minimize any interface strains between the potentially high CTE of the thin layer of nano-particle medium 1336' prior to sintering, as compared to the materials of first substrate 1310 and the second substrate 1320 (e.g., glass and silicon component layers).

The thin layer of nano-particles 1330' may be used both for substrate-to-substrate bonding, and for promotion of nucleate boiling at specific locations. FIG. 21C illustrates the thin layer of nano-particles 1330' used to join the first substrate 1310 and the electronics surface of the second substrate 1220 and also used within the channel 1343 for promotion of nucleate boiling across the at least one deposit of nano-particles 1337. In some embodiments, depending on the surface requirements of nano-particles for nucleate boiling and the bulk properties required for glass sheet bonding, it may be possible to deposit both types of thin nano-particle layers (e.g., the thin layer of nano-particles 1330' and the deposits of nano-particles 1337) on the electronics surface using the same fabrication step and/or process.

In some embodiments, as illustrated in FIGS. 22A-24B the assembly 1400 may be configured for jet impingement cooling between the first substrate 1410 and the electronics surface 1420*b* to dissipate heat generated the electronics equipment associated with the electronics surface 1420*b*. Jet impingement cooling may involve directing a jet of the coolant fluid vertically down on to the electronics surface 1420*b*, wherein upon striking the electronics surface 1420*b*, the coolant fluid spreads out in all directions across the electronics surface 1420*b* and forms a thin velocity boundary layer 1449, see e.g., FIG. 23B. The thin velocity boundary layer 1449 creates a large thermal gradient between the temperature of the electronics surface 1420b and the coolant fluid bulk temperature, thereby promoting high heat transfer into the coolant fluid.

Figure 22B:
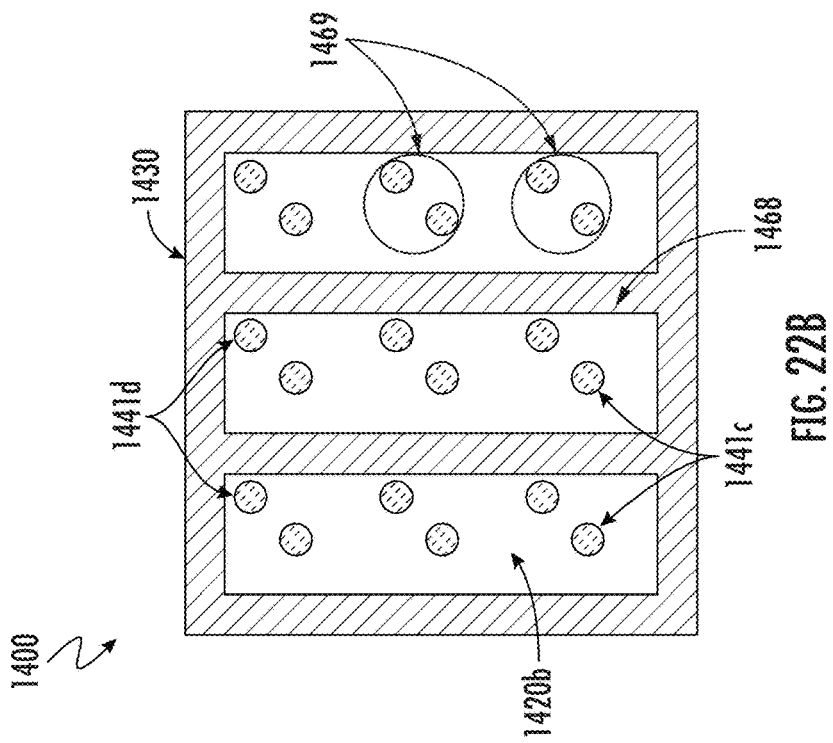
FIG. 22B illustrates top cross-sectional view of the example cooling manifold shown in FIG. 22A, in accordance with some embodiments discussed herein.
Figure 22A:
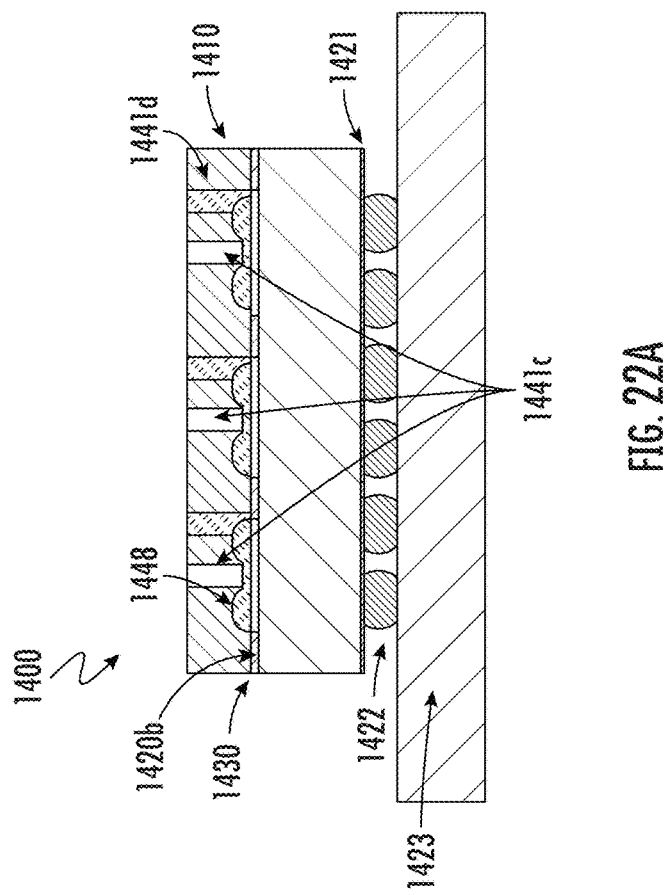
FIG. 22A illustrates a cross-sectional view of an example cooling manifold configured to jet impingement cooling, in accordance with some embodiments discussed herein.

In some embodiments, jet impingement cooling may be implemented with at least one jet impingement region 1469 having a jet impingement hole 1441c and at least one coolant return hole 1441d within the at least one cavity 1448, as illustrated in FIG. 22A. The jet impingement hole 1441c may be configured to have a changing diameter, which narrows from the first side 1410a to the second side 1410b of the first substrate 1410, such as to increase jet impingement coolant fluid 1457 velocity upon entry to the channel 1434. Other features, such as nozzles, baffles, and other mixer structures to enhance fluid shear may also be integrated into the at least one cavity 1448.

In some embodiments, the at least one jet impingement region 1469 may be multiple jet impingement regions 1469 across the electronics surface 1420b. The multiple jet impingement regions 1469 may be grouped together within a common region or separated from each other by the at least one channel wall 1468.

In some embodiments, such as illustrated in FIGS. 23A-B, the coolant fluid may be removed from the multiple jet impingement regions 1469 using the coolant return hole 1441d be located near the jet impingement hole 1441c. In some embodiments, the coolant return hole 1441d may be a single coolant return hole, while in other embodiments each of the multiple jet impingement regions 1469 may include multiple coolant return holes.

Figure 24B:
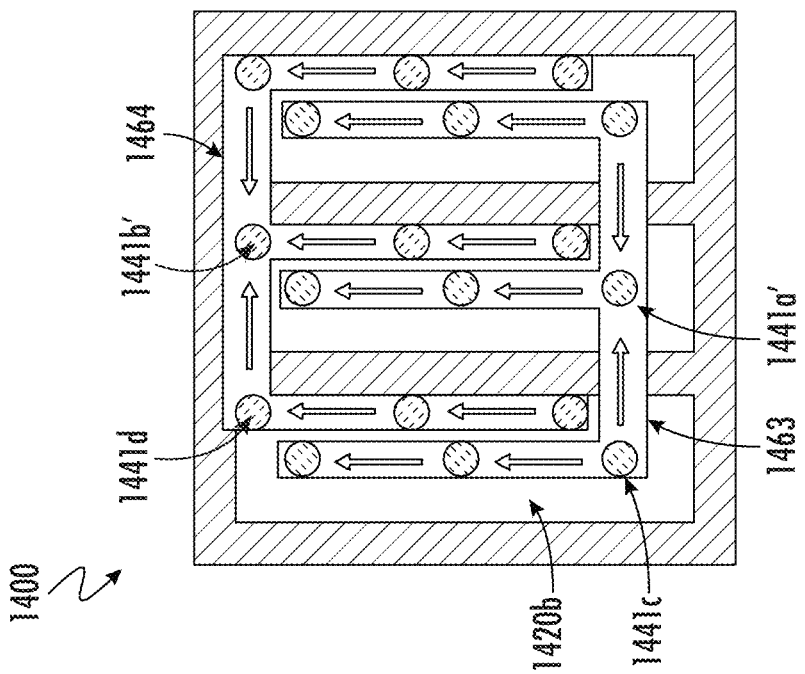
FIG. 24B illustrates top cross-sectional view of the example cooling manifold shown in FIG. 24A, in accordance with some embodiments discussed herein.
Figure 24A:
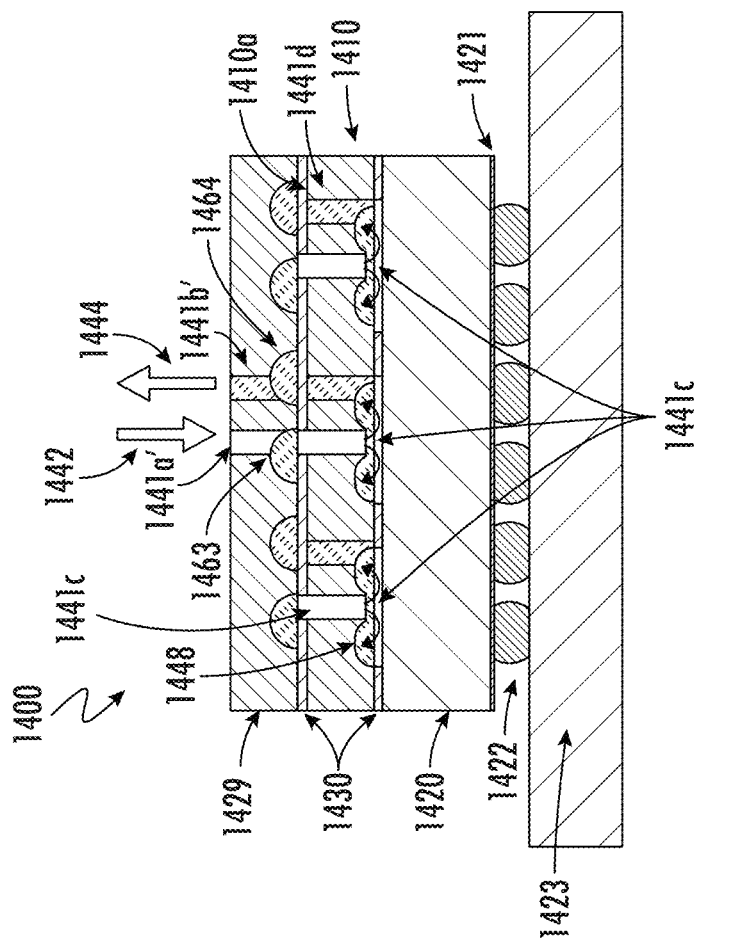
FIG. 24A illustrates a cross-sectional view of another example cooling manifold configured to jet impingement cooling, in accordance with some embodiments discussed herein.

In some embodiments, such as illustrated in FIGS. 24A-B, a third substrate 1429 may be bonded onto the first side 1410a of the first substrate 1410. The third substrate 1429 may be formed with at least one bottom surface cavity 1412 that creates two separate channel structures, a coolant distribution channel 1463 and a coolant return channel 1464. The third substrate 1429 may also provide two holes, a coolant inlet hole 1441a' that is connected to the coolant distribution channel 1463, and a coolant return hole 1441b' that is connected to the coolant return channel 1464.

The third substrate 1429 may be bonded to the first substrate 1410, for example, with a layer of nano-particles 1430, which in some embodiments, may be a thin layer of nano-particle. In other embodiments, a high temperature-resistant organic adhesives or silicone may be used. The third substrate 1429 may also be bonded to the first substrate 1410 using a thin layer of glass frit, where the glass frit melts and fuses the third substrate 1429 and the first substrate 1410 at high temperature. The glass frit can also be molded prior to assembly to create the at least one channel wall 1468, using a process like the one used to fabricate glass fluidic modules for Corning Incorporated's Advanced-Flow™ Reactor (AFR) business. The third substrate 1429 and the first substrate 1410 may also be hot pressed and then fused together through application of heat and pressure (again, like the process used to fabricate AFR glass fluidic modules).

In some embodiments, assembly 1400, including the third substrate 1429, may be assembled at wafer scale (see FIGS. 15A-H), and then separated into individual assemblies as illustrated in FIG. 24A.

In some embodiments, additionally functionality may be realized by extending a cooling manifold across multiple electronics surfaces. FIGS. 25A-E illustrate the formation of an assembly 1500 wherein the cooling manifold 1501 is disposed across a plurality of electronics surfaces.

FIGS. 25A-D illustrate a similar formation process to forming individual assemblies 1100 as depicted in FIGS. 15A-H, however, the first substrate 1510 is not diced into to create individual assemblies.

The first substrate 1510 may be designed to be aligned with the electronics surface 1220b of a plurality of second substrates 1520". The first substrate 1510 may be arranged with multiple holes 1541 with a thick layer of nano-particle medium 1536" disposed on the second side 1510b (as shown in FIG. 25A) of the first substrate 1510. In some embodiments, the thick layer of nano-particle medium 1536" may be in a grid shape, similar to that illustrated in FIG. 15C.

The plurality of second substrates 1520" may be aligned with the thick layer of nano-particle medium 1536" and bonded onto the first substrate 1510 as illustrated in FIG. 25B. In some embodiments, the bonding process ensures that the first surfaces 1520a (i.e., where the integrated circuits 1521 are located) of the plurality of second substrates 1520" fall in the same plane. In some embodiments, alignment may be accomplished by CMP (Chemical-Mechanical Polishing) processing of the plurality of second substrates 1520" to achieve a target thickness even when the plurality of second substrates 1520" are harvested from different wafers and/or fabricated from different semiconductor materials. Alternatively, the thickness of the thick layer of nano-particle medium 1536" may be adjusted for each of the plurality of second substrates 1520" to compensate for modest variations in the thicknesses of the plurality of second substrates 1520".

The plurality of second substrates 1520" may be bonded onto the first substrate 1510 via radiation heating of the thick layer of nano-particle medium 1536", such as by a laser 1552, or alternatively by heating in an oven, yielding a thick layer of nano-particles 1530"—bonding the first substrate 1510 and each of the electronics surfaces of the plurality of second substrates 1520". FIG. 25C illustrates that the first substrate 1510 is configured to support the plurality of second substrates 1520", thereby simplifying handling, and enabling testing to confirm chip operation.

Figure 25D:
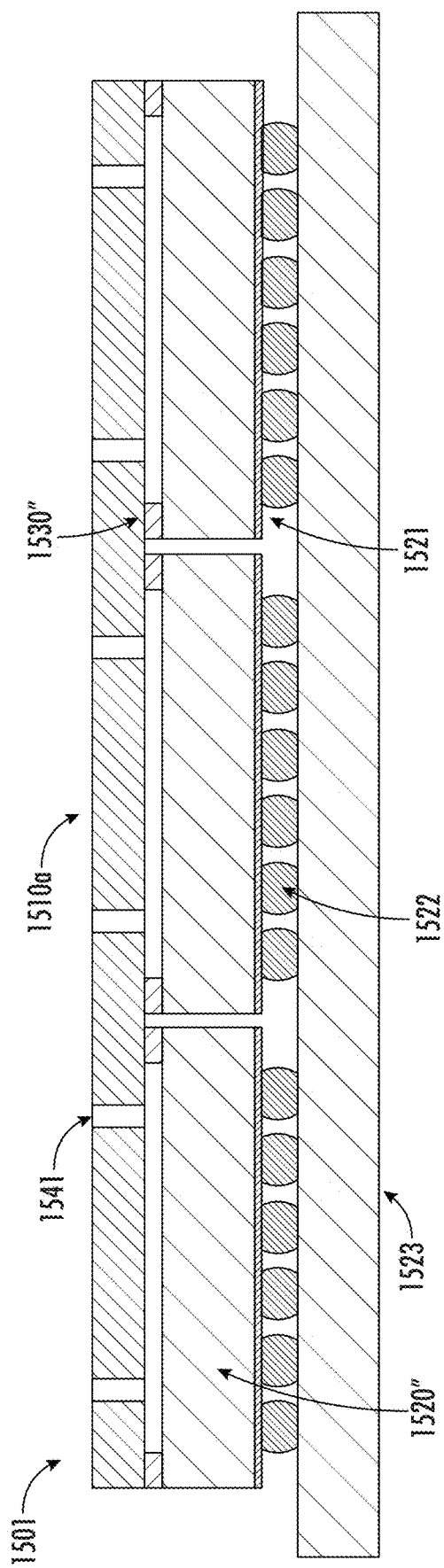

In some embodiments, as illustrated in FIG. 25D, the cooling manifold 1501 may be bonded onto a PCB 1523 via a plurality of solder balls 1522. The plurality of solder balls 1522 may be applied to the PCB 1523, or to the integrated circuits 1521 on the second side of the plurality of second substrates 1520". The thick layer of nano-particles 1530" will survive the solder reflow heating process without allowing the plurality of second substrates 1520" to misalign and shift laterally.

Figure 25E:
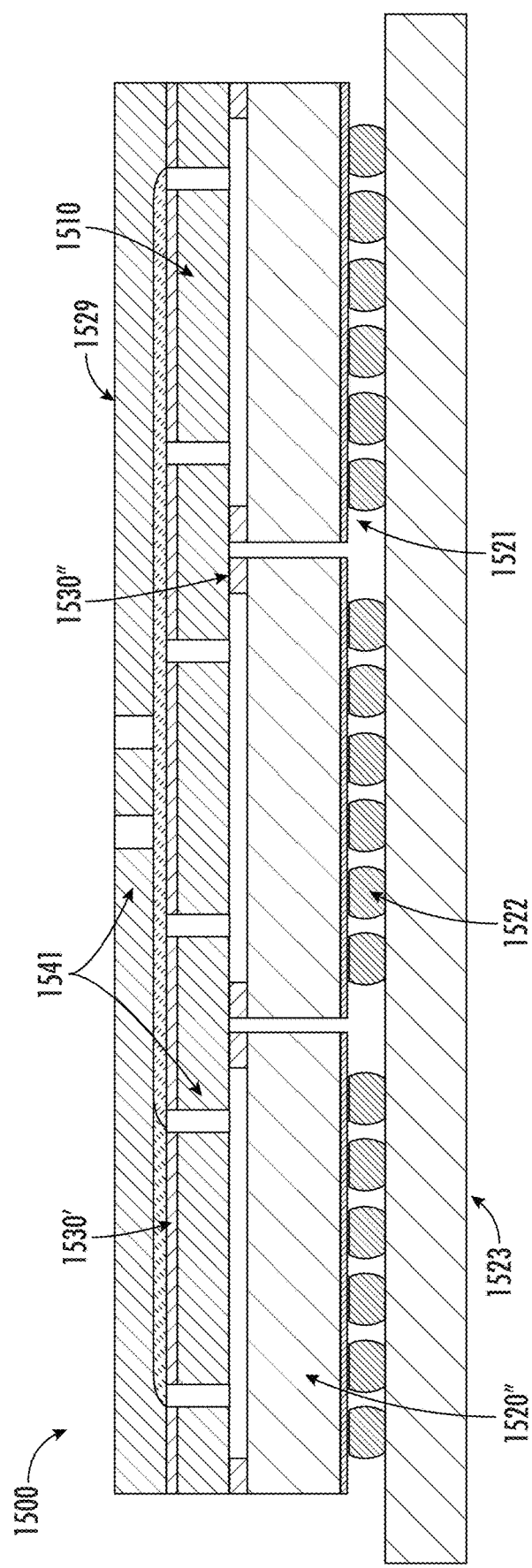
FIG. 25E illustrates a cross-sectional view of the completed example cooling manifold shown in FIGS. 25B-25D, in accordance with some embodiments discussed herein.

After assembly, fluidic interconnections can be made to the holes 1541 through the first substrate 1510 (see FIGS. 22A-24B). In some embodiments, as depicted in FIG. 25E, a third substrate 1529 may be joined to the first side of the first substrate 1510 before or after the solder reflow process, so that the third substrate 1529 is bonded to the first substrate 1510 via a thin layer of nano-particles 1530' disposed between the first substrate 1510 and the third substrate 1529.

Notably, in some embodiments, such as illustrated in FIG. 26, the third substrate 1529 may be bonded to the first substrate 1510 before the plurality of second substrates 1520" are attached to the first substrate 1510. As discussed, this approach has the advantage that the thin layer of nano-particles 1530' and the thick layer of nano-particles 1530" will not shift during subsequent solder reflow processing.

Figure 27:
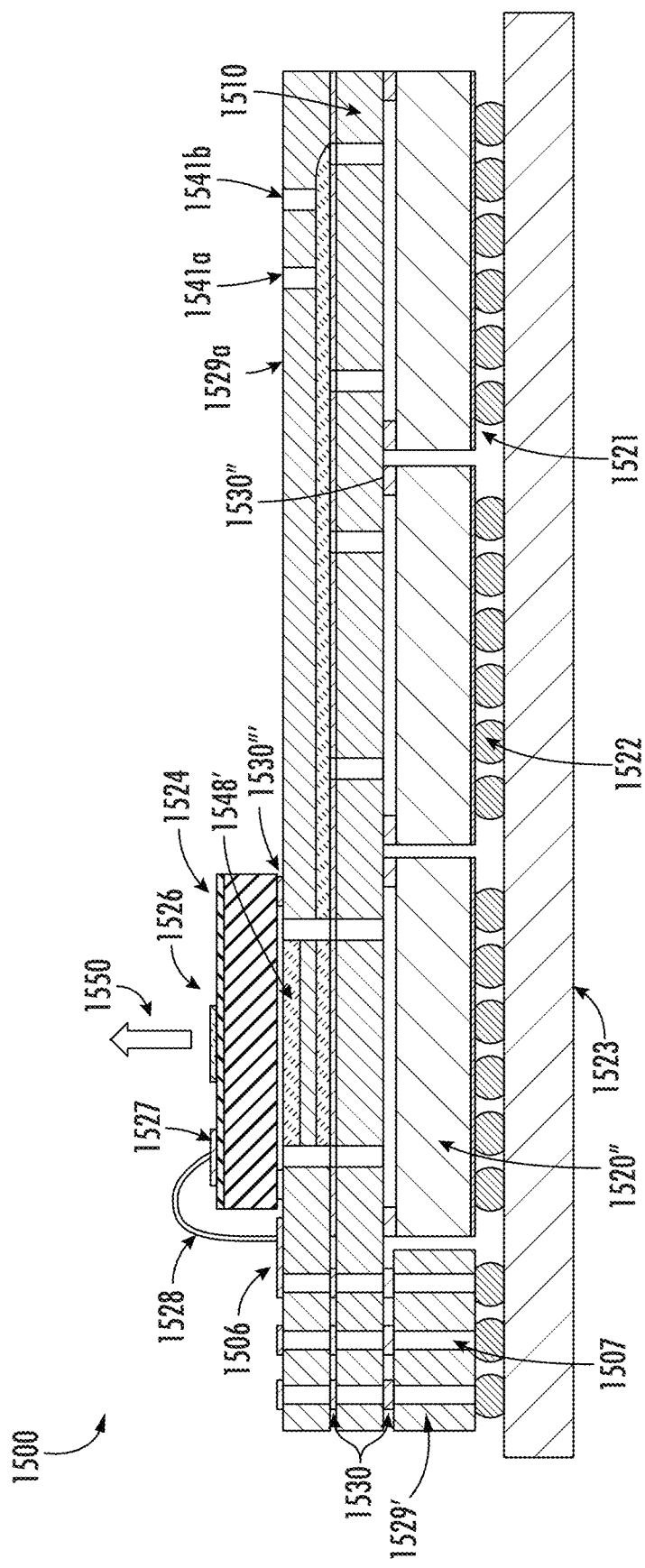
FIG. 27 illustrates a cross-sectional view of another example cooling manifold, in accordance with some embodiments discussed herein.

As mentioned above, the cooling manifold assembly 1500, may provide additional functions in electronic packaging. For example, as illustrated in FIG. 27, at least one chip 1524 may be bonded to a top surface 1529*a* of the third substrate 1529, with a layer of nano-particles 1530''' deposited to make a leak-free seal around the chip 1524 perimeter. In some embodiments, the chip 1524 may be a VCSEL (Vertical Cavity Surface Emitting Laser) optoelectronic. The third substrate 1529 may include a cavity 1548 in the top surface 1529*a* to guide the coolant fluid beneath the chip 1524.

The chip 1524 may be electrically connected to at least one nano-particle trace 1506 deposited on the top surface 1529*a* of the third substrate 1529. The at least one trace 1506 is electrically connected to at least one nano-particle via 1507. The at least one nano-particle via 1507 may be constructed by filling at least one laser-formed hole in the first substrate 1510, the third substrate 1529 and in some embodiments a fourth substrate 1529' with nano-particles. The at least one nano-particle via 1507 may extend vertically through the first substrate 1510, the third substrate 1529, and optionally the fourth substrate 1529', with electrical connections made between aligned nano-particle vias 1507 using at least one deposit of nano-particles 1530. The at least one nano-particle via 1507 may be electrically connected to conductors and other components within the PCB 1523 using solder balls 1522. In some embodiments, the fourth substrate 1529' may be used in place of one of the plurality of second substrates 1520". In some embodiments, the fourth substrate 1529' may be a glass sheet. In other embodiments the trace 1506 and the vias 1507 may be implemented with traditional electronic interconnection materials (e.g., copper).

The assembly 1500, including the integrated circuit 1521, and the chip 1526 may be assembled and tested prior to its attachment on the PCB 1523 via the solder balls 1522. The high temperature-resistant nano-particle bonds ensure that through subsequent high temperature solder reflow processing steps the first substrate 1510, plurality of second substrate 1520", the third substrate 1529, and optionally the fourth substrate 1529' remain stable and aligned to one another.

More generally, the assembly 1500 may include both electrical traces, formed using traditional electrical trace fabrication techniques or nano-particle deposition. In some embodiments, the assembly 1500 may also include features required for optoelectronic integration and connector integration, such as laser written optical waveguides and precision connector alignment features, such as laser damage and edge alignment pin holes, precision passive alignment stops, and fiber alignment V-grooves.

In some embodiments, glass may be a suitable material for the first substrate 1510 because of its low thermal conductivity. This allows neighboring substrates of the plurality of second substrates 1520" to operate at different temperatures and under different heat removal conditions, where the first substrate 1510 helps insulate the plurality of second substrates 1520" from one another. In some embodiments, this may prevent problems such as thermal cross-talk, where a hot substrate may lead to excessive heating of its neighboring substrates. The glass within the first substrate 1510 also helps insulate the coolant fluid from its surroundings, including the ambient environment and nearby excessively hot substrates. This helps guarantee that the coolant fluid is delivered to each one of the plurality of electronics surfaces at the correct temperature, and may reduce the likelihood of heated coolant fluid in return channels from pre-heating cool coolant fluid that has yet to be delivered to the plurality of electronics surfaces.

Example Ceramic Cooling Manifolds

Ceramic cooling manifolds may be applied to electronics surfaces to cool electronics equipment. In contrast to glass cooling manifolds as discussed above, ceramic cooling manifolds may be manufactured with a CTE matching formula to minimize shear stress at the interface between the ceramic surface and the electronics surface. FIGS. 28A-D illustrate the formation of an assembly 1600 utilizing a ceramic cooling manifold.

FIGS. 28A-B illustrate the formation of an example ceramic jet impingement cooling manifold 1601. The jet impingement cooling manifold 1601 is made from a first substrate 1610 bonded to a third substrate 1629 using a thin layer of nano-particles 1630' The first substrate 1610 and third substrate 1629 may be made from a ceramic material, for example silicon carbide (SiC), and in some embodiments, may include other material to more closely match the CTE of an electronics surface.

The jet impingement cooling manifold 1601 may be configured similarly to the glass jet impingement cooling manifold illustrated in FIGS. 24A-B. The first substrate 1610 may include at least one jet impingement hole 1641*c* in fluid communication with at least one coolant return hole 1641*d* via at least one cavity 1648 configured for a coolant fluid.

The third substrate 1529 may have a first hole 1641*a* and a second hole 1641*b* for the coolant fluid 1657 to flow through. The third substrate may further define a coolant fluid distribution cavity 1663 in fluid communication with the at least one jet impingement hole 1641*c* and a coolant fluid return cavity 1664 in fluid communication with the at least one coolant return hole 1641*d*.

The first substrate 1610 and the third substrate 1629 may be shaped in the green state via pressing, machining, and drilling. In some embodiments, the first hole 1641*a*, the second hole 1641*b*, the at least one jet impingement hole 1641*c*, the coolant fluid distribution cavity 1663 etc. may be shaped in the green state. For example, a ribbon of ceramic material may be extruded or tape cast, and then patterned using a roller or press mold form. The ceramic plates may then be debound and fired. Additional grinding may be necessary on mating top and bottom surfaces to eliminate any large gaps that occur when substrates are stacked.

The first substrate 1610 and the third substrate 1629 may be fabricated from high thermal conductivity materials, such as SiC, aluminum nitride (AlN), or silicon nitride or composite materials containing, for example, diamond particles or carbon fibers. In this case, heat may travel through the first substrate 1610 and the third substrate 1629 to provide effective cooling, in addition to the cooling provided by the jet impingement cooling via the coolant fluid. This configuration is well-suited for traditional (e.g., non-jet impingement) electronics cooling approaches, where the coolant fluid 1657 flows through channels, between the first substrate 1610 and the electronics surface.

As illustrated in FIG. 28C, the cooling manifold 1601 may be attached onto a second substrate 1620 using the thin layer of nano-particles 1630'. Additionally or alternatively, if a thick layer of nano-particles is used, any gaps between the first substrate 1610 and the second substrate 1620 may be filled by the thick layer of nano-particles as the downward force is applied. In some embodiments, a thin layer of nano-particle medium may be sintered by, for example, laser or infrared (IR) heating of a top surface of the third substrate 1629 and heat conduction through the ceramic material—yielding the thin layer of nano-particle 1630' securing the first substrate 1610 and the electronics surface of the second substrate 1620.

As discussed above, the ceramic material may be selected to minimize the CTE mismatch between the first substrate 1610 and the second substrate 1620, specifically an integrated circuit 1621. The thin layer of nano-particles 1630' may be CTE-matched to minimize shear stress between the first substrate 1610 and the second substrate 1620.

In some embodiments, when a large CTE mismatch exists between the first substrate 1610 and the second substrate 1620 the fluidic seal between the first substrate 1610 and the second substrate 1620 may be implemented using a low modulus adhesive or sealant, such as a silicone sealant. In some embodiments, the adhesive or sealant may be in addition to the thin layer of nano-particles 1630' and in some embodiments, it may be in place of the thin layer of nano-particles 1630'.

As shown in FIG. 28D, the assembly 1600 may be attached to a PCB 1623 via solder balls 1622.

Example Ceramic Honeycombs

Ceramic honeycombs may be directly applied to electronic surfaces using a layer of nano-particles to cool electronic equipment. In contrast to the cooling manifolds as discussed above, ceramic honeycombs utilize space within the structure to dissipate heat from the electronics surface. FIGS. 29A-30B illustrate the formation and use of ceramic honeycombs.

Figure 29B:
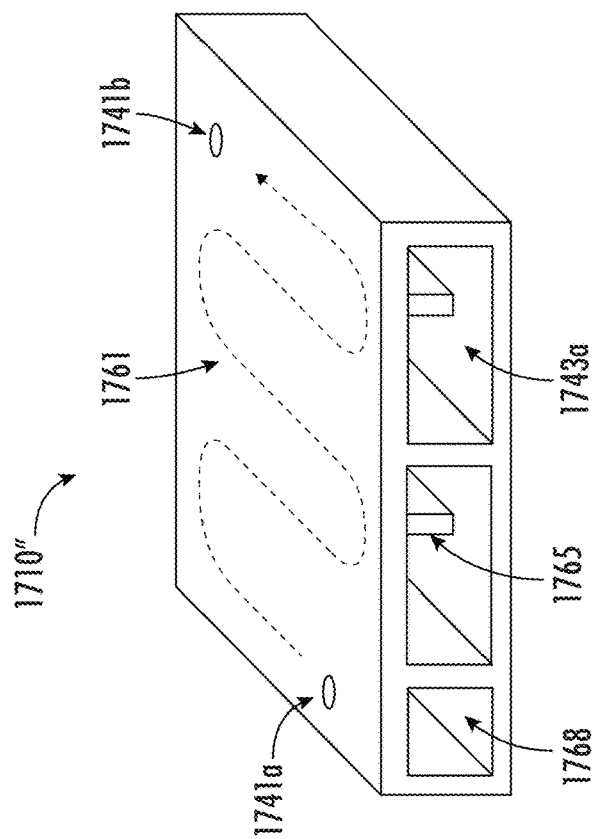
Figure 29A:
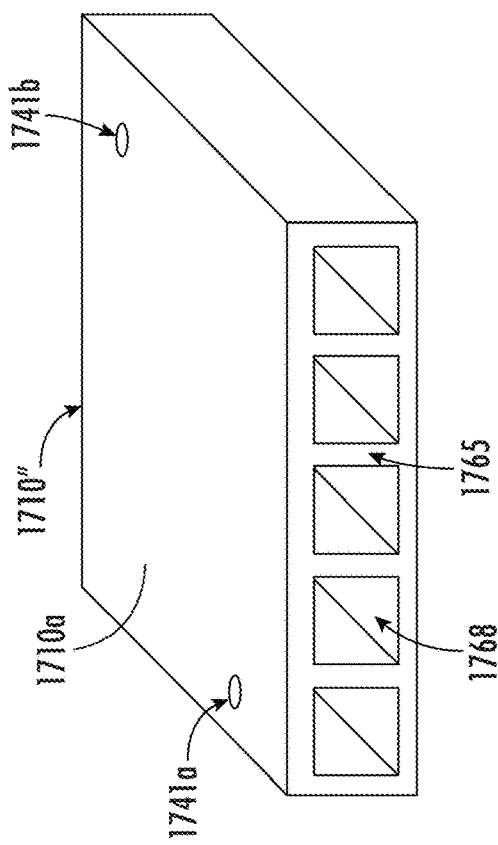

FIG. 29A illustrates an extruded honeycomb structure 1710". The extruded honeycomb structure 1710" may define at least one channel 1768 defined by at least one channel wall 1765 extending though the extruded honeycomb structure 1710". After extrusion, a first hole 1741a and a second hole 1741b may be drilled into a top surface 1710a of the extruded honeycomb structure 1710" to intercept the at least one channel 1768.

In some embodiments, while the extruded honeycomb structure 1710" is in the green state, select portions of the plurality of channel walls 1765 may be removed to form at least one channel U-bend 1743a, creating a coolant path 1761 through the extruded honeycomb structure 1710", as illustrated in FIG. 29B. In some embodiments, the coolant path 1761 may be serpentine, and in other embodiments, the coolant path 1761 may be a tortuous path. In some embodiments, portions of the at least one channel wall 1665 may be removed via a plunge machining operation using a router. Additionally or alternatively, in some embodiments, holes may be drilled at an angle through the at least one channel wall 1765 to create the U-bends 1768a within the at least one channel 1768.

The extruded honeycomb structure 1710" may be sealed with an end cap 1781 disposed over each end of the extruded honeycomb structure 1710". In some embodiments, the end caps 1781 may be formed as a ceramic sheets and may be bonded on to the extruded honeycomb structure 1710" using a layer of nano-particles 1730, as illustrated in FIG. 29C.

FIG. 29D illustrates a first substrate 1710 after the layer of nano-particles secures the end caps 1781 to the ends of the extruded honeycomb structure 1710". In other embodiments the channel ends are sealed by filling them with a potting material, such as a silicone sealant.

Figure 30B:
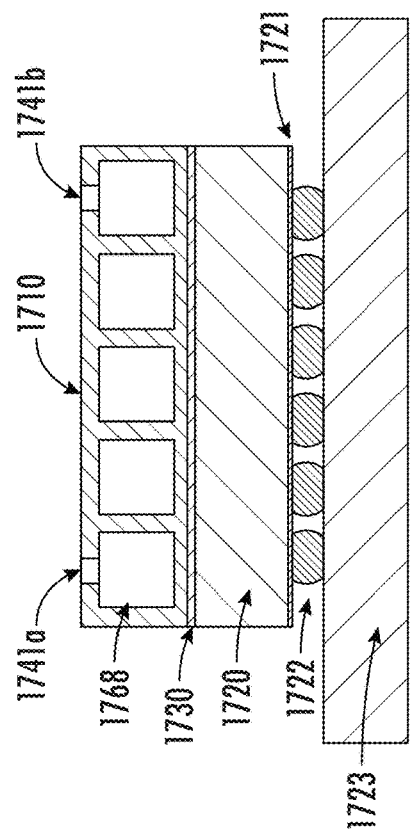
FIGS. 30A-30B illustrate cross-sectional views of formation of an example cooling manifold, in accordance with some embodiments discussed herein.
Figure 30A:
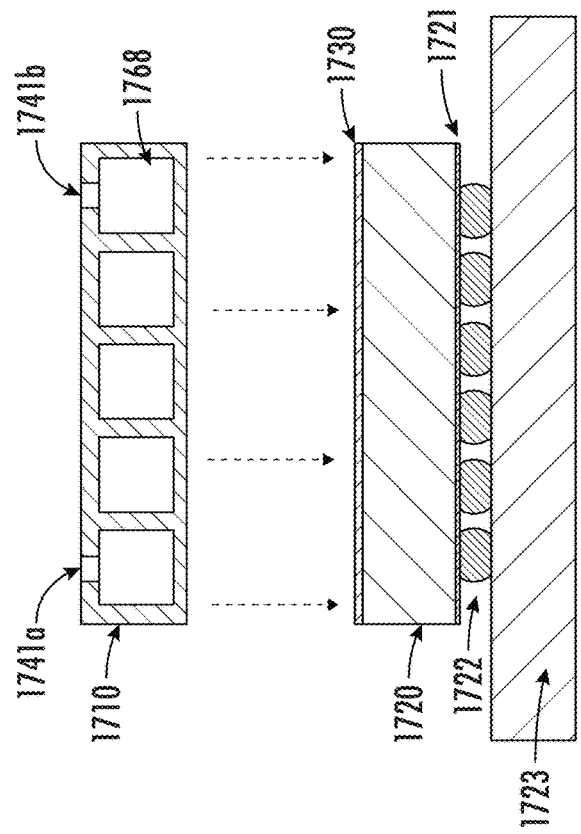

FIGS. 30A-B illustrate formation of a cooling assembly 1700 using the first substrate 1710 to dissipate the heat generated by an electronics surface of a second substrate 1720. In some embodiments, the first substrate 1710 may be used as a cooling plate that may be bonded onto the electronics surface of the second substrate 1720 using a layer of nano-particles 1730. An advantage of using the layer of nano-particles 1730 is that the layer of nano-particles 1730 does not require metallization of the second side of the first substrate 1710 or the electronics surface of the second substrate 1720. Further, the layer of nano-particles 1730 may provide a high thermal conductivity path between the second substrate 1720 and the first substrate 1710.

As mentioned above, it may be important to have a good CTE match between the first substrate 1710 and the second substrate 1720. For example, if the second substrate 1720 is a high power silicone carbide (SiC) chip, then there is a good match to the SiC extruded honeycomb structure 1710" cooling plate. However, if a CTE match is required with silicon, the first substrate 1710 (e.g., the extruded honeycomb substrate 1710 and end caps 1781) may be made using sintered silicon metal powder, or a metal powder composite of silicon with low CTE ceramics (e.g., silicon nitride) and higher CTE ceramics (e.g., SiC).

Example Heat Pipe Cooling Manifolds

In some embodiments, the first substrate may be configured as a heat pipe. A key function of a heat pipe is to transfer heat from a hot location that is difficult to cool effectively due to limited surface area or surrounding volume to a nearby location where a larger cooling surface can be provided. Heat pipes do not require any external power for operation, but they do require an internal wick or other means (e.g., gravity) to transfer condensed working fluid to the heat source.

Heat pipes may be fabricated from high thermal conductivity materials, because heat must pass through the heat pipe walls at both the evaporator and condenser sections. One challenge with practical heat pipe designs is that most high thermal conductivity materials have CTEs that are not matched to silicon. As a result, thin layers of thermal pastes or grease are required to fill the gap between the hot electronic component and the heat pipe materials (often metals), where these materials introduce unwanted additional thermal resistance along the heat transfer path.

An example heat pipe 1803, as illustrated in FIG. 31A, is a sealed tube containing a fluid 1857 that operates in a loop to extract energy from a heat source or heat input 1853 (e.g., an electronics chip) at one location and transfers it to another, cooler location. In some embodiments, the fluid 1857 may be a liquid working fluid. In an example sealed heat pipe 1803, the heat input 1853, or evaporator section 1855, causes the coolant fluid 1857 to evaporate into a vapor 1858. The vapor 1858 flows to a cooler condenser section 1856, where the vapor 1858 condenses and outputs heat 1854 to the cooler exterior of the heat pipe.

The fluid 1857 may build up in the condenser section 1856 and flood a porous wick 1859 on the inside of the heat pipe 1803. The porous wick 1859 may cause the fluid 1857 to travel along the heat pipe until the coolant fluid 1857 reaches the evaporator section 1855. Once there, the coolant fluid 1857 re-evaporates and the heat transfer cycle continues indefinitely.

An example heat pipe 1803 for cooling an electronic component is shown in FIG. 31B. The heat pipe 1803 includes an array of copper tubes 1803a that are pinched and sealed at both ends. The condenser section 1856 of the array of copper tubes 1803a is bonded to a metal fin array 1804 to enable forced or free air convection cooling. The evaporator section 1855 of the array of copper tubes 1803*a* may surround a mounting block 1808 configured to receive the heat input 1853 from an electronic component.

Figure 32C:
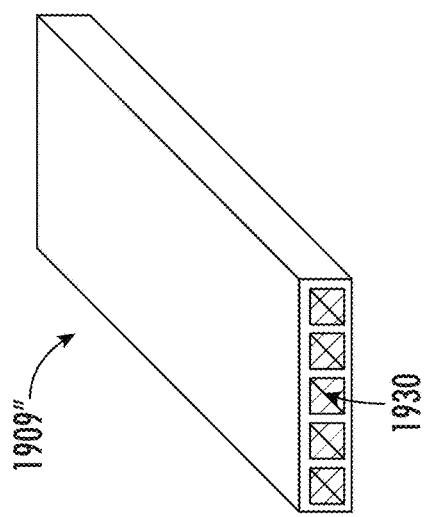
FIGS. 32A-32C illustrate perspective views of example heat pipes, in accordance with some embodiments discussed herein.
Figure 32B:
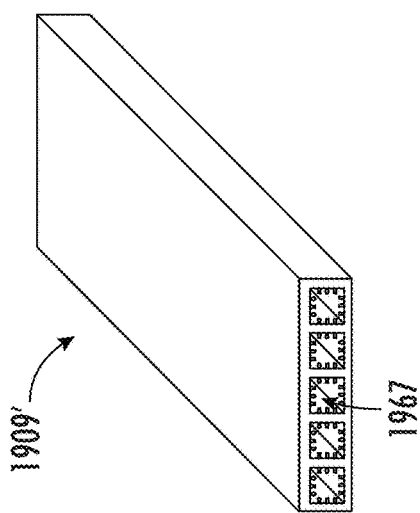
Figure 32A:
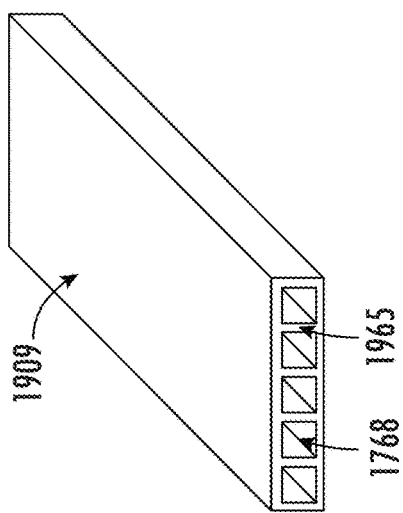

In some embodiments, heat pipes may be formed from extruded honeycomb substrates made of thermally conductive ceramic materials (e.g., SiC, AlN). FIGS. 32A-C illustrate example extruded honeycomb substrates 1909 formed with at least one channel wall 1965, thereby defining at least one channel 1943. FIG. 32A illustrates an extruded honeycomb substrate 1909 wherein the at least one channel 1943 may be configured with a square cross-section. FIG. 32B illustrates an extruded honeycomb substrate 1909', where the extrusion process may be used to form a plurality of small fin structures 1967 on the at least one channel wall 1965. The plurality of small fin structures 1967 may help wick the coolant fluid via surface tension. In some embodiments, the plurality of small fin structures 1967 may be used with other honeycomb structures. FIG. 32C illustrates an extruded honeycomb substrate 1909" wherein the at least one channel 1943 may be wash coated with a layer of nano-particles 1930. In some embodiments, the layer of nano-particles 1930 may act as a porous wick to wick the coolant fluid through the at least one channel 1943.

Figure 33:
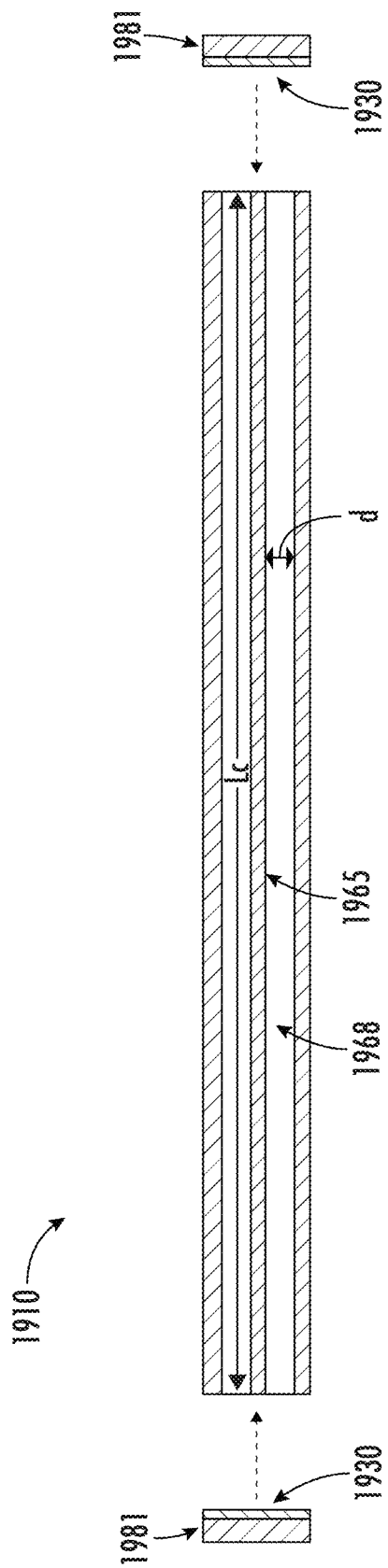
FIG. 33 illustrates a cross-sectional view of formation of an example heat pipe, in accordance with some embodiments discussed herein.

In some embodiments, the extruded honeycomb substrate 1909 may be formed into a heat pipe 1910. FIG. 33 illustrates the formation of the heat pipe 1910 by bonding two end caps 1981 onto the ends of the extruded honeycomb substrate 1909 with the layer of nano-particles 1930. In some embodiments, the heat pipe 1910 may be formed by joining a first end cap 1981 onto the extruded honeycomb substrate 1909, introducing the coolant fluid into the at least one channel 1968, and joining a second end cap 1981 opposite the first end cap 1981. In some embodiments, the coolant fluid only fills a fraction of the channel length $L_C$.

In some embodiments, the heat pipe 1910 may be configured such that during formation of the heat pipe 1910, the heat required to sinter the layer of nano-particles 1930 disposed between the end caps 1981 and the extruded honeycomb substrate 1909 may be contained locally (e.g., the heat does not travel through the extruded honeycomb substrate 1909) and thereby does not cause unwanted heating of the coolant fluid 1957.

Figure 34A:
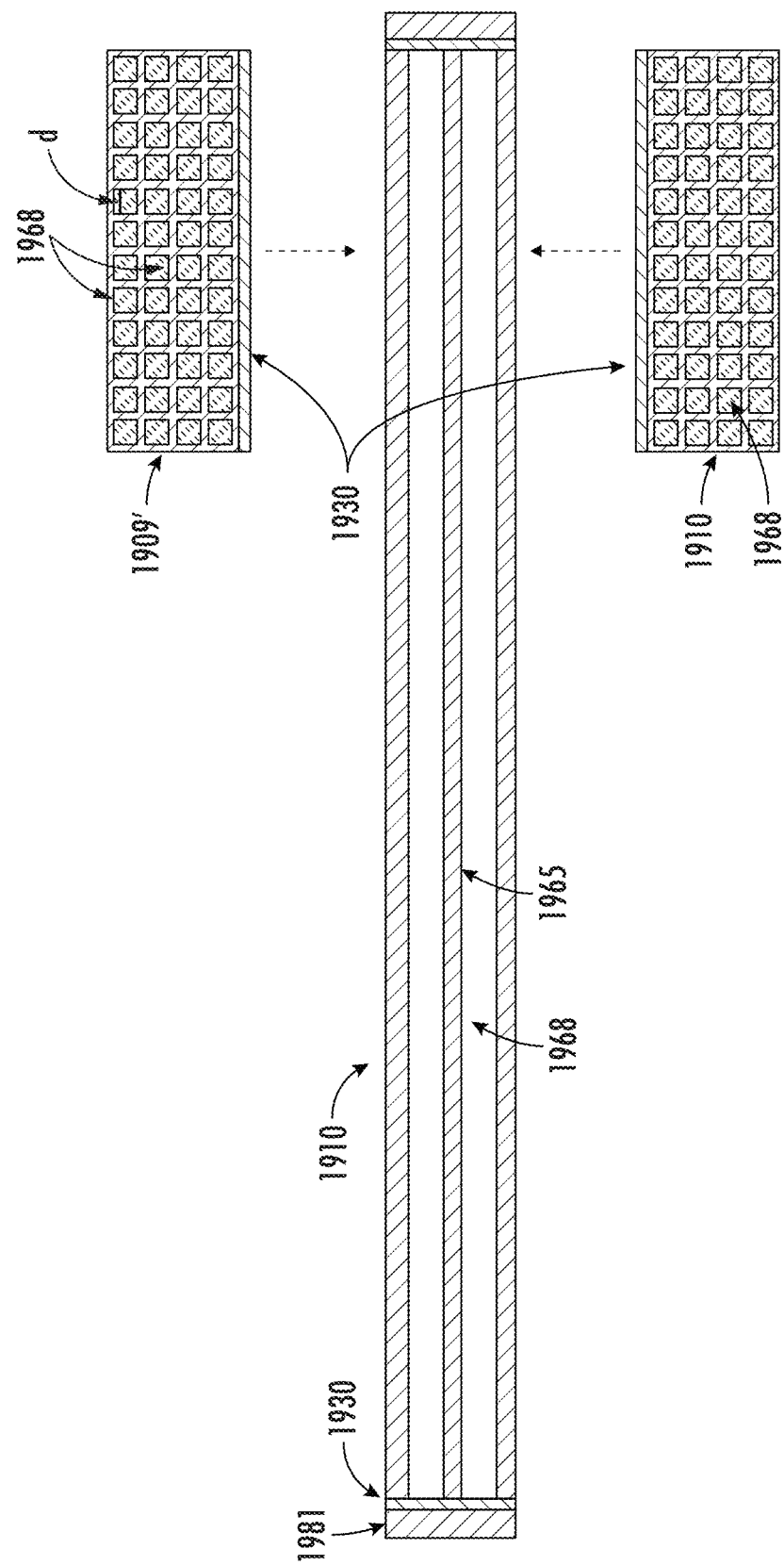
FIGS. 34A-34C illustrate cross-sectional views of formation of an example heat pipe assembly for cooling electronics equipment, in accordance with some embodiments discussed herein.
Figure 34B:
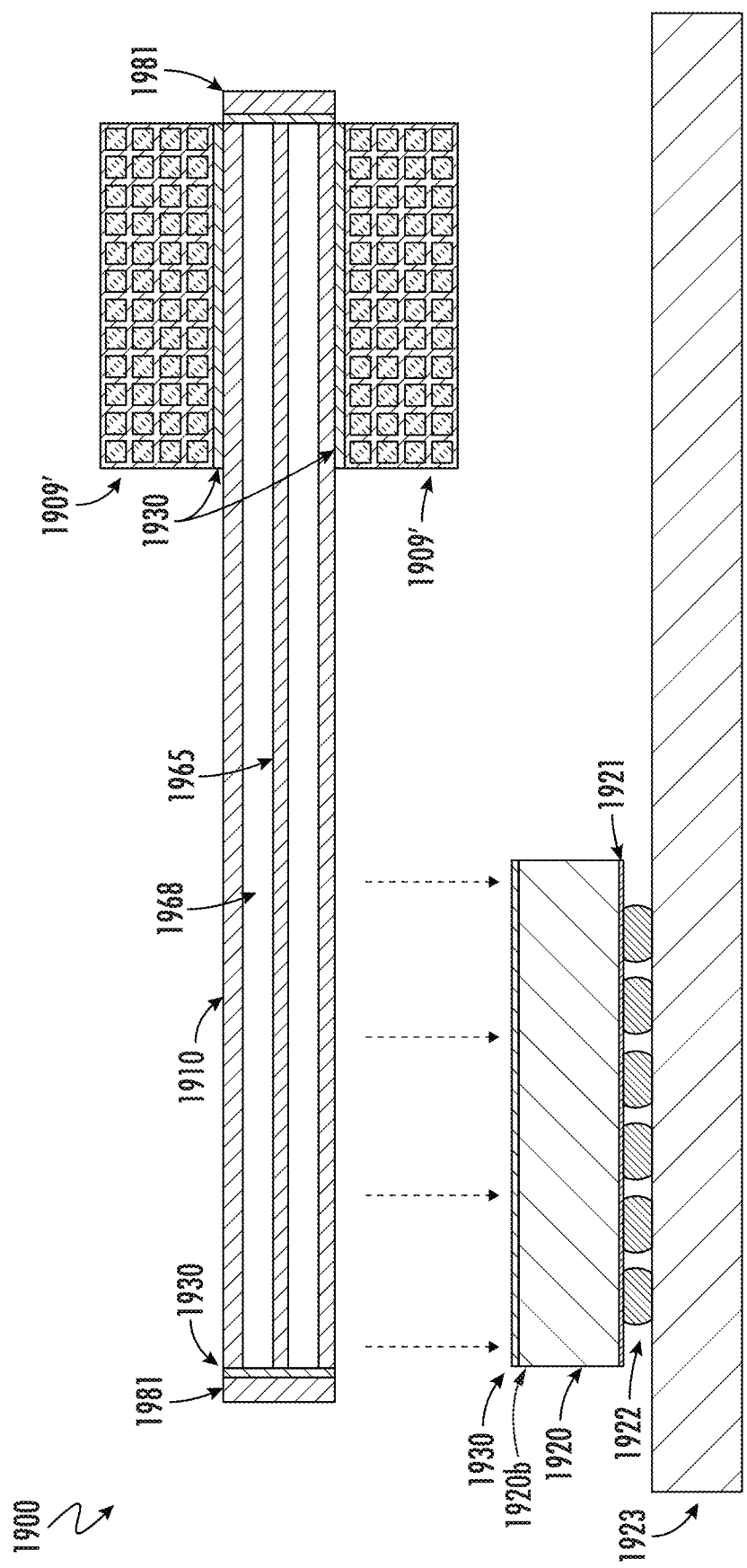
Figure 34C:
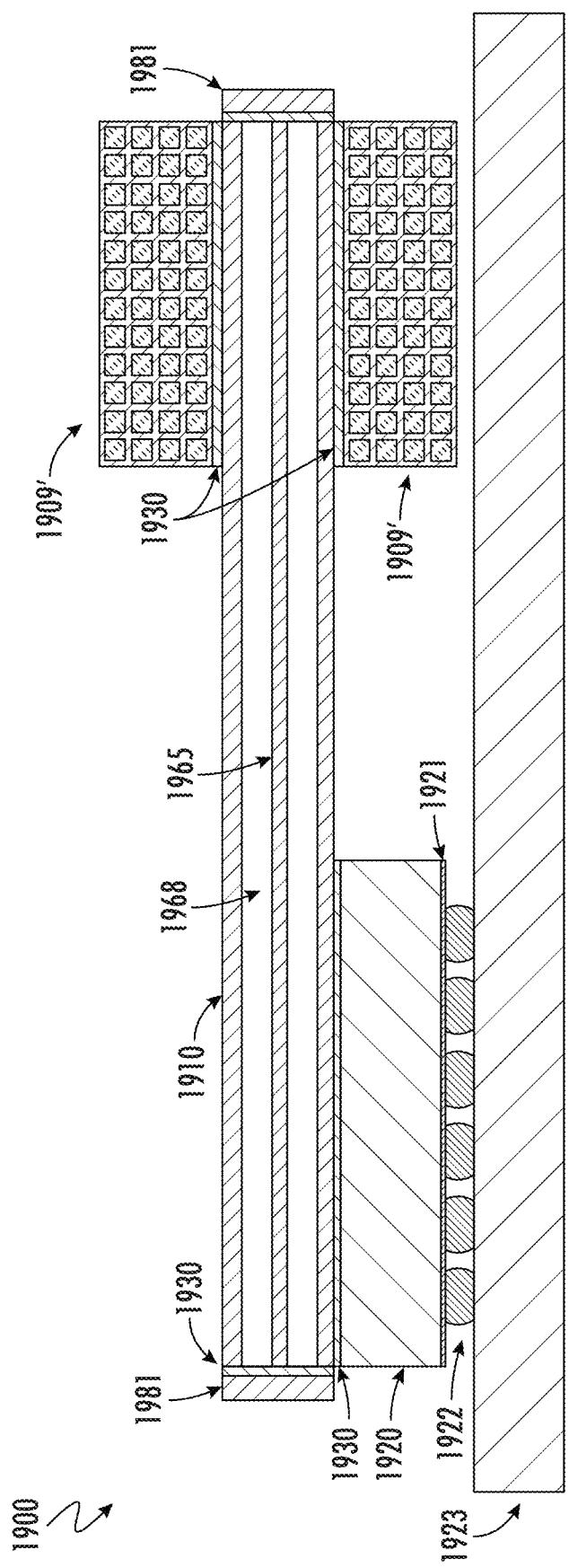

In some embodiments, a heat pipe may be used in conjunction with extruded honeycomb substrates 1909 to create an assembly 1900 to dissipate heat from an electronics surface 1920*b*. FIGS. 34A-C illustrate formation of the assembly 1900.

FIG. 34A illustrates the heat pipe 1910, configured as a first substrate in the cooling assembly 1900. In some embodiments, at least one extruded honeycomb structure 1909' may be attached with a layer of nano-particles.

The at least one extruded honeycomb structure 1909' may be configured as a condenser section. In some embodiments, the at least one extruded honeycomb structure 1909' may transfer heat from the heat pipe 1910 to the ambient environment via free or forced air convection. The at least one extruded honeycomb substrate 1909' may be fabricated with at least channel 1968. The at least channel 1968 may be configured with a small square cross-section. In some embodiments, the cross-section (e.g., channel width) may have a distance d of 1 mm or smaller between the at least one channel wall 1965. The configuration of the extruded honeycomb structure 1909' may increase the heat transfer between the at least one channel 1968 and the at least one channel wall 1965 by increasing the Nusselt number Nu (where the heat transfer coefficient h=Nu d k/2, where k is the thermal conductivity of the coolant fluid 1957). In some embodiments, smaller channels may increase total channel sidewall area available for heat transfer.

FIGS. 34B-C illustrate formation of the assembly 1900 through attachment of the heat pipe 1910 to an electronics surface 1920*b* of a second substrate 1920 (e.g., a semiconductor chip) using the layer of nano-particles 1930. In some embodiments, the second substrate 1920 may form the evaporator section, wherein heat is transferred from electronics equipment associated with the electronics surface 1920*b*, to the heat pipe 1910. In some embodiments, the composition of the ceramic material used to form the heat pipe 1910 may be adjusted to align the CTE of the heat pipe 1910 and the second substrate 1920.

In some embodiments, a heat pipe 1910' may be assembled by stacking sheets of ceramic material and bonding the sheets of ceramic material together using a layer of nano-particles 1930. FIGS. 35A-37B illustrate constructions of the heat pipe 1910' using various ceramic plates 1983, channel walls 1984, and placements of a layer of nano-particles 1930.

In some embodiments, two ceramic plates 1983 may each provide a long cavity that forms three sides of a channel 1985. The two ceramic plates 1983 may sandwich a ceramic sheet 1984 used to form the fourth side of each of the channels 1968.

Figure 35A:
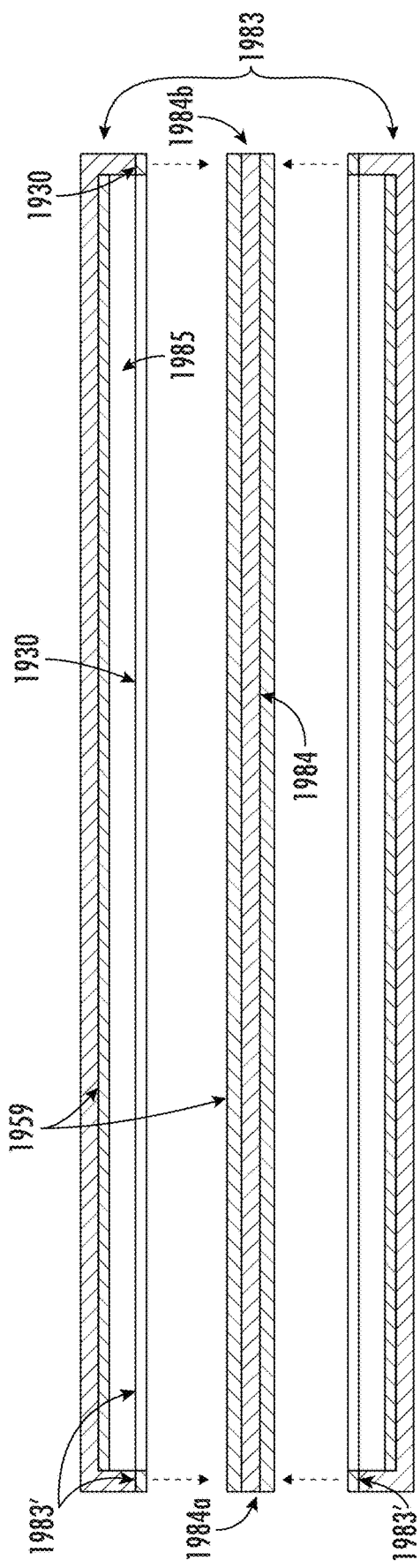
FIGS. 35A-35B illustrate cross-sectional views of formation of an example heat pipe, in accordance with some embodiments discussed herein.
Figure 35B:
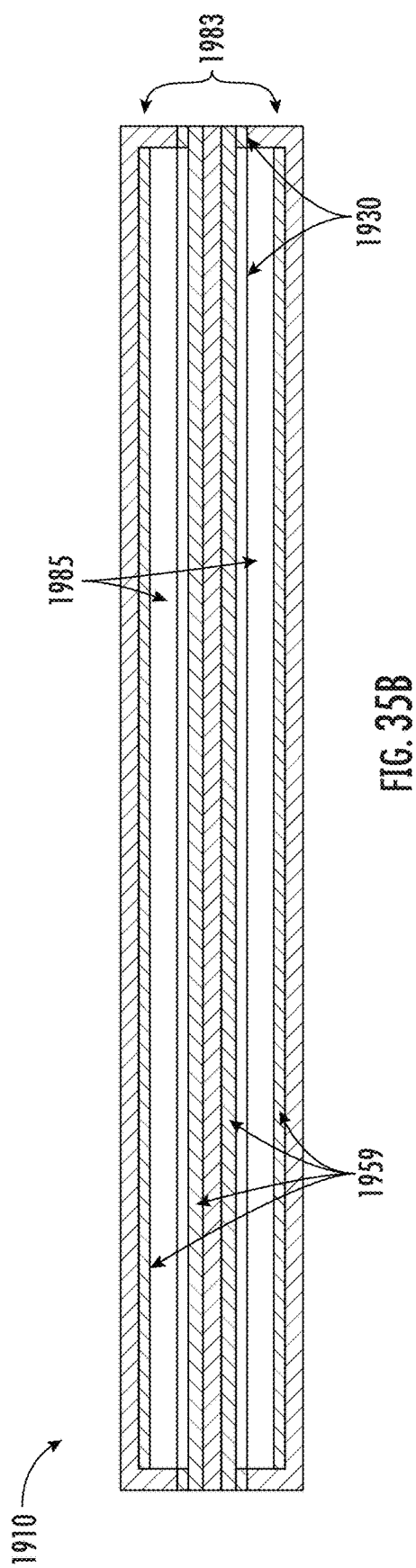

FIGS. 35A-B illustrate the formation of a first example assembly of heat pipe 1910'. The layer of nano-particles 1930 may be applied the along the rim 1983' of each of the two ceramic plates 1983. The layer of nano-particle 1930 may be disposed between a first end 1984*a* and a second end 1984*b* of the ceramic sheet 1984. The two ceramic plates 1983 and the ceramic sheet 1984 may be stacked together to form the heat pipe 1910' adhered by the layer of nano-particles 1930. During assembly, the layer of nano-particles 1930 disposed about the rim 1983' of the ceramic plates 1830 may be compressed into a dense layer of nano-particles 1930.

In some embodiments, the two ceramic plates 1983 and the ceramic sheet 1984 may be heated such that layer of nano-particles 1930 sinter together and form porous network and act as a heat pipe wick 1959.

In some embodiments, the layer of nano-particles 1930 may be sintered in stages. For example, the layer of nano-particles 1930 deposited in sealing regions around the rim 1983*a* may be sintered with localized heating to seal the heat pipe 1910' via focused application of laser heating. Other locations of the two ceramic plates 1983 may be kept cool, thereby preventing sintering of the other layers of nano-particles 1930 by mounting them on a cold plate or heat sink, to prevent the sealing bonding heating process from altering the microstructure of the layer of nano-particles 1930 forming the heat pipe wick 1959.

In some embodiments, the heat pipe 1910' may include a port or unsealed region around the rim 1983' where the coolant fluid may be introduced. For example, the heat pipe 1910' may be heated to a high temperature and then cooled suddenly so that the resulting internal pressure drop draws the coolant fluid through the port or unsealed region 1987 into the heat pipe 1910'. Then the port or unsealed region may be sealed using an additional layer of nano-particles 1930, or another sealing solution such as a sealing plate applied over the port and bonded in place using the layer of nano-particles 1930 that is subsequently sintered.

In another example assembly, illustrated in FIGS. 36A-B, the layer of nano-particles 1930 may be disposed about the rim 1983' of each of the two ceramic plates 1983. The rim 1983' may be the bonding region between the two ceramic plates 1983 and the ceramic sheet 1984. The layer of nano-particles 1930 disposed about the rim 1983' may be configured to join the heat pipe 1910. In some embodiments, the wick 1959 may be formed by a layer of nano-particles 1930"". The layer of nano-particles 1930"" may be more porous than the layer of nano-particles 1930 disposed on the rim 1983' as the layer of nano-particles 1930 disposed on the rim 1983' may be more highly filled layer of nano-particles 1930 (e.g., see FIGS. 4A-4B). In some embodiments, the channel 1985 may be coated with the layer of nano-particles 1930"" forming the wick 1959. In some embodiments, the wick 1959 may be patterned by selectively printing the layer of nano-particles 1930"". In some embodiments, the wick 1959 may extend along the ceramic sheet 1984 from the first end 1984a to the second end 1984b, and the layer of nano-particles 1930 configured to bond the two ceramic plates 1983 and the ceramic sheet 1984 may engage with the layer of nano-particles 1930"" of the wick 1959.

Figure 37A:
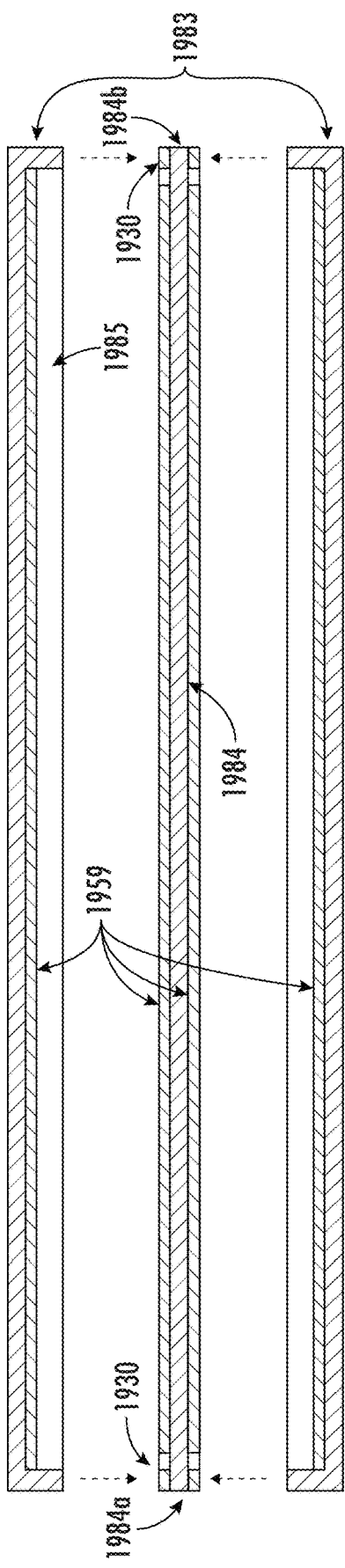
FIGS. 37A-37B illustrate cross-sectional views of formation of an example heat pipe, in accordance with some embodiments discussed herein.
Figure 37B:
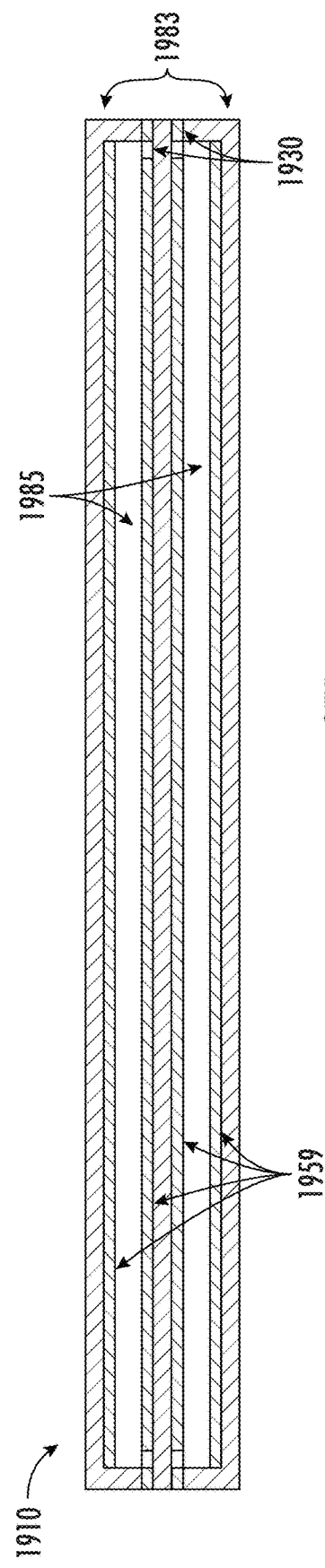

In another example embodiment, illustrated in FIGS. 37A-B, the layer of nano-particles 1930 may be disposed along edges of the third ceramic plate 1984 rather than along the rim 1983'. The wick 1959 may extend along the ceramic sheet 1984 between the first end 1984a and the second end 1984b, without reaching the layer of nano-particles 1930 about the edges (e.g., along the first end 1984a, and the second end 1984b) of the third ceramic sheet 1984. The wick 1959 may extend partially between the first end 1984a or the second end 1984b, thereby allowing the layer of nano-particle 1930 to seal the heat pipe 1910.

Figure 38A:
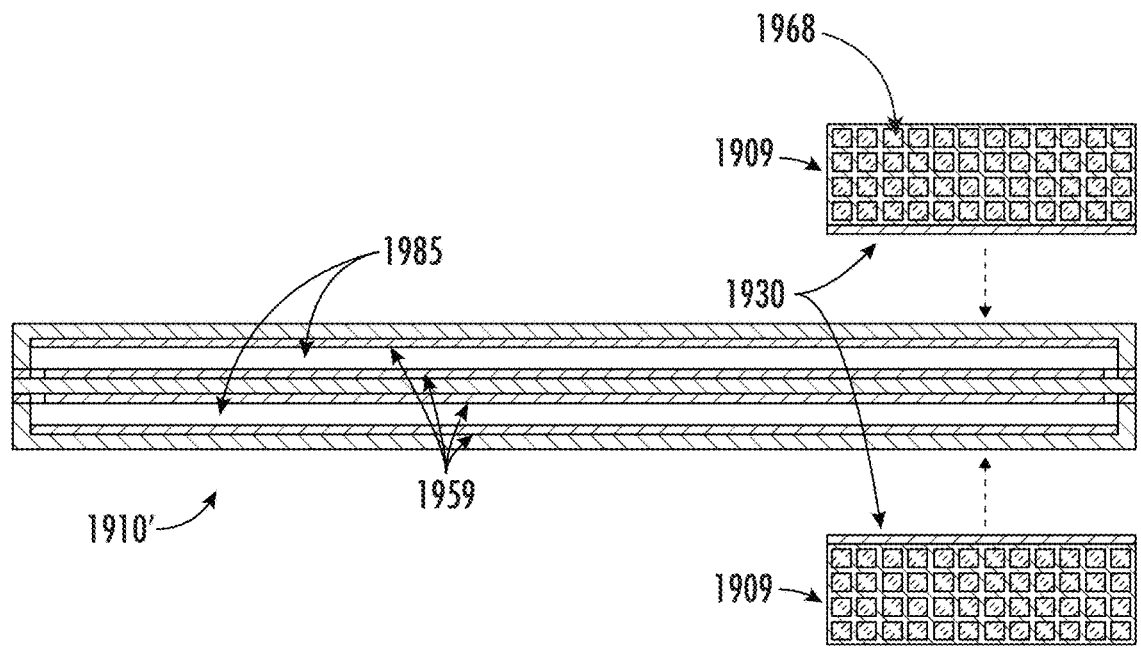
FIGS. 38A-38B illustrate cross-sectional views of formation of an example condenser section, in accordance with some embodiments discussed herein.
Figure 38B:
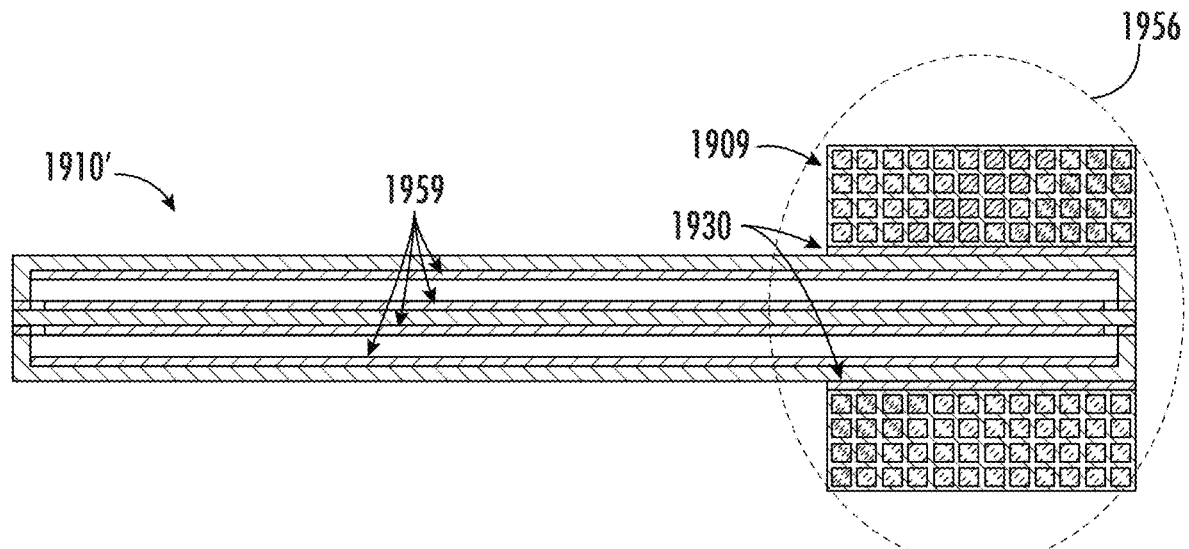

FIGS. 38A-B illustrate formation of the condenser section on the heat pipe 1910'. In some embodiments, at least one extruded honeycomb substrate 1909 may be bonded to the heat pipe 1910' with the layer of nano-particles 1930 to form the condenser section 1956. In some embodiments, the at least one extruded honeycomb substrate 1909 may be oriented so that the at least one channel 1968 is parallel or perpendicular to the direction of the heat pipe 1910' channels 1985. The orientation may be selected to maximize heat transfer based on air flow direction in the application. In some embodiments, the at least one channel 1986 in the extruded honeycomb substrate 1909 may be smaller than the channels 1985 in the heat pipe 1910'.

Example Glass Heat Pipes

In general, heat pipes are constructed from thermally conductive materials because heat must pass through the walls of the heat pipe in the evaporation and condensation sections. Although glass is not normally considered for heat pipe construction, many LCD (Liquid Crystal Display) glasses, such as Corning® Eagle XG® provide an excellent CTE match to silicon chips. In some embodiments, a glass heat pipe may be sealed to an electronics surface, and a cooling surface (e.g., an extruded honeycomb substrate) such that a fluid within the glass heat pipe may contact both the electronics surface, and the cooling surface while flowing within the heat pipe.

Figure 39A:
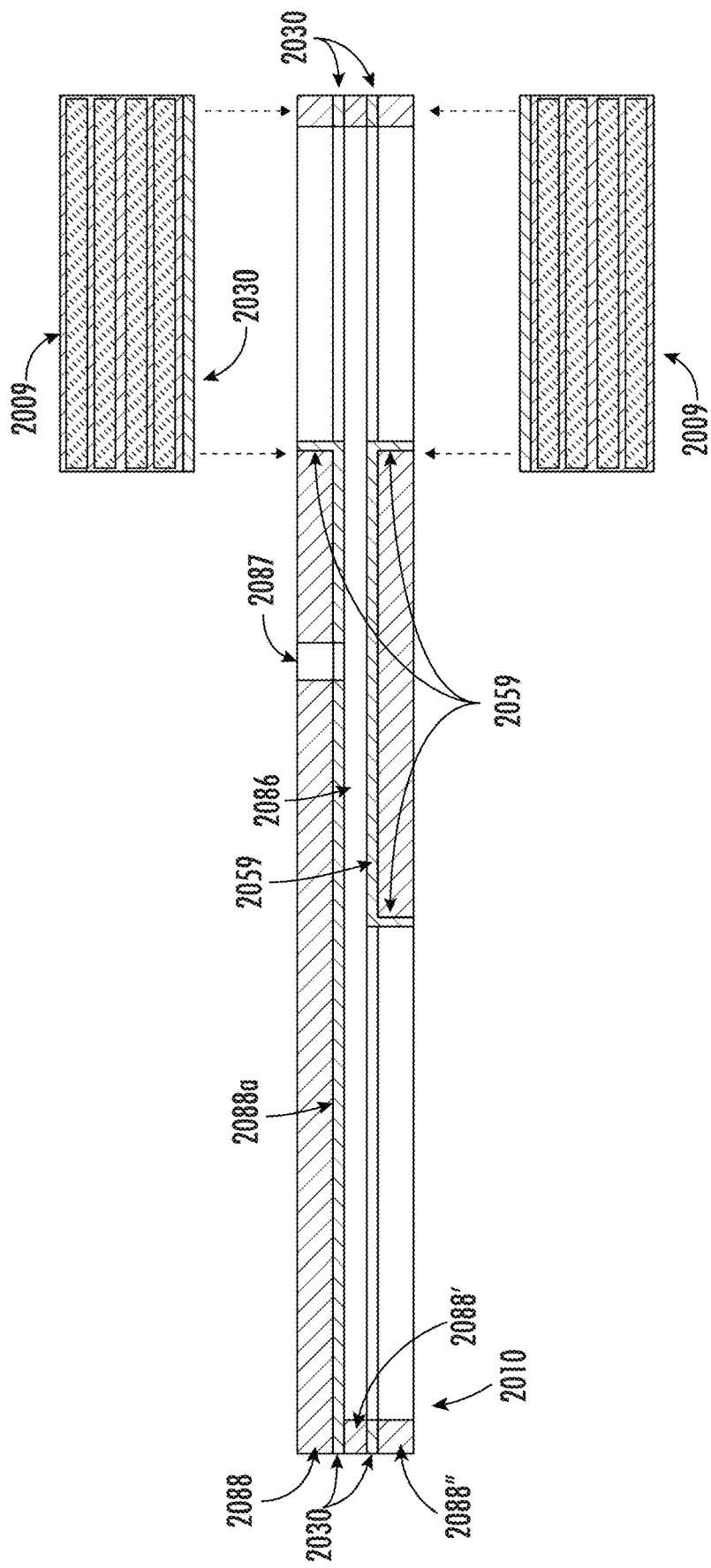
FIGS. 39A-39B illustrate cross-sectional views of formation of an example heat pipe assembly, in accordance with some embodiments discussed herein.
Figure 39B:
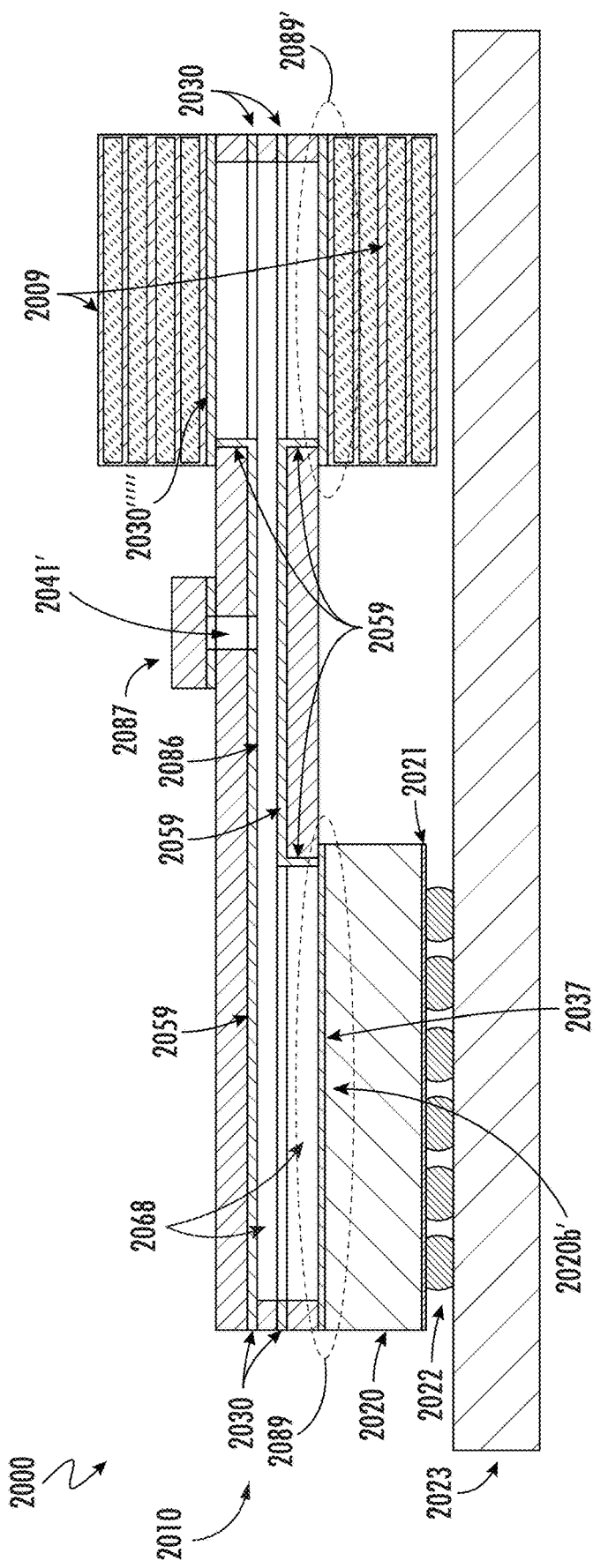

FIGS. 39A-B illustrate the formation of a cooling assembly 2000 using a glass heat pipe 2010. The glass heat pipe 2010 may be constructed by stacking sheets of glass that are cut to create complex internal channels 2086 with varying shapes and cavities. FIG. 39A illustrates an example cross-sectional view of a glass heat pipe 2010 where three glass sheets 2088, 2088' 2088" were patterned via laser cutting and bonded together with a layer of nano-particles 2030, defining at least one channel 2086. The at least one channel 2086, and an interior surface 2088a of the glass sheets 2088, 2088' and 2088" may be coated with the layer of nano-particles 2030 to form a wick 2059 continuous throughout the interior surface 2088a of the glass heat pipe 2010. The glass sheets 2088, 2088', 2088" may be bent prior to bonding to allow the glass heat pipe 2010 to follow a curved path such as to conform to the geometric requirements of the application.

In some embodiments, the glass sheets 2088, 2088', 2088" may be patterned with the layer of nano-particles 2030 on the interior surfaces 2088a for multiple heat pipes. After application the glass sheets 2088, 2088' and 2088" may be cut into individual heat pipes 2010 before or after stacking assembly, where the heat pipes 2010 may be cut into arbitrary shapes to meet the space limitations of the electronic cooling application.

FIG. 39B illustrates the cooling assembly 2000. In some embodiments, the heat pipe 2010 may provide at least one large cavity opening 2089 at an evaporator section, and at least one large cavity opening 2089' at a condenser section. The at least one large cavity opening 2089, 2089' may allow the coolant fluid 2057 to contact the electronics surface of the second substrate 2020 at the evaporator section, and the extruded honeycomb substrate 2009 (e.g., small channel SiC extruded honeycomb substrate) in the condenser section. As a result, the high thermal resistance associated with heat transfer through glass walls is avoided.

In some embodiments, the extruded honeycomb substrate 2009 may be coated on one side with the layer of nano-particles 2030 that acts as a wick surface 2059 to help collect and transport the fluid back to the evaporator section. In some embodiments, a more dense layer of nano-particles 2030"" may be applied around the perimeter of the at least one large cavity opening 2089' in the condenser section to promote leak-free bonding of the extruded honeycomb substrate 2009 to the glass heat pipe 2010.

In some embodiments, the at least one large cavity opening 2089 of the evaporator section may be bonded over the electronics surface on the second substrate 2020 using a perimeter ring of dense nano-particle material 2030"". A central portion of the electronics surface may be coated with a more porous layer of nano-particles 2030. In some embodiments, the central portion of the electronics surface 2020b' may be coated with a layer of nano-particles 2037 configured for nucleate boiling, as discussed with reference to FIGS. 20A-B. The layer of nano-particles 2037 may induce more efficient evaporation of the fluid 2057.

In some embodiments, the glass heat pipe 2010 may be bonded to the electronics surface 2020b of the second substrate 2020 via a laser heating process after the second substrate 2020 is bonded to a PCB 2023 using a plurality of solder balls 2022. Additionally or alternatively, in some embodiments, the glass heat pipe 2010 may be bonded to the electronics surface 2020b of the second substrate 2020 prior to the second substrate 2020 being bonded to the PCB 2023 using the plurality of solder balls 2022.

In some embodiments, after the glass heat pipe 2010 is attached to the second substrate 2020, the glass heat pipe 2010 may be filled with the coolant fluid via a sealing hole 2041' and then sealed by bonding a sealing cap 2087 over the sealing hole 2041' using a layer of nano-particles 2030. Additionally or alternatively, in some embodiments, the coolant fluid may be inserted into the glass heat pipe 2010 via the at least one large cavity opening 2089 in the evaporator section, where the coolant fluid is trapped in the well that is formed in the condenser section after attachment of the extruded honeycomb substrate 2009. The condenser section may be kept cool while a laser heats the layer of nano-particles 2030 seal around the perimeter of the electronics surface of the second substrate 2020.

As mentioned above in discussions on glass cooling manifolds (e.g., FIG. 27), chips may also be mounted on the top surface of the glass heat pipe 2010. Additional features such as electrical interconnections, laser written optical waveguides, and optical connection precision components may also be integrated into the glass heat pipe 2010.

Example Microfluidic Device

Figure 40A:
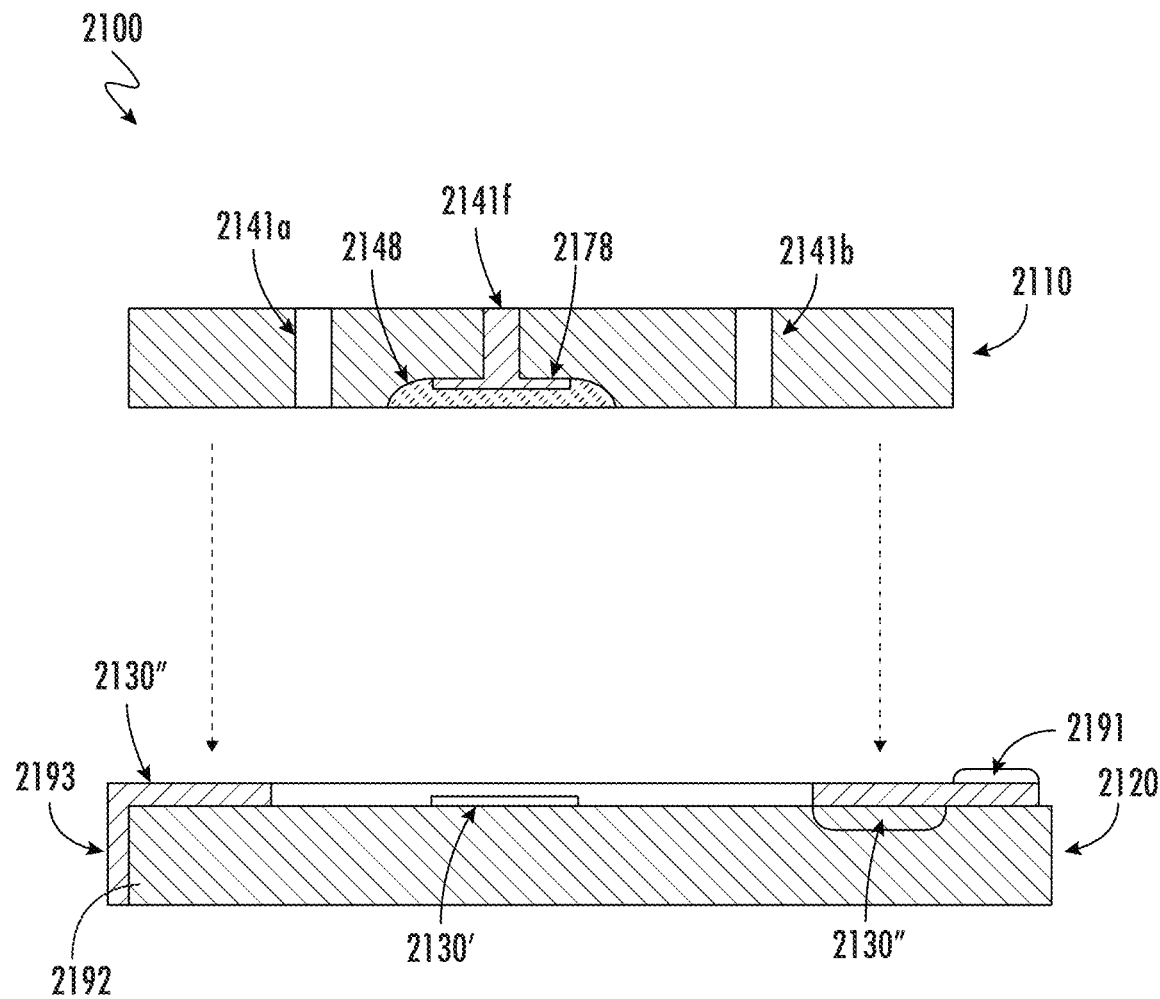
FIGS. 40A-40C illustrate cross-sectional views of formation of an example microfluidic device, in accordance with some embodiments discussed herein.
Figure 40B:
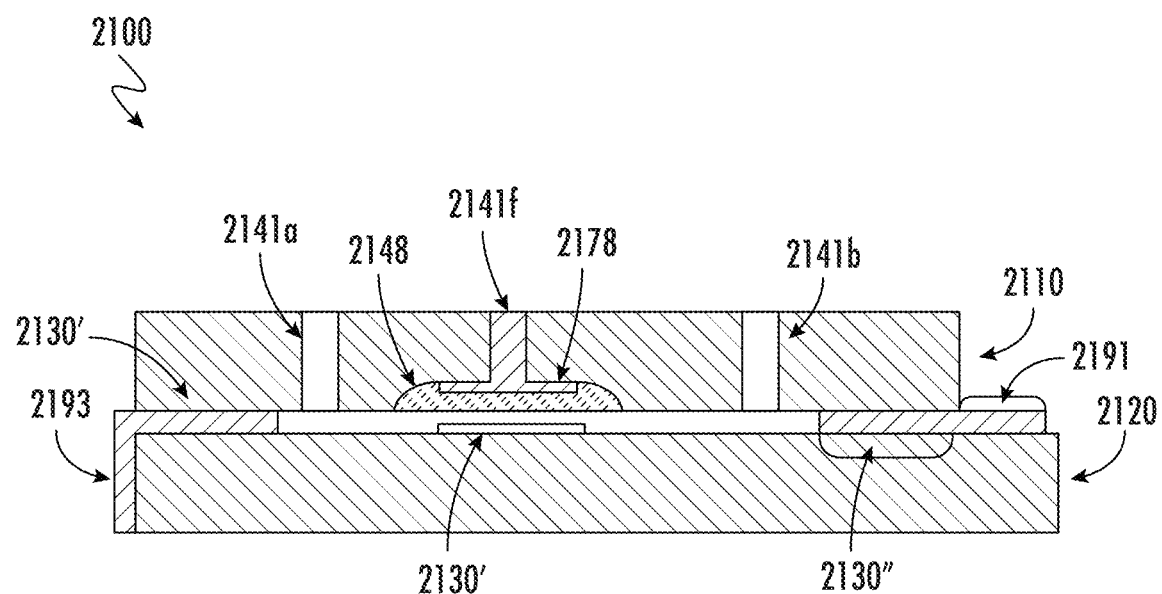
Figure 40C:
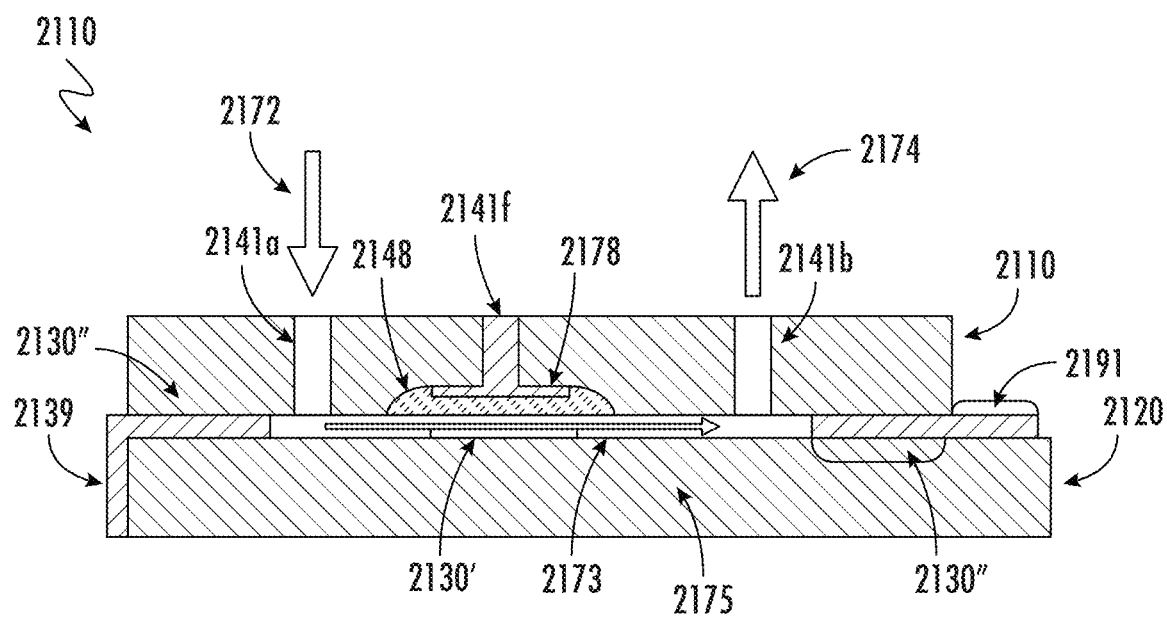

Electronics cooling solutions as discussed herein involve glass and ceramic materials that are bonded together with a layer of nano-particle materials to make a fluidic device optimized for effective heat transfer from electronics surfaces. The assembly approaches are more generally applicable to glass and ceramic microfluidic devices. For example, a glass microfluidic device suitable for performing analysis on biological fluids can be assembled using the techniques described above. FIGS. 40A-C illustrate the formation of an example microfluidic device.

FIG. 40A illustrates a cross-sectional view of an example device 2100 including a first substrate 2110 (e.g., glass sheet) and a second substrate 2120 (e.g., a glass sheet) bonded together using a layer of nano-particles 2130" materials. The top glass sheet includes a first hole 2141a, a second hole 2141b and a hole 2141f filled with a layer of nano-particles 2178 configured as an electrical conductor. In some embodiments, a cavity 2148 may be formed within the first substrate 2110 which may include the layer of nano-particles 2178 serving as the electrical conductor. In some embodiments, the electrical conductor may be an electrode.

The second substrate 2120 may include a thick layer of nano-particles 2130" for bonding and sealing the first substrate 2110 and the second substrate 2120 together. The thick layer of nano-particles 2130" may be printed around an edge 2192 of the second substrate 2120 to create an electrical contact pad 2193 on the edge 2192 of the second substrate 2120. A thin layer of nano-particles 2130' may be deposited on a second surface 2120b surface of the second substrate 2120. In some embodiments, an electrical connection may be made between the thin layer of nano-particles 2130' acting as an electrode and surrounding the layer of thick nano-particles 2130", allowing electrical connections via the contact pad 2193 on the edge 2192 of the second substrate 2120.

The first substrate 2110 and the second substrate 2120 may be bonded together after sintering the thick layer of nano-particles 2130". In some embodiments, the heating process may also sinter the layer of nano-particles 2178 located in the hole 2141f and the thin layer of nano-particles 2130' in the channel region defined by the cavity 2148.

In some embodiments, illustrated in FIG. 40B, the first substrate 2110 may not be as wide as the second substrate 2120, therefore, a portion 2191 of the thick layer of nano-particles 2130" is accessible after the first substrate 2110 and the second substrate 2120 are bonded. In some embodiments, the portion 2191 may function as an electrical contact pad.

FIG. 40C illustrates an example microfluidic device 2100. In some embodiments, the microfluidic device 2100 may be configured to evaluate dielectric properties of a fluid. In some embodiments, the fluid may be a biological fluid.

In some embodiments, the fluid enters the microfluidic device 2100 as an inlet fluid flow 2172 entering the first hole 2141a and flowing (indicated by arrow 2173) through a narrow channel 2168 formed between the first substrate 2110 and the second substrate 2120. The fluid may flow through the cavity 2148 between the thin layer of nano-particles 2130' deposited on the first substrate 2110 and layer of nano-particles 2178 disposed in the cavity 2148 of the second substrate 2120 functioning as electrodes. In some embodiments, the fluid may also pass through an optical observation region 2175 where optical absorption measurements may be made. The fluid may exit the microfluidic device 2100 through the second hole 2141b with outlet flow 2174.

In some embodiments, a similar assembly approach can be used to fabricate ceramic-based microfluidic devices. Gold nano-particles may be used for bonding the first substrate and the second substrate—allowing the microfluidic device to resist corrosion from many process liquids, including water, most acids (except mixtures of hydrochloric and nitric acid) and bases (except potassium cyanide). Therefore, in some embodiments, the assembly approach could be used to fabricate fluidic modules suitable for many AFR applications.

Example Flowchart(s)

Figure 41:
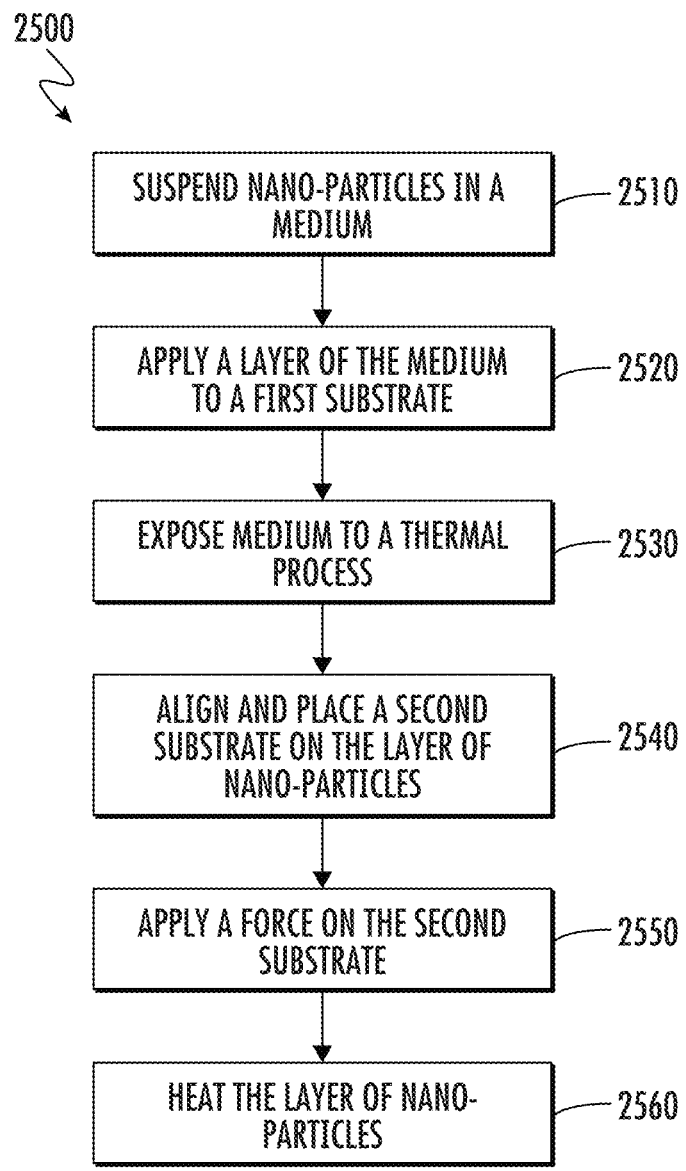
FIG. 41 illustrates a flowchart of an example method for joining two substrates using nano-particles, in accordance with some embodiments discussed herein.

FIG. 41 is a flowchart illustrating an example method 2500 for nano-particle joining of, for example, photonic components or heat exchanger manifold components, in accordance with some embodiments discussed herein. At operation 2510, nano-particles are suspended in a medium. At operation 2520, a layer of the nano-particle medium is applied to a first substrate. At operation 2530, the medium is exposed to a thermal process. The thermal process is designed to remove at least a portion of the medium to expose the nano-particles, such that the nano-particles have contact points with adjacent nano-particles and the first substrate. At operation 2540, a second substrate may be aligned and applied onto the layer of nano-particles on the first substrate. At operation 2550, a force may be applied to the first substrate or second substrate such that the layer of nano-particles is in contact with both the first substate and the second substrate. At operation 2560, the layer of nano-particles is heated such as to cause connection of the contact points of adjacent nano-particles to cause secure alignment of the first substrate and the second substrate. In some embodiments, operations 2540, 2550, and/or 2560 may applied simultaneously or near simultaneously.

Figure 42:
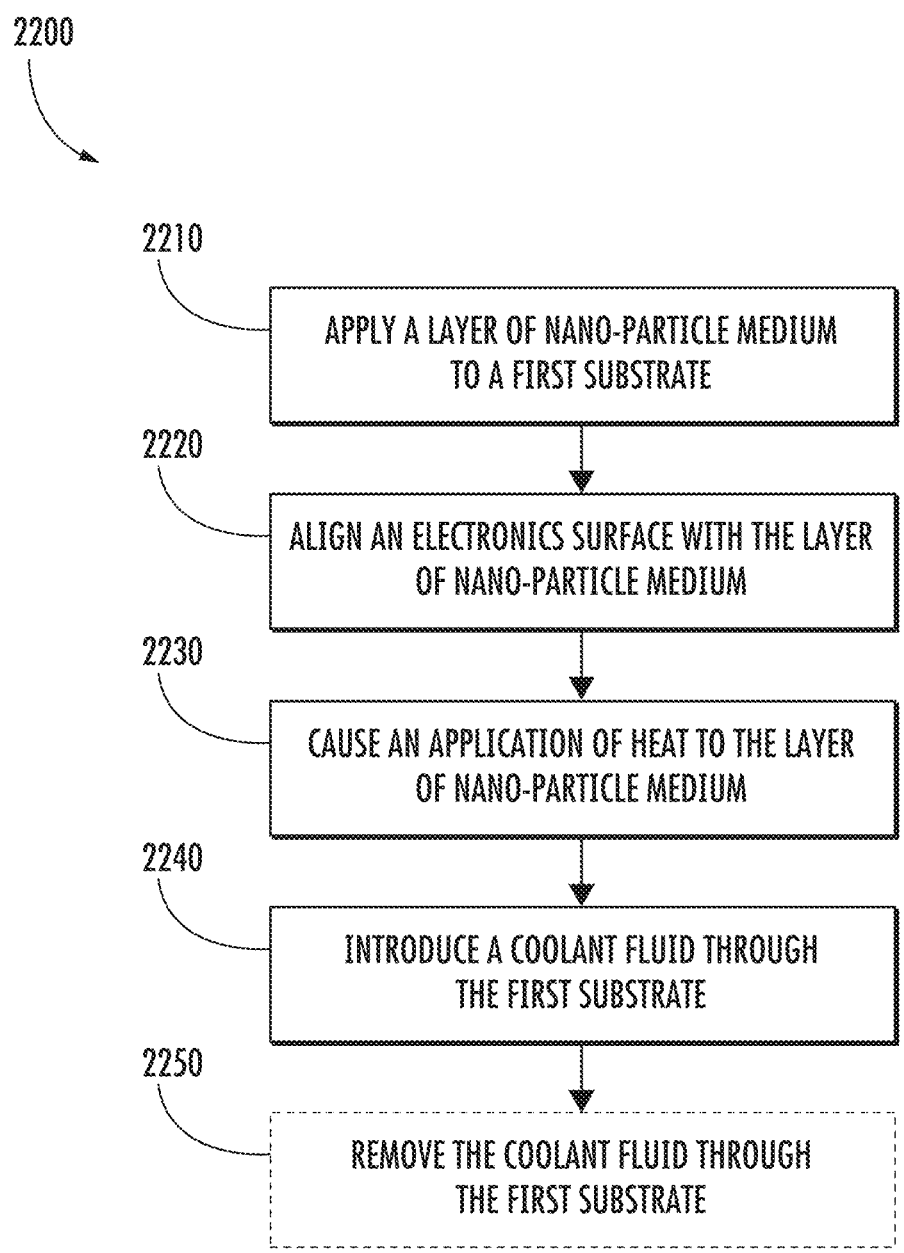
FIG. 42 illustrates a flowchart of an example method for forming a cooling manifold, in accordance with some embodiments discussed herein.

FIG. 42 is a flowchart illustrating an example method 2200 for making a cooling manifold, in accordance with some embodiments discussed herein. At operation 2210, a layer of nano-particle medium is applied to a first substrate. At operation 2220, an electronics surface, associated with electronics equipment, is aligned with the layer of nano-particle medium. At operation 2230, heat is applied to the layer of nano-particle medium, creating a seal between the first substrate and the electronics surface. At operation 2240, a coolant fluid is introduced through the first substrate. Optionally at operation 2250, the coolant fluid is removed through the first substrate.

Figure 43:
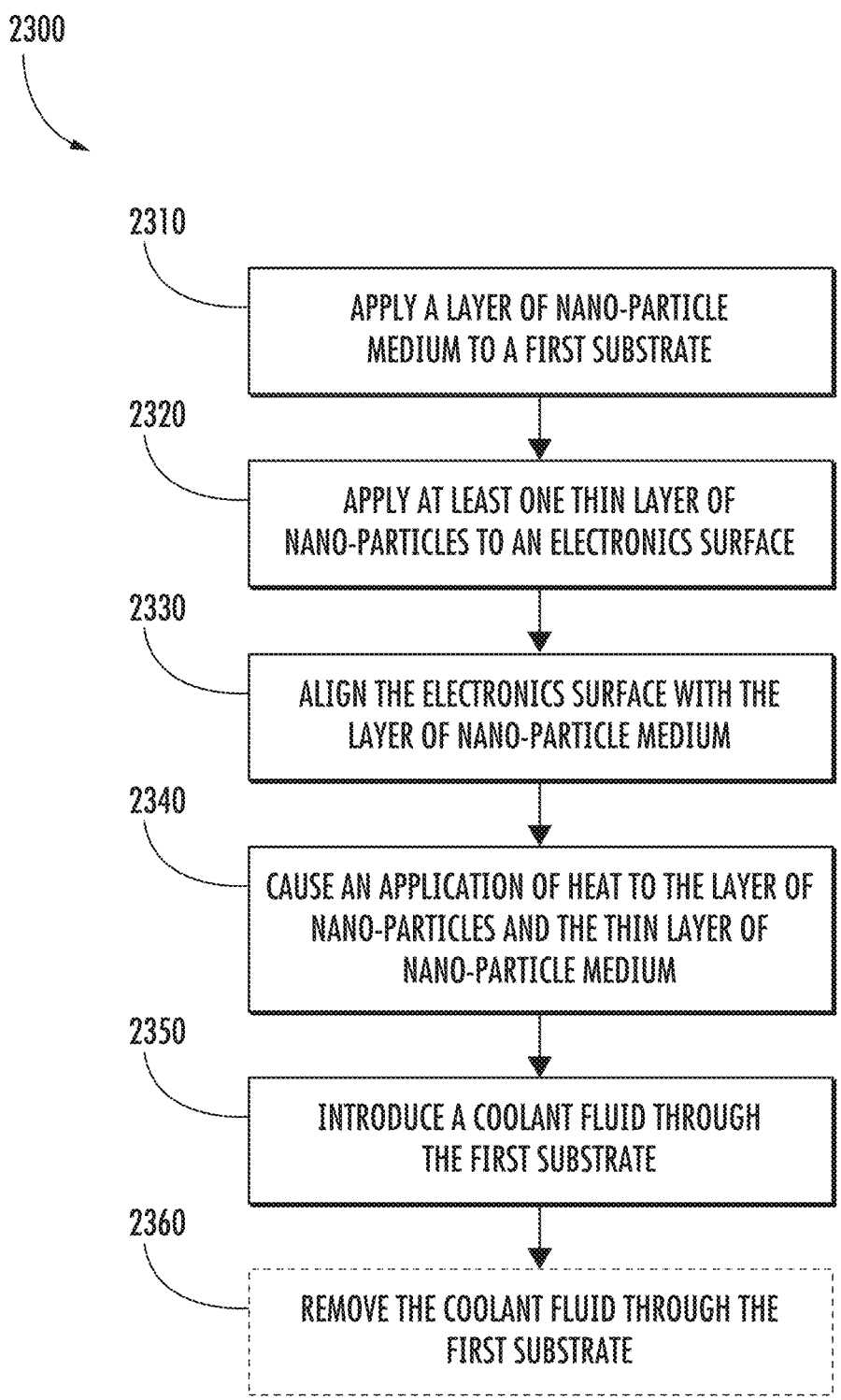
FIG. 43 illustrates a flowchart of an example method for forming a nucleate boiling cooling manifold, in accordance with some embodiments discussed herein.

FIG. 43 is a flowchart illustrating an example method 2300 for making a cooling manifold to induce nucleate boiling, in accordance with some embodiments discussed herein. At operation 2310, a layer of nano-particle medium is applied to a first substrate. At operation 2320, at least one thin layer of nano-particles is applied to an electronics surface. At operation 2330, the electronics surface, associated with electronics equipment, is aligned with the layer of nano-particle medium on the first substrate. At operation

2340, heat is applied to the layer of nano-particle medium, creating a seal between the first substrate and the electronics surface. At operation 2350, a coolant fluid is introduced through the first substrate. Optionally at operation 2250, the coolant fluid is removed through the first substrate.

Figure 44:
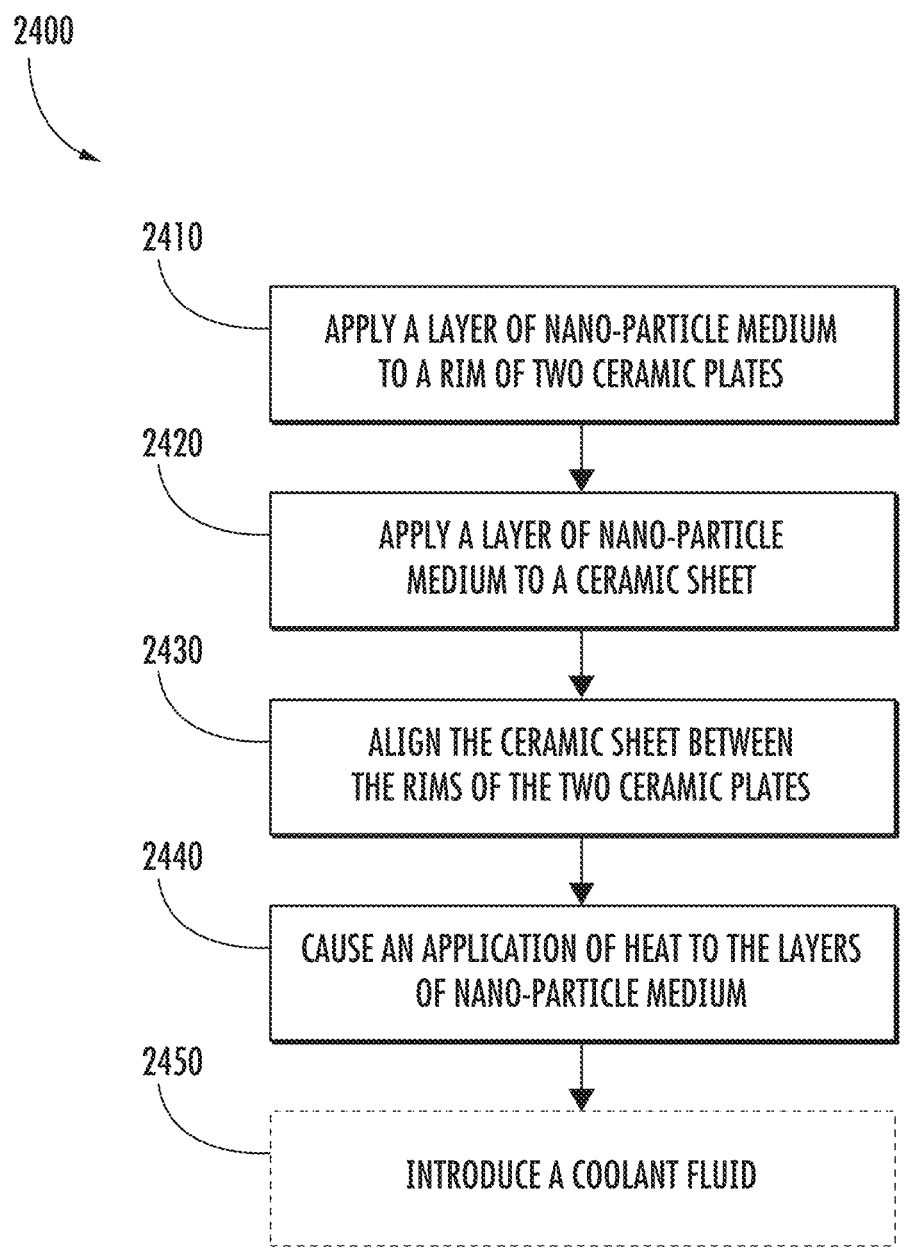
FIG. 44 illustrates a flowchart of an example method for forming a heat pipe, in accordance with some embodiments discussed herein.

FIG. 44 is a flowchart illustrating an example method 2400 for making a heat pipe, in accordance with some embodiments discussed herein. At operation 2410, a layer of nano-particle medium is applied to a rim of two ceramic plates. At operation 2420, a layer of nano-particle medium is applied to a third ceramic sheet. At operation 2430, the third ceramic sheet is aligned between the rims of the two ceramic plates. At operation 2440, heat is applied to both layers of nano-particle medium, creating a seal between the rims of the ceramic plates and the third ceramic sheet. Optionally at operation 2450, a coolant fluid is introduced into the heat pipe.

Conclusion

It will therefore be readily understood by those persons skilled in the art that the present disclosure is susceptible of broad utility and application. Many embodiments and adaptations of the present disclosure other than those herein described, as well as many variations, modifications and equivalent arrangements, will be apparent from or reasonably suggested by the present disclosure and the foregoing description thereof, without departing from the substance or scope of the present invention. Accordingly, while the inventions have been described herein in detail in relation to preferred embodiments, it is to be understood that this disclosure is only illustrative and exemplary and made merely for purposes of providing a full and enabling disclosure. The foregoing disclosure is not intended or to be construed to limit or otherwise to exclude any such other embodiments, adaptations, variations, modifications and equivalent arrangements.

That which is claimed:

1. A cooling manifold for electronics equipment, the cooling manifold comprising:
   a first substrate having a first hole;
   an electronics surface associated with the electronics equipment; and
   a layer of nano-particles disposed between the first substrate and the electronics surface;
   wherein the layer of nano-particles is formed after application of heat to a layer of nano-particle medium positioned between the first substrate and the electronics surface, wherein the layer of nano-particles defines at least a portion of a seal between the first substrate and the electronics surface, wherein the seal defines a channel between the first substrate and the electronics surface; and
   wherein the cooling manifold is fluid impermeable so as to allow a coolant fluid entering through the first hole of the first substrate to flow through the channel of the seal to reduce or remove heat generated by the electronics equipment.

2. The cooling manifold of claim 1, wherein the layer of nano-particles comprises metallic nano-particles.

3. The cooling manifold of claim 1, wherein the layer of nano-particles comprises a filler particle.

4. The cooling manifold of claim 3, wherein the filler particle is a CTE matching glass or ceramic particle.

5. The cooling manifold of claim 1, further comprising at least one channel wall extending at least partially through the channel, and wherein the at least one channel wall extends between the first substrate and the electronics surface.

6. The cooling manifold of claim 5, wherein the at least one channel wall is formed by a second layer of nano-particles disposed between the first substrate and the electronics surface.

7. The cooling manifold of claim 5, wherein the at least one channel wall forms a tortuous path.

8. The cooling manifold of claim 5, wherein the at least one channel wall forms a plurality of parallel paths.

9. The cooling manifold of claim 5, further comprising at least one cavity formed in the first substrate, wherein the at least one cavity further defines the channel between the first substrate and the electronics surface.

10. The cooling manifold of claim 1, further comprising at least one deposit of nano-particles disposed on the electronics surface, wherein the at least one deposit of nano-particles induces nucleate boiling of the coolant fluid within the channel, and wherein the at least one deposit of nano-particles has a deposit thickness, wherein the deposit thickness is less than a thickness of the layer of nano-particles.

11. The cooling manifold of claim 10, wherein the at least one deposit of nano-particles is a plurality of deposits of nano-particles, and wherein the plurality of deposits of nano-particles are surrounded by at least one margin of non-coated electronics surface.

12. The cooling manifold of claim 10, wherein the at least one deposit of nano-particles enables local convection in nucleate boiling regions, wherein the coolant fluid flows towards the at least one deposit of nano-particles to replace heated coolant fluid.

13. The cooling manifold of claim 1, wherein the first substrate further comprises a second hole, wherein the coolant fluid exits the channel through the second hole.

14. The cooling manifold of claim 1, wherein the layer of nano-particles is between 5-50 microns thick.

15. The cooling manifold of claim 1, wherein the layer of nano-particles is between 0.5-5 microns thick.

16. The cooling manifold of claim 1, wherein the portion of the seal comprises at least one hole such that the coolant fluid exits the channel through the at least one hole.

17. A cooling manifold for electronics equipment, the cooling manifold comprising:
   an electronics surface associated with the electronics equipment;
   a first substrate comprising a plurality of jet impingement regions, wherein each of the plurality of jet impingement regions comprises:
      a jet impingement hole;
      a return hole; and
      a cavity formed in a first side of the first substrate, disposed about the jet impingement hole, configured to connect the jet impingement hole and the return hole; and
   a first layer of nano-particles disposed between the first side of the first substrate and the electronics surface;
   wherein the layer of nano-particles is formed after application of heat to a layer of nano-particle medium positioned between the first substrate and the electronics surface, wherein the layer of nano-particles defines at least a portion of a seal between the first side of the first substrate and the electronics surface wherein the seal defines a channel between the first substrate and the electronics surface; and
   wherein the cooling manifold is fluid impermeable so as to allow a coolant fluid to enter each jet impingement region of the plurality of jet impingement regions through the jet impingement hole to flow through the channel to reduce or remove heat generated by the electronics equipment associated with the electronics surface, and flow out of the return hole.

18. The cooling manifold of claim 17, further comprising:
a second layer of nano-particles disposed between a second side of the first substrate and a third substrate, wherein the third substrate comprises:
   an inlet hole;
   an outlet hole;
   a distribution channel disposed on a first side of the third substrate, wherein the distribution channel is configured to provide fluid communication between the inlet hole and each of the jet impingement holes within the plurality of jet impingement regions; and
   a return channel disposed on the first side of the third substrate, wherein the return channel is configured to provide fluid communication between the outlet hole and each of the return holes within each of the plurality of jet impingement regions,
wherein the return channel is distinct from the distribution channel.

19. A cooling manifold for electronics equipment, the cooling manifold comprising:
   a first substrate having a plurality of first holes and a plurality of second holes;
   a plurality of electronics surfaces associated with the electronics equipment;
   a first layer of nano-particles disposed between a first side of the first substrate and the plurality of electronics surfaces;
   wherein the first layer of nano-particles is formed after application of heat to a layer of nano-particle medium positioned between the first substrate and the electronics surface, wherein the layer of nano-particles defines at least a portion of a seal between the first substrate and each of the plurality of electronics surfaces, wherein one of the plurality of first holes and one of the plurality of second holes is contained within the seal, wherein the seal defines a channel between the first substrate and each of the plurality of electronics surfaces; and
   a second layer of nano-particles disposed between a second side of the first substrate and a third substrate, wherein the third substrate comprises:
      an inlet hole;
      an outlet hole;
      a distribution channel disposed on a first side of the third substrate, wherein the distribution channel is configured to provide fluid communication between the inlet hole and each of the plurality of first holes; and
      a return channel disposed on the first side of the third substrate, wherein the return channel is configured to provide fluid communication between the outlet hole and each of the plurality of second holes, wherein the return channel is distinct from the distribution channel; and
   wherein the cooling manifold is fluid impermeable so as to allow a coolant fluid entering through the inlet hole of the third substrate to flow through the distribution channel to each of the plurality of first holes, flow through the channel defined between the first substrate and the plurality of electronics surfaces to reduce or remove heat generated by the electronics equipment associated with the plurality of electronics surfaces, and flow out of the plurality of second holes, through the return channel and out of the outlet hole.

* * * * *